(12) United States Patent
Fuji et al.

(10) Patent No.: US 9,853,209 B2
(45) Date of Patent: Dec. 26, 2017

(54) METHOD OF MANUFACTURING PRESSURE SENSOR, DEPOSITION SYSTEM, AND ANNEALING SYSTEM

(71) Applicant: KABUSHIKI KAISHA TOSHIBA, Minato-ku (JP)

(72) Inventors: Yoshihiko Fuji, Kawasaki (JP); Hideaki Fukuzawa, Kawasaki (JP); Shiori Kaji, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 57 days.

(21) Appl. No.: 14/661,164

(22) Filed: Mar. 18, 2015

(65) Prior Publication Data

US 2015/0268116 A1    Sep. 24, 2015

(30) Foreign Application Priority Data

Mar. 19, 2014   (JP) ................................ 2014-057159

(51) Int. Cl.
*H01L 21/687* (2006.01)
*H01L 21/67* (2006.01)
(Continued)

(52) U.S. Cl.
CPC .............. *H01L 43/12* (2013.01); *C23C 14/50* (2013.01); *C23C 16/458* (2013.01); *G01L 1/125* (2013.01);
(Continued)

(58) Field of Classification Search
CPC ................. H01L 43/12; H01L 21/6838; H01L 21/68728; H01L 21/68742; H01L 21/6875;
(Continued)

(56) References Cited

U.S. PATENT DOCUMENTS 4,661,139 A    4/1987  Reese et al.
5,695,566 A *  12/1997 Suzuki .................... C23C 14/50
                                                          118/723 E
(Continued)

FOREIGN PATENT DOCUMENTS

JP     9-92905 A     4/1997
JP    11-287669     10/1999
(Continued)

OTHER PUBLICATIONS

D. Meyners et al., "Pressure Sensor Based on Magnetic Tunnel Junctions", Journal of Applied Physics, vol. 105, 2009, 3 pages.
(Continued)

*Primary Examiner* — Marvin Payen
*Assistant Examiner* — Jeremy Joy
(74) *Attorney, Agent, or Firm* — Oblon, McClelland, Maier & Neustadt, L.L.P.

(57) ABSTRACT

A method of manufacturing a pressure sensor comprises: above a film portion formed on one surface of a substrate, depositing a first magnetic layer, a second magnetic layer and an intermediate layer between the first and second magnetic layers on one surface of a substrate; removing the deposited layers leaving a part thereof; and removing a part of the substrate from another surface of the substrate. By removing the deposited layers leaving a part thereof, a strain detecting element is formed in a part of a first region, the strain detecting element comprising the first magnetic layer, the second magnetic layer and the intermediate layer. By removing a part of the substrate, a part of the first region of the substrate is removed. In addition, the deposition of the first magnetic layer is performed with the substrate being bended.

14 Claims, 50 Drawing Sheets

(51) Int. Cl.
    *H01L 43/12*     (2006.01)
    *C23C 14/50*     (2006.01)
    *H01L 21/683*    (2006.01)
    *G03F 7/20*      (2006.01)
    *C23C 16/458*    (2006.01)
    *G01L 9/00*      (2006.01)
    *G01L 9/16*      (2006.01)
    *G01L 1/12*      (2006.01)

(52) U.S. Cl.
    CPC ............ *G01L 9/0042* (2013.01); *G01L 9/16* (2013.01); *G03F 7/707* (2013.01); *H01L 21/67288* (2013.01); *H01L 21/6838* (2013.01); *H01L 21/6875* (2013.01); *H01L 21/68728* (2013.01); *H01L 21/68742* (2013.01)

(58) Field of Classification Search
    CPC ......... H01L 21/68764; H01L 21/68707; H01L 21/67288; C23C 14/50; C23C 16/458; G01L 9/0042; G03F 7/707
    See application file for complete search history.

(56) References Cited

U.S. PATENT DOCUMENTS

| | | | | |
|---|---|---|---|---|
| 5,738,729 | A * | 4/1998 | Dubs | C23C 14/50 118/500 |
| 5,793,474 | A * | 8/1998 | Nishi | G03F 7/70358 355/53 |
| 5,804,089 | A * | 9/1998 | Suzuki | H01J 37/3244 118/723 E |
| 5,898,548 | A | 4/1999 | Dill et al. | |
| 6,676,761 | B2 | 1/2004 | Shang | C23C 16/458 118/715 |
| 9,032,808 | B2 | 5/2015 | Giddings et al. | |
| 9,281,252 | B1 * | 3/2016 | Wurfel | H01L 22/20 |
| 2001/0036749 | A1 * | 11/2001 | Levert | B82Y 10/00 438/758 |
| 2003/0215578 | A1 * | 11/2003 | Okumura | C03C 17/23 427/569 |
| 2006/0005770 | A1 * | 1/2006 | Tiner | H01L 21/68742 118/728 |
| 2007/0049020 | A1 * | 3/2007 | Huang | C25D 7/12 438/680 |
| 2007/0158826 | A1 | 7/2007 | Sakakibara et al. | |
| 2008/0299326 | A1 * | 12/2008 | Fukazawa | C23C 16/458 427/569 |
| 2009/0000552 | A1 * | 1/2009 | Sohda | C23C 14/50 118/728 |
| 2010/0032096 | A1 * | 2/2010 | Yu | H01L 21/67103 156/345.52 |
| 2010/0151688 | A1 * | 6/2010 | Choi | C23C 16/4583 438/716 |
| 2011/0014396 | A1 * | 1/2011 | Polyak | C23C 14/50 427/569 |
| 2011/0295128 | A1 | 12/2011 | Yuasa et al. | |
| 2012/0079887 | A1 | 4/2012 | Giddings et al. | |
| 2013/0255069 | A1 | 10/2013 | Higashi et al. | |
| 2013/0255393 | A1 | 10/2013 | Fukuzawa et al. | |
| 2014/0069200 | A1 | 3/2014 | Yuasa et al. | |
| 2015/0082894 | A1 | 3/2015 | Okamoto et al. | |
| 2015/0114297 | A1 * | 4/2015 | Kawato | C23C 14/24 118/726 |
| 2016/0079108 | A1 * | 3/2016 | Kobayashi | H01L 21/02118 438/780 |

FOREIGN PATENT DOCUMENTS

| | | |
|---|---|---|
| JP | 2002-148132 A | 5/2002 |
| JP | 2002-304711 A | 10/2002 |
| JP | 2007-180201 A | 7/2007 |
| JP | 2011-244938 A | 12/2011 |
| JP | 2012-078186 A | 4/2012 |
| JP | 2012-204479 | 10/2012 |
| JP | 2013-205255 A | 10/2013 |
| JP | 2013-205403 A | 10/2013 |
| JP | 2015-64255 A | 4/2015 |
| WO | WO 2013/183374 A1 | 12/2013 |

OTHER PUBLICATIONS

M. Lohndorf et al., "Highly Sensitive Strain Sensors Based on Magnetic Tunneling Junctions", Applied Physics Letters, vol. 81, No. 2, Jul. 8, 2002, pp. 313-315.

* cited by examiner

A'-A CROSS-SECTION

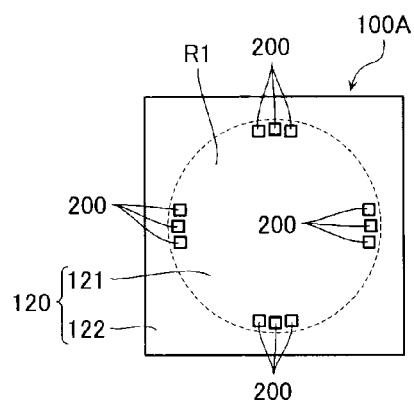
FIG. 3A
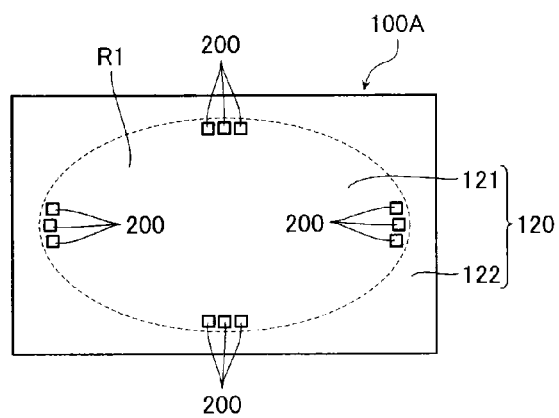
FIG. 3B
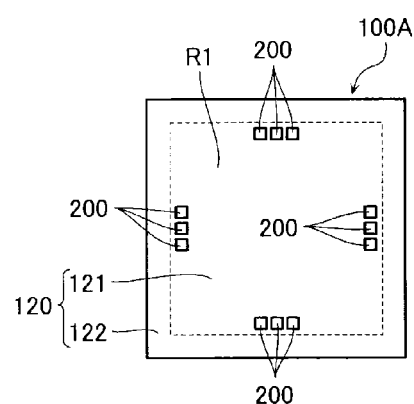
FIG. 3C
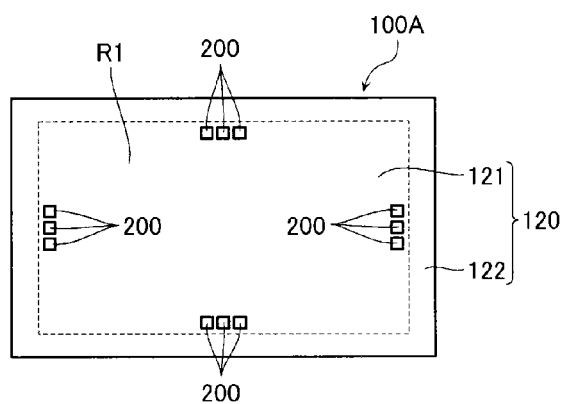
FIG. 3D
FIG. 4
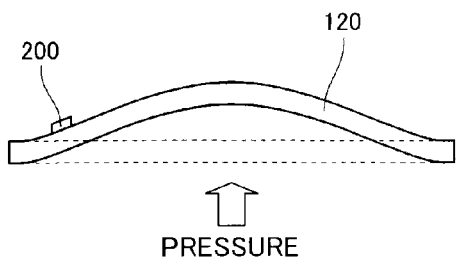
PRESSURE

METHOD OF MANUFACTURING PRESSURE SENSOR, DEPOSITION SYSTEM, AND ANNEALING SYSTEM

CROSS-REFERENCE TO RELATED APPLICATIONS

This application is based upon and claims the benefit of Japanese Patent Application No. 2014-57159, filed on Mar. 19, 2014, the entire contents of which are incorporated herein by reference.

FIELD

Embodiments relate to a method of manufacturing a pressure sensor, a deposition system, and an annealing system.

BACKGROUND

A pressure sensor using a micro electro mechanical systems (MEMS) technology has, for example, a piezo resistance change type and a capacitance type. Meanwhile, a pressure sensor using a spintronics technology is proposed. The pressure sensor using the spintronics technology senses resistance change in response to strain. It is desired to have a high sensitivity pressure sensor using the spintronics technology.

An object of the method of manufacturing a pressure sensor, the deposition system, and the annealing system according to the embodiments is to provide a high sensitivity pressure sensor.

BRIEF DESCRIPTION OF THE DRAWINGS

FIGS. 3A, 3B, 3C and 3D are schematic plan views showing the configurations of the pressure sensor.

FIG. 4 is a schematic cross-sectional view for illustrating the operation of the pressure sensor.

FIG. 120 is a schematic side view showing a configuration of another annealing system according to the embodiment.

FIG. 121 is a schematic side view showing a configuration of a deposition/annealing system according to an eleventh embodiment.

FIG. 122 is a schematic side view showing a configuration of another annealing system according to the embodiment.

DETAILED DESCRIPTION

Figure 1:
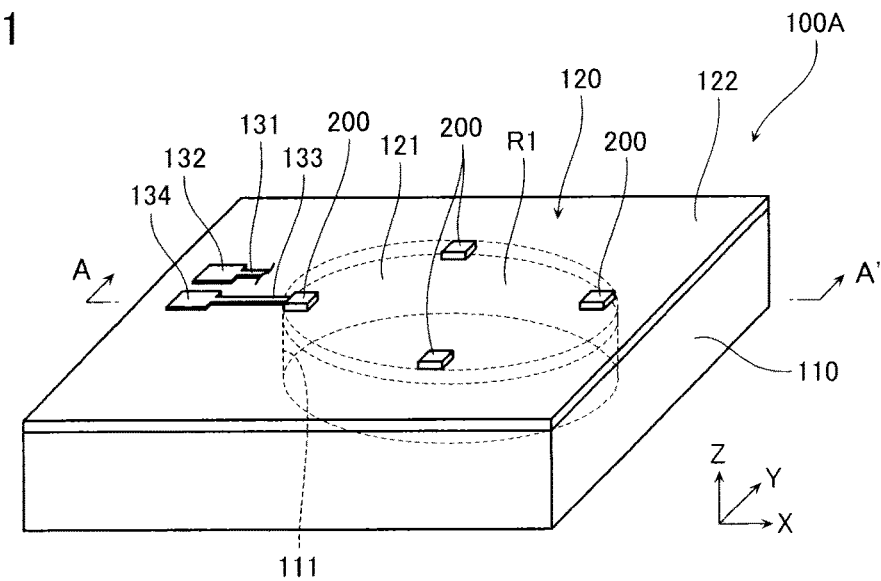
FIG. 1 is a schematic perspective view showing the configuration of a pressure sensor according to a first embodiment.

A method of manufacturing a pressure sensor according to an embodiment comprises: above a film portion formed on one surface of a substrate, depositing a first magnetic layer, a second magnetic layer and an intermediate layer between the first and second magnetic layers; removing the first magnetic layer, the second magnetic layer and the intermediate layer leaving a part thereof; and removing a part of the substrate from another surface of the substrate. In the method, by removing the first magnetic layer, the second magnetic layer and the intermediate layer leaving the part thereof, a strain detecting element being formed in a part of a first region, the strain detecting element comprising the first magnetic layer, the second magnetic layer and the intermediate layer. In the method, by removing a part of the substrate from the another surface of the substrate, a part of the first region of the substrate being removed from the another surface. In the method, the deposition of the first magnetic layer being performed with the substrate bended.

Each embodiment will be described below with reference to the drawings. Note that the drawings are schematic or conceptual and the relationship of the thickness and the width in each portion and the size ratio between each portion or the like are not necessarily the same as the actual ones. In addition, different drawings may show the same portion in different dimensions or different ratios. In addition, in the specification and each figure, like elements as those in the previous figures are designated with like reference numerals and their detailed description will be omitted as appropriate.

In addition, in the specification, the phrase "being provided on" includes being directly provided in contact with as well as being provided on with another element inserted therebetween.

1. First Embodiment

Figure 2:
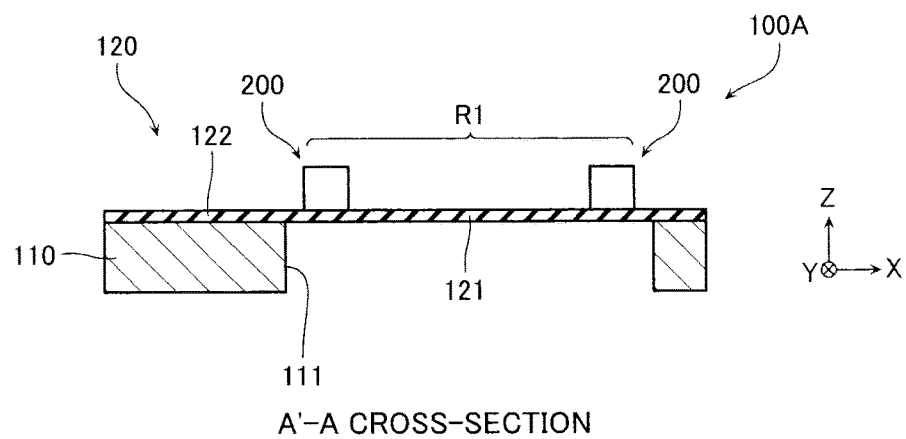
FIG. 2 is a schematic cross-sectional view showing the configuration of the pressure sensor.

Before describing a method of manufacturing a pressure sensor according to a first embodiment, the pressure sensor manufactured according to the manufacturing method will be described. FIG. 1 is a schematic perspective view showing the configuration of a pressure sensor 100A according to the first embodiment. FIG. 2 is a schematic cross-sectional view as viewed from the A-A' in FIG. 1. FIGS. 3A, 3B, 3C and 3D are schematic plan views showing the configurations of the pressure sensor 100A. FIG. 4 is a schematic cross-sectional view for illustrating the operation of the pressure sensor.

As shown in FIG. 4, the pressure sensor 100A has a film portion 120 and a strain detecting element 200 provided on the film portion 120. The film portion 120 is deformed in response to external pressure. The strain detecting element 200 strains in response to the deformation of the film portion 120 and changes its electrical resistance value in response to the strain. Therefore, by detecting the change of the electrical resistance value of the strain detecting element, the external pressure is detected. Note that the pressure sensor 100A may detect sound waves or ultrasonic waves. In this case, the pressure sensor 100A functions as a microphone.

As shown in FIG. 1, the pressure sensor 100A has a substrate 110, a film portion 120 provided on one surface of the substrate 110, and the strain detecting element 200 provided on the film portion 120. In addition, the film portion 120 bears a wiring line 131, a pad 132, a wiring line 133, and a pad 134, which are connected to the strain detecting element 200. The direction perpendicular to the substrate 110 is referred to below as the Z direction. In addition, a predetermined direction perpendicular to the Z direction is defined as the X direction and the direction perpendicular to the Z direction and the X direction is defined as the Y direction.

As shown in FIG. 2, the substrate 110 is a plate-shaped substrate having a cavity portion 111. The substrate 110 functions as a support portion supporting the film portion 120 to allow the film portion 120 to be deformed in response to the external pressure. In this embodiment, the cavity portion 111 is a cylindrical hole passing through the substrate 110. The substrate 110 has, for example, a semiconductor material such as silicon, a conductive material such as metal, or an insulating material. In addition, the substrate 110 may have, for example, silicon oxide or silicon nitride or the like.

The inside of the cavity portion 111 is designed such that the film portion 120 may be deformed. For example, the inside of the cavity portion 111 may be under decompression or vacuum. In addition, the inside of the cavity portion 111 may be filled with a gas such as air or liquid. In addition, the cavity portion 111 may be in communication with the outside.

As shown in FIG. 2, the film portion 120 is formed thinner than the substrate 110. In addition, the film portion 120 has an oscillation portion 121 that is positioned immediately above the cavity portion 111 and is deformed in response to the external pressure, and a supported portion 122 that is integrally formed with the oscillation portion 121 and supported by the substrate 110. For example, as shown in FIG. 3A, the supported portion 122 surrounds the oscillation portion 121. The region that is positioned immediately above the cavity portion 111 of the film portion 120 is referred to below as a first region R1.

The first region R1 may be formed in various shapes, for example, as shown in FIG. 3A, in a generally complete round, as shown in FIG. 3B, in an ellipse shape (such as a flattened circle shape), as shown in FIG. 3C, in a generally square shape, or as shown in FIG. 3D, in a rectangular shape. In addition, the first region R1 may be a polygon or a regular polygon.

The material of the film portion 120 may have, for example, an insulating material including SiOx, SiNx, and a flexible plastic material such as polyimide or paraxylylene-based polymer or the like. In addition, the material of the film portion 120 may have, for example, at least any of silicon oxide, silicon nitride, and silicon oxynitride. In addition, the material of the film portion 120 may have, for example, a semiconductor material such as silicon or a metal material such as Al.

The film portion 120 is formed thinner than the substrate 110. The film portion 120 has a thickness (a width in the Z direction), for example, not less than 0.1 micrometer ($\mu m$) and not larger than 3 $\mu m$. The film portion 120 preferably has a thickness not less than 0.2 $\mu m$ and not larger than 1.5 $\mu m$. The film portion 120 may have a stack of, for example, a silicon oxide film of 0.2 $\mu m$ thickness and a silicon film of 0.4 $\mu m$ thickness.

As shown in FIGS. 3A, 3B, 3C and 3D, more than one strain detecting element 200 is disposed in the first region R1 on the film portion 120. In addition, each strain detecting element 200 is disposed along the outer edge of the first region R1. The strain detecting elements 200 are disposed in a portion of the first region R1. Specifically, in the example shown in FIGS. 3A, 3B, 3C and 3D, each strain detecting element 200 has the same distance (the shortest path Lmin) to the outer edge of the first region R1.

For example, as shown in FIG. 3A and FIG. 3B, if the first region R1 has a curved outer edge, the strain detecting elements 200 are disposed along the curve. In addition, for example, as shown in FIGS. 3C and 3D, if the first region R1 has a straight line outer edge, the strain detecting elements 200 are linearly disposed along the straight line.

The strain detecting elements 200 are connected to the pad 132 via the wiring line 131 shown in FIG. 1 and to the pad 134 via the wiring line 133. If the pressure sensor 100A is used to detect pressure, the strain detecting elements 200 are applied with a voltage via the pads 132 and 134 to measure the electrical resistance value of the strain detecting elements 200. Note that an interlayer insulating layer may be provided between the wiring lines 131 and 133.

The strain detecting elements 200 may be connected in series or in parallel via not-shown wiring lines. This may increase the SN ratio.

Each strain sense device 200 may have an extremely small size. Each strain sense device 200 may have an area in the X-Y plane that is sufficiently less than the area of the first region R1. For example, each strain sense device 200 may have an area of ⅕ or less of the area of the first region R1. The strain detecting elements 200 may be connected in series or in parallel to provide a high gauge factor or a high SN ratio even if each strain sense device 200 is sufficiently smaller than the area of the first region R1.

For example, if the first region R1 has a diameter of about 60 $\mu m$, each strain sense device 200 may have a first dimension of 12 $\mu m$ or less. For example, if the first region R1 has a diameter of about 600 $\mu m$, each strain sense device 200 may have a dimension of 120 $\mu m$ or less. Considering the machining accuracy of each strain sense device 200 or the like, it is not necessary to excessively reduce the dimension of each strain sense device 200. Therefore, each strain sense device 200 may have a dimension, for example, not less than 0.05 $\mu m$ and not more than 30 $\mu m$.

Note that although in the example shown in FIG. 1 to FIG. 3D, the substrate 110 and the film portion 120 are configured as separate portions, the film portion 120 may be formed integrally with the substrate 110. In addition, the film portion 120 may have the same or a different material to the substrate 110. If the film portion 120 is integrally formed with the substrate 110, a thinly formed portion of the substrate 110 provides the film portion 120 (the oscillation portion 121). In addition, the oscillation portion 121 may be continuously supported, as shown in FIG. 1 to FIG. 3D, along the outer edge of the first region R1, or supported by portions of the outer edge of the first region R1.

In addition, although in the example shown in FIGS. 3A, 3B, 3C and 3D, the film portion 120 bears more than one strain detecting element 200, the film portion 120 may bear, for example, only one strain detecting element 200.

Figure 5:
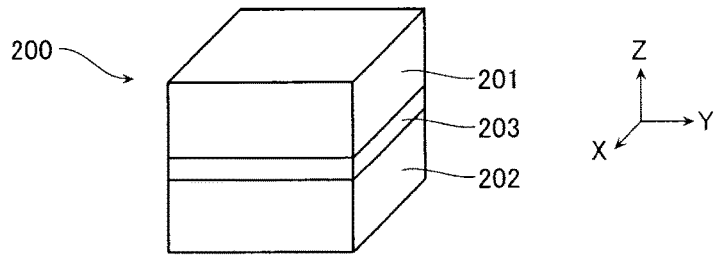
FIG. 5 is a schematic perspective view showing the configuration of a strain detecting element according to the first embodiment.

Next, with reference to FIG. 5, a schematic configuration of the strain detecting element 200 according to this embodiment will be described. FIG. 5 is a schematic perspective view showing the configuration of the strain detecting element 200 according to the first embodiment. As shown in FIG. 5, the strain detecting element 200 according to this embodiment has a first magnetic layer 201, a second magnetic layer 202, and an intermediate layer 203 provided between the first and second magnetic layers 201 and 202. If the strain detecting element 200 experiences the strain, the relative magnetization direction is changed between the magnetic layers 201 and 202. Accordingly, the electrical resistance value between the magnetic layers 201 and 202 is changed. Therefore, by detecting the change of the electrical resistance value, the strain generated in the strain detecting element 200 can be detected.

In this embodiment, the first magnetic layer 201 has a ferromagnetic material and functions, for example, as a magnetization free layer. In addition, the second magnetic layer 202 also has a ferromagnetic material and functions, for example, as a reference layer. The second magnetic layer 202 may be a magnetization fixed layer or a magnetization free layer.

Note that, for example, the first magnetic layer 201 may be formed larger than the second magnetic layer 202 in the X-Y plane. In addition, one of the first and second magnetic layers 201 and 202 may be divided.

Figure 6A:
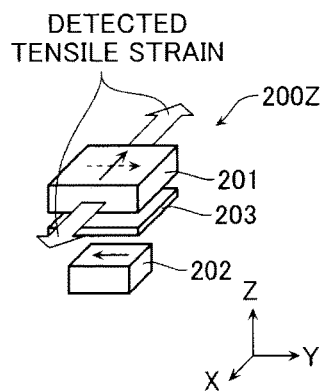
FIGS. 6A, 6B, 6C and 6D are schematic diagrams for illustrating the operation of a strain detecting element according to a comparative example.
Figure 6B:
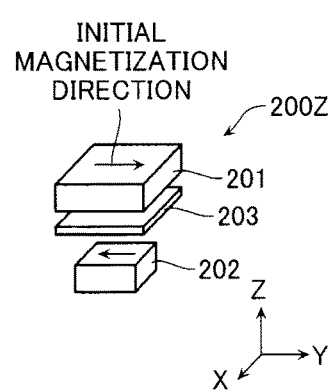
Figure 6C:
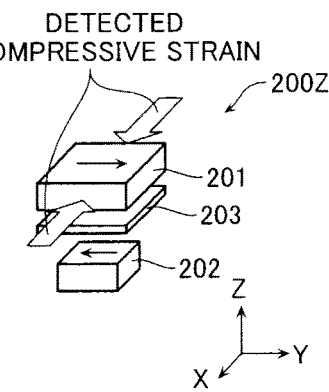

Next, in order to describe the operation of the strain detecting element 200 according to this embodiment, the operation of a strain detecting element 200Z according to a comparative example will be described with reference to FIGS. 6A, 6B, 6C and 6D. FIGS. 6A, 6B, and 6C are schematic perspective views representing the strain detecting element 200Z experiencing tensile strain, experiencing no strain, and experiencing compressive strain, respectively.

As shown in FIGS. 6A, 6B, and 6C, the strain detecting element 200Z has, like the strain detecting element 200, the first magnetic layer 201, the second magnetic layer 202, and the intermediate layer 203. Note that it is assumed that in the strain detecting element 200Z, the second magnetic layer 202 functions as the magnetization fixed layer. In addition, in the following discussion, it is assumed that the second magnetic layer 202 of the strain detecting element 200Z has a magnetization direction in the −Y direction and the strain detecting element 200Z experiences the strain in the X direction.

As shown in FIG. 6B, if the strain detecting element 200Z experiences no strain, the magnetization direction of the first magnetic layer 201 (hereinafter referred to as "initial magnetization direction") is the same or opposite (+Y direction or −Y direction) to the magnetization direction of the second magnetic layer 202 for the following reason. That is, when the strain detecting element 200Z is manufactured, a method such as magnetic field annealing is used to fix the magnetization direction of the second magnetic layer 202. Then, in addition to the magnetization direction of the second magnetic layer 202, the easy direction of the magnetization of the first magnetic layer 201 becomes the same or opposite to the magnetization direction of the second magnetic layer due to induced magnetic anisotropy generated in the magnetic field direction during the annealing.

Here, as shown in FIG. 6A, if the strain detecting element 200Z experiences the tensile strain in the X direction, the first magnetic layer 201 experiences the "inverse magnetostriction effect", which relatively changes the magnetization directions of the first and second magnetic layers 201 and 202.

The "inverse magnetostriction effect" is a phenomenon in which the magnetization direction of the ferromagnetic body is changed in response to the strain. For example, if the ferromagnetic material used in the magnetization free layer has a positive magnetostriction constant, the magnetization direction of the magnetization free layer approaches parallel to the tensile strain direction and approaches perpendicular to the compressive strain direction. Meanwhile, if the ferromagnetic material used in the magnetization free layer has a negative magnetostriction constant, the magnetization direction approaches perpendicular to the tensile strain direction and approaches parallel to the compressive strain direction.

The first magnetic layer 201 of the strain detecting element 200Z has a ferromagnetic material having a positive magnetostriction constant. Therefore, as shown in FIG. 6A, the magnetization direction of the first magnetic layer 201 approaches parallel to the tensile strain direction. Note that the first magnetic layer 201 may have a negative magnetostriction constant.

Meanwhile, as shown in FIG. 6C, even if the strain detecting element 200Z experiences the compressive strain in the X direction, the relative magnetization direction remains unchanged between the first and second magnetic layers 201 and 202. It is because, if the strain detecting element 200Z experiences the compressive strain in the X direction, the inverse magnetostriction effect causes the initial magnetization direction of the first magnetic layer 201 to be inclined perpendicular to the direction of the compressive strain, but the initial magnetization direction of the first magnetic layer 201 is already perpendicular to the direction of the compressive strain.

Figure 6D:
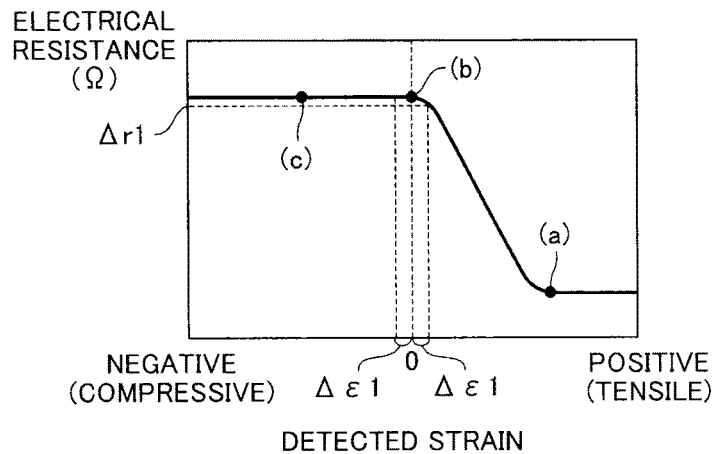

FIG. 6D is a schematic graph showing the relationship of the electrical resistance of the strain detecting element 200Z and the amount of strain generated in the strain detecting element 200Z. Note that in FIG. 6D, the tensile-direction strain is the positive-direction strain and the compressive-direction strain is the negative-direction strain.

As shown in FIG. 6A, if the magnetization directions of the first and second magnetic layers 201 and 202 relatively change, as shown in FIG. 6D, the "magnetoresistive effect (MR effect)" changes the electrical resistance value between the first and second magnetic layers 201 and 202.

The MR effect is a phenomenon in which if the magnetization directions are relatively changed between the magnetic layers, the electrical resistance between the magnetic layers changes. The MR effect includes, for example, the giant magnetoresistance (GMR) effect or the tunneling magnetoresistance (TMR) effect or the like.

Note that if the first magnetic layer 201, the second magnetic layer 202, and the intermediate layer 203 have a positive magnetoresistive effect, the electrical resistance decreases in case that a relative angle between the first and second magnetic layers 201 and 202 is small. Meanwhile, if they have a negative magnetoresistive effect, the electrical resistance increases in case that the relative angle is small.

The strain detecting element 200Z has a positive magnetoresistive effect. Therefore, as shown in FIG. 6A, if the strain detecting element 200Z experiences the tensile strain and difference in the magnetization directions between the first and second magnetic layers 201 and 202 approximate from 180° to 90°, as shown in FIG. 6D, the electrical resistance between the first and second magnetic layers 201 and 202 is decreased. Note that the strain detecting element 200Z may have a negative magnetoresistive effect.

Meanwhile, as shown in FIG. 6C, even if the strain detecting element 200Z experiences the compressive strain, the magnetization directions of the first and second magnetic layers 201 and 202 remain unchanged, and thus, as shown in FIG. 6D, the electrical resistance between the first and second magnetic layers 201 and 202 remains unchanged. In this way, if the relative angle between the initial magnetization direction of the first magnetic layer 201 and the direction of the strain generated in the first magnetic layer 201 is 90° or set to 0°, 180°, or 270°, as shown in FIG. 6D, the strain detecting element only responds to the strain toward one polarity. Such a strain detecting element 200Z cannot be directly used in a device such as a microphone, for example, that is sensitive to the positive/negative pressure.

In addition, if the strain detecting element 200Z experiences strain around zero, addition of small strain $\Delta\epsilon 1$ in the positive direction (tensile direction), for example, will provide only a small resistance change $\Delta r1$ of the strain detecting element 200Z. In addition, for example, small strain $\Delta\epsilon 1$ added in the negative direction (compressive direction) will hardly cause resistance change. Hereinafter, the variation of the electrical resistance value per unit strain is referred to below as a gauge factor (GF). In order to manufacture the high sensitivity pressure sensor 100A, it is preferable to use a strain sense device 200 that has a high gauge factor for the strain around zero.

Figure 7A:
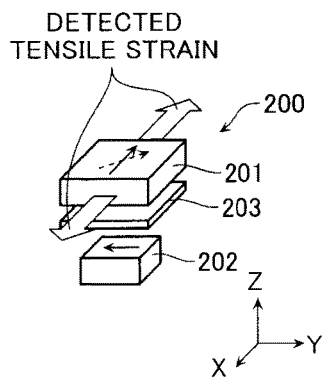
FIGS. 7A, 7B, 7C and 7D are schematic diagrams for illustrating the operation of the strain detecting element according to the first embodiment.
Figure 7B:
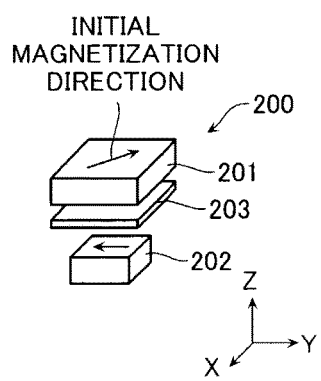
Figure 7C:
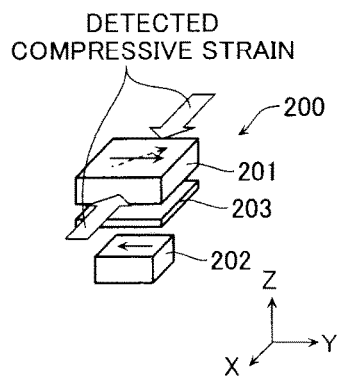
Figure 7D:
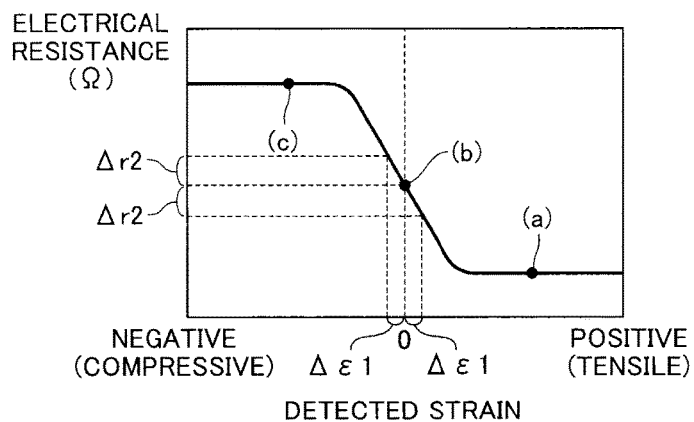
Figure 8:
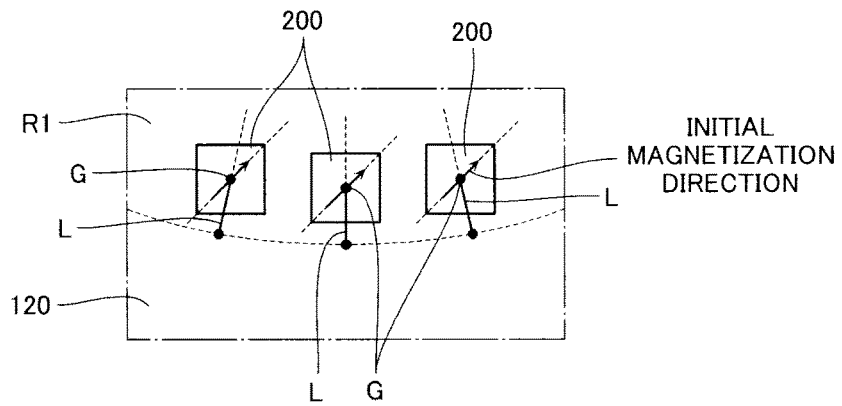
FIG. 8 is a schematic plan view for illustrating the operation of the strain detecting element.

Next, with reference to FIGS. 7A, 7B, 7C and 7D, the operation of the strain detecting element 200 according to this embodiment will be described. FIGS. 7A, 7B, and 7C are schematic perspective views representing the strain detecting element 200 experiencing the tensile strain, experiencing no strain, and experiencing the compressive strain, respectively. In addition, FIG. 7D is a schematic graph showing the relationship of the electrical resistance of the strain detecting element 200 according to this embodiment and the strain generated in the strain detecting element 200. In addition, FIG. 8 is a schematic plan view for illustrating the operation of the strain detecting element 200.

As shown in FIG. 7B, if the strain detecting element 200 according to this embodiment experiences no strain, the relative angle between the magnetization direction of the first magnetic layer 201 and the magnetization direction of the second magnetic layer 202 is larger than 0° and smaller than 180°. In the example shown in FIG. 7B, the initial magnetization direction of the first magnetic layer 201 is at an angle of 135° with respect to the magnetization direction of the second magnetic layer 202 and at an angle of 45° (135°) with respect to the direction in which the strain is generated. However, the angle of 135° is here merely an example and may be set to different angles.

Again, in manufacturing the strain detecting element 200 according to this embodiment, a method such as magnetic field annealing is used to fix the magnetization direction of the second magnetic layer 202. However, in this embodiment, the first magnetic layer 201 is manufactured with the substrate 110 bended. Therefore, in the first magnetic layer 201 according to this embodiment, even if the strain to be detected is around zero, strain due to internal stress exists. This strain then causes the inverse magnetostriction effect, which adjusts the initial magnetization direction of the first magnetic layer 201.

In addition, as shown in FIGS. 7A, 7B, and 7C, the initial magnetization direction of the first magnetic layer 201 is not generally perpendicular or generally parallel to the direction in which the strain is generated. In addition, the strain detecting element 200 according to this embodiment is formed, as shown in FIG. 1 to FIG. 3D, in the first region R1 on the film portion 120. Therefore, as shown in FIG. 8, the strain detecting element 200 experiences strain in the direction parallel to the straight line L, where L is the straight line joining the centroid G of the strain detecting element 200 and the outer edge of the first region R1 by the shortest path. Specifically, the relative angle between the straight line L and the initial magnetization direction of the first magnetic layer 201 is larger than 0° and smaller than 90°. Note that it is particularly preferable that the relative angle between the straight line L and the initial magnetization direction of the first magnetic layer 201 is larger than 30° and smaller than 60°. Note that the relative angle here is not an obtuse angle but an acute angle.

Therefore, as shown in FIG. 7D, the strain detecting element 200 according to this embodiment has an electrical resistance value that decreases for the strain in the positive direction (tensile strain) and increases for the strain in the negative direction (compressive strain). Therefore, the strain detecting element 200 may be directly used, for example, in a device such as a microphone that is sensitive to the positive/negative pressure.

In addition, if the strain detecting element 200 experiences strain around zero, addition of small strain $\Delta\epsilon 1$ in the positive direction (tensile direction) and addition of small strain $\Delta\epsilon 1$ in the negative direction (compressive direction) may both provide a relatively large resistance change $\Delta r2$. Specifically, the strain detecting element 200 according to this embodiment has a large gauge factor for extremely small strain and thus is suitable for the manufacture of the high sensitivity pressure sensor 100A.

Figure 9A:
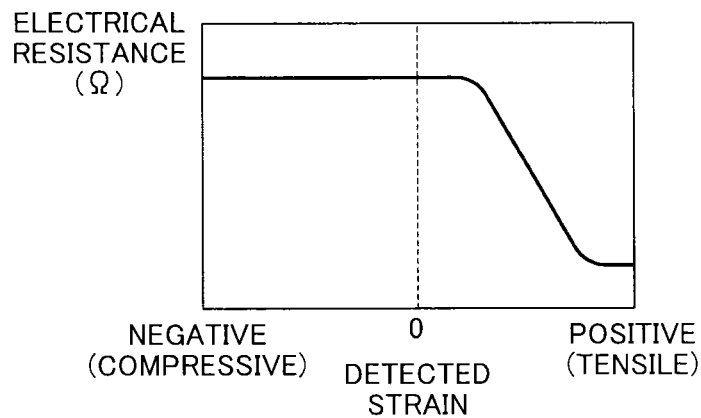
FIGS. 9A, 9B and 9C are graphs for illustrating another mode of the strain detecting element.
Figure 9B:
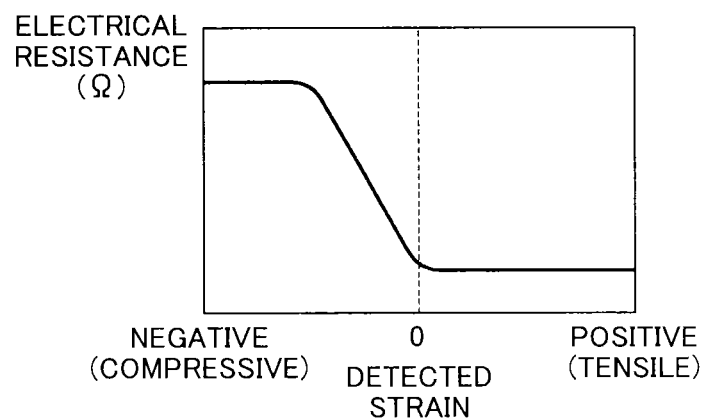
Figure 9C:
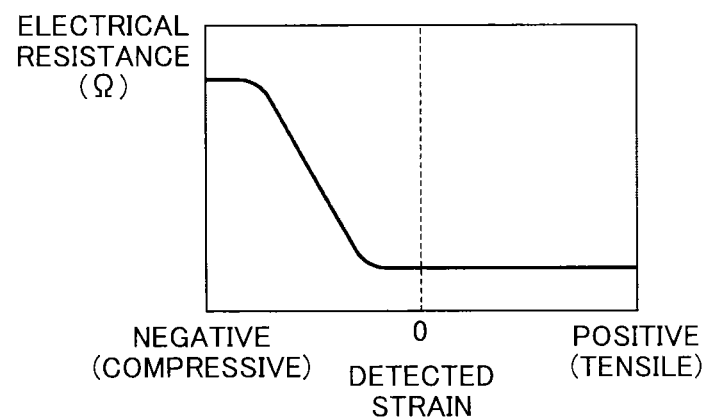

FIGS. 9A, 9B and 9C are graphs showing the characteristics of another strain detecting element according to this embodiment. FIG. 9A shows the operating characteristics of a strain detecting element that detects the strain in the positive direction (tensile direction). In addition, FIGS. 9B and 9C show the operating characteristics of a strain detecting element that detects the strain in the negative direction (compressive direction). In addition, in the operating characteristics shown in FIGS. 9A and 9C, the strain detection range does not include the range for extremely small strain.

The above description has been given with respect to an example where a predetermined angle between 0° and 90° is set as the relative angle between the magnetization direction of the first magnetic layer 201 and the direction of the strain added to the first magnetic layer 201 when driving the strain sense device 200. But some applications may use the strain detecting element 200 having the operating characteristics as shown in FIG. 7D as well as the strain detecting element 200 having the operating characteristics as shown in FIG. 6D, FIG. 9A, FIG. 9B, and FIG. 9C.

For example, the film portion 120 (FIG. 1) that is to mount the strain detecting element may undergo initial deformation in the manufacturing process of the film portion 120 or in the mounting of the pressure sensor 100A or the like. In such a case, the range of strain that is sensed by the strain detecting element may be shifted according to the initial deformation.

In the manufacturing method according to this embodiment, depending on a state of bending the substrate 110, the strain detecting elements having the characteristics as shown in FIG. 7D, FIG. 6D, FIG. 9A, FIG. 9B, and FIG. 9C. This may make it possible to freely adjust the range of strain that is sensed by the strain sense device having the first magnetic layer. A strain sense device may thus be provided that shows high strain sensitivity in the strain detection range necessary for a device mounting the strain sense device.

Next, with reference to FIG. 10 to FIG. 15, an example configuration of the strain detecting element 200 according to this embodiment will be described. Note that in the following description, the term "material A/material B" means that the material A has the material B provided thereon.

Figure 10:
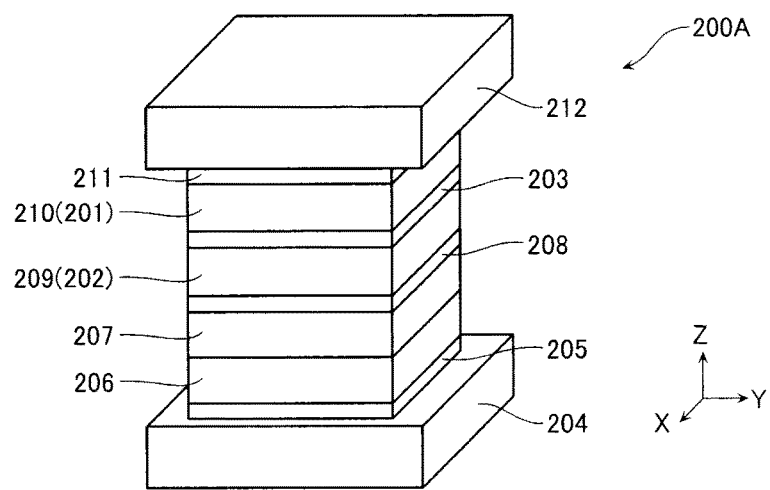
FIG. 10 is a schematic perspective view showing an example configuration of the strain detecting element.

FIG. 10 is a schematic perspective view showing one example configuration 200A of the strain detecting element 200. As shown in FIG. 10, the strain detecting element 200A has a sequential stack of a bottom electrode 204, an under layer 205, a pinning layer 206, a second magnetization fixed layer 207, a magnetic coupling layer 208, a first magnetization fixed layer 209 (the second magnetic layer 202), an intermediate layer 203, a magnetization free layer 210 (the first magnetic layer 201), a cap layer 211, and a top electrode 212. The first magnetization fixed layer 209 corresponds to the second magnetic layer 202. The magnetization free layer 210 corresponds to the first magnetic layer 201. In addition, the bottom electrode 204 is connected, for example, to the wiring line 131 (FIG. 1), and the top electrode 212 is connected, for example, to the wiring line 133 (FIG. 1). Note, however, that if, for example, the first magnetic layer 201 is divided, the top electrode connected to one of the first magnetic layers 201 may be connected to the wiring line 131 (FIG. 1) and the top electrode connected to the other of the first magnetic layers 201 may be connected to the wiring line 133 (FIG. 1). Likewise, if, for example, the second magnetic layer 202 is divided, the bottom electrode connected to one of the second magnetic layers 202 may be connected to the wiring line 131 (FIG. 1) and the bottom electrode connected to the other of the second magnetic layers 202 may be connected to the wiring line 133 (FIG. 1).

The under layer 205 has, for example, Ta/Ru. The Ta layer has a thickness (a length in the Z axis direction) of, for example, 3 nanometer (nm). The Ru layer has a thickness of, for example, 2 nm. The pinning layer 206 has, for example, an IrMn layer of 7 nm thickness. The second magnetization fixed layer 207 has, for example, a $Co_{75}Fe_{25}$ layer of 2.5 nm thickness. The magnetic coupling layer 208 has, for example, an Ru layer of 0.9 nm thickness. The first magnetization fixed layer 209 has, for example, a $Co_{40}Fe_{40}B_{20}$ layer of 3 nm thickness. The intermediate layer 203 has, for example, an MgO layer of 1.6 nm thickness. The magnetization free layer 210 has, for example, a $Co_{40}Fe_{40}B_{20}$ of 4 nm thickness. The cap layer 211 has, for example, Ta/Ru. The Ta layer has a thickness of, for example, 1 nm. The Ru layer has a thickness of, for example, 5 nm.

The bottom electrode 204 and the top electrode 212 have, for example, at least any of aluminum (Al), aluminum copper alloy (Al—Cu), copper (Cu), silver (Ag), and gold (Au). The first and second electrodes that have such a material having a relatively low electrical resistance may efficiently conduct a current through the strain detecting element 200A. The bottom electrode 204 and the top electrode 212 may have a non-magnetic material.

The bottom electrode 204 and the top electrode 212 may have, for example, an under layer for the bottom electrode 204 and the top electrode 212 (not shown), a cap layer for the bottom electrode 204 and the top electrode 212 (not shown), and a layer provided therebetween, the layer having at least any of Al, Al—Cu, Cu, Ag, and Au. For example, the bottom electrode 204 and the top electrode 212 have a material such as tantalum (Ta)/copper (Cu)/tantalum (Ta). The under layer for the bottom electrode 204 and the top electrode 212 that has Ta may improve, for example, the adhesion between the substrate 210 and the bottom and top electrodes 204 and 212. The under layer for the bottom electrode 204 and the top electrode 212 may have a material such as titanium (Ti) or titanium nitride (TiN).

The cap layer for the bottom electrode 204 and the top electrode 212 that has Ta may reduce the oxidation of the material such as copper (Cu) under the cap layer. The cap layer for the bottom electrode 204 and the top electrode 212 may have a material such as titanium (Ti) or titanium nitride (TiN).

The under layer 205 may have, for example, a stacked structure having a buffer layer (not shown) and a seed layer (not shown). The buffer layer may reduce, for example, the surface roughnesses of the bottom electrode 204 and the film portion 120 or the like, thus improving the crystallinity of a layer stacked on the buffer layer. The buffer layer has, for example, at least any of materials selected from the group consisting of tantalum (Ta), titanium (Ti), vanadium (V), tungsten (W), zirconium (Zr), hafnium (Hf), and chromium (Cr). The buffer layer may have an alloy having at least one material selected from those materials.

Preferably, the buffer layer of the under layer 205 has a thickness not less than 1 nm and not more than 10 nm. More preferably, the buffer layer has a thickness not less than 1 nm and not more than 5 nm. If the buffer layer is too thin, the buffer effect is lost. If the buffer layer is too thick, the thickness of the strain detecting element 200A becomes excessively large. The buffer layer may bear the seed layer, which may have the buffer effect. In this case, the buffer layer may be omitted. The buffer layer has, for example, a Ta layer of 3 nm thickness.

The seed layer of the under layer 205 controls the crystal orientation of the layer stacked on the seed layer. The seed layer controls the crystal grain size of the layer stacked on the seed layer. The seed layer has a material such as metal of a face-centered cubic structure (fcc structure), a hexagonal close-packed structure (hcp structure), or a body-centered cubic structure (bcc structure).

The seed layer in the under layer 205 that has ruthenium (Ru) of the hcp structure, NiFe of the fcc structure, or Cu of the fcc structure may allow, for example, a spin valve film on the seed layer to have a crystal orientation of fcc (111). The seed layer has, for example, a Cu layer of 2 nm thickness or a Ru layer of 2 nm thickness. To improve the crystal orientation of the layer formed on the seed layer, the seed layer preferably has a thickness not less than 1 nm and not more than 5 nm. More preferably, the seed layer has a thickness not less than 1 nm and not more than 3 nm. This may sufficiently exert the seed layer's function of improving the crystal orientation.

Meanwhile, if, for example, it is not necessary to provide the crystal orientation of the layer formed on the seed layer (for example, if an amorphous magnetization free layer is formed or the like), the seed layer may be omitted. The seed layer has, for example, a Cu layer of 2 nm thickness.

The pinning layer 206 provides, for example, unidirectional anisotropy to the second magnetization fixed layer 207 (ferromagnetic layer) formed on the pinning layer 206 to fix the magnetization of the second magnetization layer 207. The pinning layer 206 has, for example, an antiferromagnetic layer. The pinning layer 206 has, for example, at least any of materials selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. The pinning layer 206 may also have an alloy that has an additive element and one of Ir—Mn, Pt—Mn, Pd—Pt—Mn, Ru—Mn, Rh—Mn, Ru—Rh—Mn, Fe—Mn, Ni—Mn, Cr—Mn—Pt, or Ni—O. In order to provide the sufficiently strong unidirectional anisotropy, the thickness of the pinning layer 206 is appropriately set.

To fix the magnetization of the ferromagnetic layer in contact with the pinning layer 206, annealing is performed under application of a magnetic field. The magnetization of the ferromagnetic layer in contact with the pinning layer 206 is fixed in the direction of the magnetic field applied during the annealing. The annealing temperature is set, for example, equal to or more than the magnetization fixing temperature of the antiferromagnetic material used in the pinning layer 206. In addition, if the antiferromagnetic layer has Mn, Mn may be diffused in other layer than the pinning layer 206, thus reducing the MR ratio. Therefore, the annealing temperature is preferably set equal to or less than the temperature at which Mn diffusion occurs. The annealing temperature may be, for example, not less than 200° C. and not more than 500° C. Preferably, the annealing temperature may be not less than 250° C. and not more than 400° C.

If the pinning layer 206 has PtMn or PdPtMn, the pinning layer 206 preferably has a thickness not less than 8 nm and not more than 20 nm. More preferably, the pinning layer 206 has a thickness not less than 10 nm and not more than 15 nm. The pinning layer 206 having IrMn may achieve the unidirectional anisotropy with a smaller thickness than the pinning layer 206 having PtMn. In this case, the pinning layer 206 preferably has a thickness not less than 4 nm and not more than 18 nm. More preferably, the pinning layer 206 has a thickness not less than 5 nm and not more than 15 nm. The pinning layer 206 has, for example, an $Ir_{22}Mn_{78}$ layer of 7 nm thickness.

The pinning layer 206 may have a hard magnetic layer. The hard magnetic layer has, for example, hard magnetic materials having relatively high magnetic anisotropy and coercivity, such as Co—Pt, Fe—Pt, Co—Pd, and Fe—Pd. In addition, the hard magnetic layer may also have an alloy that has an additive element and one of Co—Pt, Fe—Pt, Co—Pd, or Fe—Pd. The hard magnetic layer may have, for example, CoPt (the ratio of Co is not less than 50 at. % and not more than 85 at. %), $(Co_xPt_{100-x})_{100-y}Cr_y$ (x is not less than 50 at. % and not more than 85 at. % and y is not less than 0 at. % and not more than 40 at. %), or FePt (the ratio of Pt is not less than 40 at. % and not more than 60 at. %) or the like.

The second magnetization fixed layer 207 has, for example, $Co_xFe_{100-x}$ alloy (x is not less than 0 at. % and not more than 100 at. %), $Ni_xFe_{100-x}$ alloy (x is not less than 0 at. % and not more than 100 at. %), or any of these alloys added with a non-magnetic element. The second magnetization fixed layer 12 has, for example, at least any one selected from the group consisting of Co, Fe, and Ni. The second magnetization fixed layer may have an alloy having at least one material selected from the above materials. The second magnetization fixed layer may also have $(Co_xFe_{100-x})_{100-y}B_y$ alloy (x is not less than 0 at. % and not more than 100 at. % and y is not less than 0 at. % and not more than 30 at. %). The second magnetization fixed layer having an amorphous alloy of $(Co_xFe_{100-x})_{100-y}B_y$ may reduce the variation of the characteristics of the strain detecting element 200A even if the strain sense device has a small size.

The second magnetization fixed layer 207 preferably has a thickness, for example, not less than 1.5 nm and not more than 5 nm. This may, for example, further increase the strength of the unidirectional anisotropy field by the pinning layer 206. For example, via the magnetic coupling layer formed on the second magnetization fixed layer 207, the strength of the antiferromagnetic coupling field between the second magnetization fixed layer 207 and the first magnetization fixed layer 209 may further be increased. For example, it is preferable that the magnetic film thickness (the product (Bs·t) of the saturation magnetization Bs and the thickness t) of the second magnetization fixed layer 207 is substantially the same as the magnetic film thickness of the first magnetization fixed layer 209.

A thin film of $Co_{40}Fe_{40}B_{20}$ has a saturation magnetization of about 1.9 tesla (T). For example, if the first magnetization fixed layer 209 has $Co_{40}Fe_{40}B_{20}$ layer of 3 nm thickness, the first magnetization fixed layer 209 has a magnetic film thickness of 1.9 T×3 nm, giving 5.7 Tnm. Meanwhile, $Co_{75}Fe_{25}$ has a saturation magnetization of about 2.1 T. The thickness of the second magnetization fixed layer 207 having the same magnetic film thickness as the above is 5.7 Tnm/2.1 T, giving 2.7 nm. In this case, the second magnetization fixed layer 207 preferably has a $Co_{75}Fe_{25}$ layer of about 2.7 nm thickness. The second magnetization fixed layer 207 has, for example, a $Co_{75}Fe_{25}$ layer of 2.5 nm thickness.

In the strain sense device 200A, the second magnetization fixed layer 207, the magnetic coupling layer 208, and the first magnetization fixed layer 209 form a synthetic pin structure. Instead, a single pin structure having one magnetization fixed layer may be used. If the single pin structure is used, the magnetization fixed layer has, for example, a $Co_{40}Fe_{40}B_{20}$ layer of 3 nm thickness. The ferromagnetic layer used in the magnetization fixed layer of the single pin structure may have the same material as the above second magnetization fixed layer.

The magnetic coupling layer 208 causes the antiferromagnetic coupling between the second magnetization fixed layer 207 and the first magnetization fixed layer 209. The magnetic coupling layer 208 forms the synthetic pin structure. The magnetic coupling layer 208 has, for example, Ru. The magnetic coupling layer 208 preferably has a thickness, for example, not less than 0.8 nm and not more than 1 nm. The magnetic coupling layer 208 may have any material other than Ru that causes sufficient antiferromagnetic coupling between the second magnetization fixed layer 207 and the first magnetization fixed layer 209. The thickness of the magnetic coupling layer 208 may be set to a thickness not less than 0.8 nm and not more than 1 nm corresponding to the 2nd peak of the Ruderman-Kittel-Kasuya-Yosida (RKKY) coupling. In addition, the thickness of the magnetic coupling layer 208 may be set to a thickness not less than 0.3 nm and not more than 0.6 nm corresponding to the 1st peak of the RKKY coupling. The magnetic coupling layer 208 has, for example, Ru of 0.9 nm thickness. This may provide highly reliable coupling more stably.

The magnetic layer included in the first magnetization fixed layer 209 directly contributes to the MR effect. The first magnetization fixed layer 209 has, for example, a Co—Fe—B alloy. Specifically, the first magnetization fixed layer 209 may have a $(Co_xFe_{100-x})_{100-y}B_y$ alloy (x is not less than 0 at. % and not more than 100 at. % and y is not less than 0 at. % and not more than 30 at. %). If the first magnetization fixed layer 209 has an amorphous alloy of $(Co_xFe_{100-x})_{100-y}B_y$, the device-to-device variation due to the crystal grain may be reduced, for example, even if the strain detecting element 200A has a small size.

The layer formed on the first magnetization fixed layer 209 (for example, a tunnel insulating layer (not shown)) may be planarized. The planarization of the tunnel insulating layer may decrease the defect density of the tunnel insulating layer. This may provide a larger MR ratio with a lower area resistance. For example, if the material of the tunnel insulating layer has MgO, the first magnetization fixed layer 209 may have an amorphous alloy of $(Co_xFe_{100-x})_{100-y}B_y$ to enhance the (100) orientation of the MgO layer formed on the tunnel insulating layer. Increasing the (100) orientation of the MgO layer may provide a larger MR ratio. The $(Co_xFe_{100-x})_{100-y}B_y$ alloy is crystallized during annealing with the (100) face of the MgO layer as the template. This provides good crystal conformation between MgO and the $(Co_xFe_{100-x})_{100-y}B_y$ alloy. The good crystal conformation provides a larger MR ratio.

The first magnetization fixed layer 209 may have, in addition to the Co—Fe—B alloy, a Fe—Co alloy, for example.

The thicker the first magnetization fixed layer 209 is, the larger the MR ratio is. In order to provide a larger fixed magnetic field, the first magnetization fixed layer 209 is preferably thinner. There is a trade-off relationship between the MR ratio and the fixed magnetic field with respect to the thickness of the first magnetization fixed layer 209. If the first magnetization fixed layer 209 has a Co—Fe—B alloy, the first magnetization fixed layer 209 preferably has a thickness not less than 1.5 nm and not more than 5 nm. More preferably, the first magnetization fixed layer 209 has a thickness not less than 2.0 nm and not more than 4 nm.

The first magnetization fixed layer 209 has, in addition to the above materials, a $Co_{90}Fe_{10}$ alloy of the fcc structure, or Co of the hcp structure, or Co alloy of the hcp structure. The first magnetization fixed layer 209 has, for example, at least one selected from the group consisting of Co, Fe, and Ni. The first magnetization fixed layer 209 has an alloy having at least one material selected from the above materials. An even larger MR ratio may be provided, for example, by the first magnetization fixed layer 209 that has an FeCo alloy material of the bcc structure, a Co alloy having a cobalt composition of 50 at. % or more, or a material having an Ni composition of 50 at. % or more (Ni alloy).

The first magnetization fixed layer 209 may also have, for example, a Heusler magnetic alloy layer such as $Co_2MnGe$, $Co_2FeGe$, $Co_2MnSi$, $Co_2FeSi$, $Co_2MnAl$, $Co_2FeAl$, $Co_2MnGa_{0.5}Ge_{0.5}$, and $Co_2FeGa_{0.5}Ge_{0.5}$. For example, the first magnetization fixed layer 209 has, for example, a $Co_{40}Fe_{40}B_{20}$ layer of 3 nm thickness.

The intermediate layer 203 divides, for example, the magnetic coupling between the first magnetic layer 201 and the second magnetic layer 202. The intermediate layer 203 has, for example, metal, an insulator, or semiconductor. The metal has, for example, Cu, Au, or Ag or the like. If the intermediate layer 203 has metal, the intermediate layer 203 has a thickness, for example, not less than about 1 nm and not more than 7 nm. The insulator or semiconductor has, for example, magnesium oxide (MgO or the like), aluminum oxide ($Al_2O_3$ or the like), titanium oxide (TiO or the like), zinc oxide (ZnO or the like), or gallium oxide (Ga—O) or the like. If the intermediate layer 203 has an insulator or semiconductor, the intermediate layer 203 has a thickness of, for example, not less than about 0.6 nm and not more than about 2.5 nm. The intermediate layer 203 may have, for example, a Current-Confined-Path (CCP) spacer layer. If the spacer layer has the CCP spacer layer, a structure is used, for example, in which an insulating layer of aluminium oxide ($Al_2O_3$) has a copper (Cu) metal path formed therein. For example, the intermediate layer 203 has an MgO layer of 1.6 nm thickness.

The magnetization free layer 210 has a ferromagnetic material. The magnetization free layer 210 may have, for example, a ferromagnetic material having Fe, Co, and Ni. The magnetization free layer 210 may have a material such as, for example, a FeCo alloy or an NiFe alloy. In addition, the magnetization free layer 210 has a Co—Fe—B alloy, a Fe—Co—Si—B alloy, a material having a large λs (magnetostriction constant) such as an Fe—Ga alloy, an Fe—Co—Ga alloy, a Tb-M-Fe alloy, a Tb-M1-Fe-M2 alloy, an Fe-M3-M4-B alloy, Ni, Fe—Al, or ferrite, or the like. In the above Tb-M-Fe alloy, M is at least one selected from the group consisting of Sm, Eu, Gd, Dy, Ho, and Er. In the above Tb-M1-Fe-M2 alloy, M1 is at least one selected from the group consisting of Sm, Eu, Gd, Dy, Ho, and Er. M2 is at least one selected from the group consisting of Ti, Cr, Mn, Co, Cu, Nb, Mo, W, and Ta. In the above Fe-M3-M4-B alloy, M3 is at least one selected from the group consisting of Ti, Cr, Mn, Co, Cu, Nb, Mo, W, and Ta. M4 is at least one selected from the group consisting of Ce, Pr, Nd, Sm, Tb, Dy, and Er. The above ferrite includes, $Fe_3O_4$, $(FeCo)_3O_4$, or the like. The magnetization free layer 210 has a thickness of, for example, 2 nm or more.

The magnetization free layer 210 may have a magnetic material containing boron. The magnetization free layer 210 may have, for example, an alloy having boron (B) and at least one element selected from the group consisting of Fe, Co, and Ni. The magnetization free layer 210 may have, for example, a Co—Fe—B alloy and a Fe—B alloy. The magnetization free layer 210 may have, for example, a $Co_{40}Fe_{40}B_{20}$ alloy. If the magnetization free layer 210 has an alloy having boron (B) and at least one element selected from the group consisting of Fe, Co, and Ni, the magnetization free layer 210 may be added with an element such as Ga, Al, Si, or W for facilitating the high magnetostriction.

The magnetization free layer 210 may have, for example, an Fe—Ga—B alloy, an Fe—Co—Ga—B alloy, or an Fe—Co—Si—B alloy. Such a magnetic material containing boron may reduce the coercivity (Hc) of the magnetization free layer 210, thus facilitating the change of the magnetization direction in response to the strain. This may provide high strain sensitivity.

The magnetization free layer 210 preferably has a boron concentration (for example, a composition ratio of boron) of 5 atomic percent (at. %) or more. This facilitates the creation of an amorphous structure. The magnetization free layer 210 preferably has a boron concentration of 35 at. % or less. The higher the boron concentration is, the lower the magnetostriction constant is, for example. Preferably, the magnetization free layer contains boron at a concentration of, for example, not less than 5 at. % and not more than 35 at. %, more preferably, not less than 10 at. % and not more than 30 at. %.

If a portion of the magnetic layer of the magnetization free layer 210 has $Fe_{1-y}B_y$ ($0<y\leq0.3$), or $(Fe_aX_{1-a})_{1-y}B_y$ (X=Co or Ni, $0.8\leq a<1$, $0<y\leq0.3$), it is easy to have both a large magnetostriction constant λ and a low coercivity, which is particularly preferable in order to provide a high gauge factor. For example, the magnetization free layer 210 may have $Fe_{80}B_{20}$ (4 nm). The magnetization free layer 210 may have $Co_{40}Fe_{40}B_{20}$ (0.5 nm)/$Fe_{80}B_{20}$ (4 nm).

The magnetization free layer 210 may have a multilayer structure. If the intermediate layer 203 has an MgO tunnel insulating layer, it is preferable that the portion of the magnetization free layer 210 that is in contact with the intermediate layer 203 has a Co—Fe—B alloy layer. This provides a high magnetoresistive effect. In this case, the intermediate layer 203 bears a Co—Fe—B alloy layer, and the Co—Fe—B alloy layer bears another magnetic material having a large magnetostriction constant. If the magnetization free layer 210 has a multilayer structure, the magnetization free layer 210 has, for example, Co—Fe—B (2 nm)/Fe—Co—Si—B (4 nm) or the like.

The cap layer 211 protects a layer provided under the cap layer 211. The cap layer 211 has, for example, a plurality of metal layers. The cap layer 211 has, for example, a two-layer structure (Ta/Ru) of a Ta layer and a Ru layer. The Ta layer has a thickness of, for example, 1 nm and the Ru layer has a thickness of, for example, 5 nm. The cap layer 211 may have other metal layer than the Ta layer and the Ru layer. The cap layer 211 may have any composition. For example, the cap layer 211 may have a non-magnetic material. The cap layer 211 may also have other materials that may protect a layer provided under the cap layer 211.

If the magnetization free layer 210 has a magnetic material containing boron, a diffusion barrier layer for a not-shown oxide material and a nitride material may be provided between the magnetization free layer 210 and the cap layer 211 to reduce the boron diffusion. The diffusion barrier layer that has an oxide layer or a nitride layer may reduce the diffusion of boron contained in the magnetization free layer 210, thus maintaining the amorphous structure of the magnetization free layer 210. The diffusion barrier layer may have an oxide material and a nitride material having, specifically, elements such as Mg, Al, Si, Ti, V, Cr, Mn, Fe, Co, Ni, Cu, Zn, Zr, Nb, Mo, Ru, Rh, Pd, Ag, Hf, Ta, W, Sn, Cd, or Ga. Here, the diffusion barrier layer is a layer that does not contribute to the magnetoresistive effect, and thus the diffusion barrier layer preferably has a lower area resistance. For example, it is preferable to set the area resistance of the diffusion barrier layer lower than the area resistance of the intermediate layer 203 that contributes to the magnetoresistive effect. In order to decrease the area resistance of the diffusion barrier layer, it is preferable that the diffusion barrier layer has oxide or nitride having a low barrier height, such as Mg, Ti, V, Zn, Sn, Cd, and Ga. In order to provide the function of reducing the boron diffusion, it is preferable that the diffusion barrier layer has oxide having stronger chemical bonding. For example, the diffusion barrier layer may have MgO of 1.5 nm. In addition, oxynitride may be regarded as oxide or nitride.

If the diffusion barrier layer has an oxide material or a nitride material, it is preferable that the diffusion barrier layer has a film thickness of 0.5 nm or more in order to sufficiently exert the function of reducing the boron diffusion, and 5 nm or less in order to reduce the area resistance. In other words, the diffusion barrier layer preferably has a film thickness not less than 0.5 nm and not more than 5 nm, more preferably, not less than 1 nm and not more than 3 nm.

The diffusion barrier layer may have at least any one selected from the group consisting of magnesium (Mg), silicon (Si), and aluminum (Al). The diffusion barrier layer may have a material having the above light elements. The above light elements couple with boron, generating chemical compounds. In a portion having the interface between the diffusion barrier layer and the magnetization free layer 210, at least any of, for example, an Mg—B chemical compound, an Al—B chemical compound, and a Si—B chemical compound are formed. These chemical compounds may reduce the boron diffusion.

Other metal layers or the like may be inserted between the diffusion barrier layer and the magnetization free layer 210. Note, however, that if there is too much distance between the diffusion barrier layer and the magnetization free layer 210, boron will be diffused therebetween, reducing the boron concentration in the magnetization free layer 210. Therefore, it is preferable that the distance between the diffusion barrier layer and the magnetization free layer 210 may be 10 nm or less, particularly, 3 nm or less.

Figure 11:
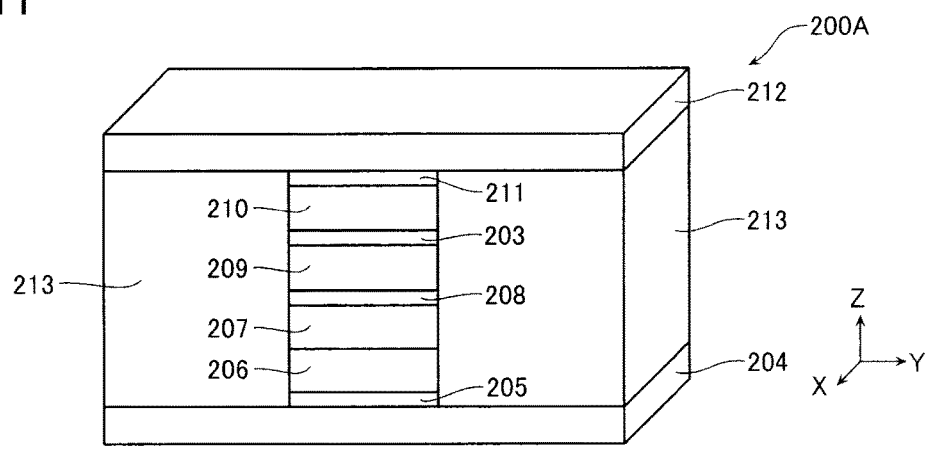
FIG. 11 is a schematic perspective view showing an example configuration of the strain detecting element.

FIG. 11 is a schematic perspective view showing an example configuration of the strain detecting element 200A. As illustrated in FIG. 11, the strain detecting element 200A may have an insulating layer (insulating portion) 213 filled between the bottom electrode 204 and the top electrode 212.

The insulating layer 213 may have, for example, aluminum oxide (for example, $Al_2O_3$), or silicon oxide (for example, $SiO_2$), or the like. The insulating layer 213 may reduce the leak current of the strain detecting element 200A.

Figure 12:
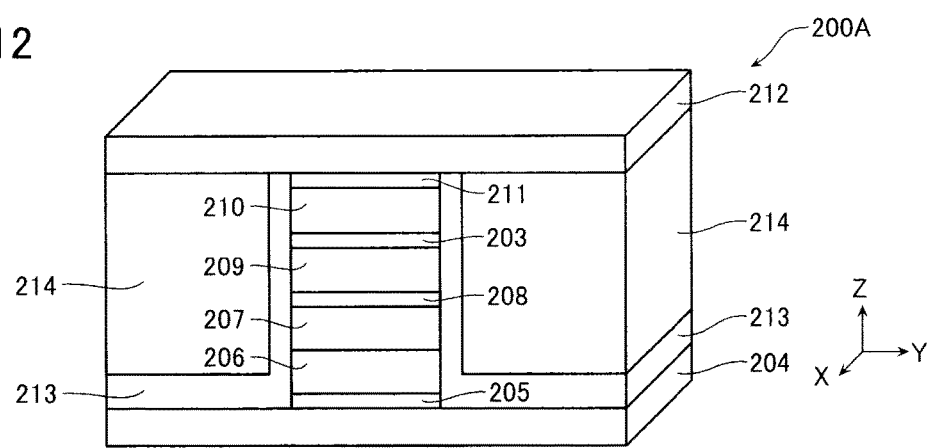
FIG. 12 is a schematic perspective view showing another example configuration of the strain detecting element.

FIG. 12 is a schematic perspective view showing another example configuration of the strain detecting element 200A. As illustrated in FIG. 12, the strain detecting element 200A may have, between the bottom electrode 204 and the top electrode 212, two hard bias layers (hard bias portions) 214 spaced apart from each other, and the insulating layer 213 filled between the bottom electrode 204 and the hard bias layer 214.

The hard bias layer 214 sets, by the magnetization of the hard bias layer 214, the magnetization direction of the magnetization free layer 210 (the first magnetic layer 201) to a desired direction. The hard bias layer 214 may set, with an external pressure not applied to the film portion, the magnetization direction of the magnetization free layer 210 (the first magnetic layer 201) to a desired direction.

The hard bias layer 214 has, for example, a hard magnetic material having relatively high magnetic anisotropy and coercivity such as Co—Pt, Fe—Pt, Co—Pd, or Fe—Pd. The hard bias layer 214 may also have an alloy that has an additive element and one of Co—Pt, Fe—Pt, Co—Pd, or Fe—Pd. The hard bias layer 214 may have, for example, CoPt (the ratio of Co is not less than 50 at. % and not more than 85 at. %), $(Co_xPt_{100-x})_{100-y}Cr_y$ (x is not less than 50 at. % and not more than 85 at. % and y is not less than 0 at. % and not more than 40 at. %), or FePt (the ratio of Pt is not less than 40 at. % and not more than 60 at. %) or the like. If the hard bias layer 214 has the above materials, the magnetization direction of the hard bias layer 214 may be set (fixed), by application of an external magnetic field larger than the coercivity of the hard bias layer 214, to the application direction of the external magnetic field. The hard bias layer 214 has a thickness (for example, a length along the direction from the bottom electrode 204 to the top electrode 212) of, for example, not less than 5 nm and not more than 50 nm.

If the insulating layer 213 is disposed between the bottom electrode 204 and the top electrode 212, the insulating layer 213 may have a material such as $SiO_x$ and $AlO_x$. In addition, a not-shown under layer may be provided between the insulating layer 213 and the hard bias layer 214. If the hard bias layer 214 has a hard magnetic material having relatively high magnetic anisotropy and coercivity such as Co—Pt, Fe—Pt, Co—Pd, or Fe—Pd, the under layer for the hard bias layer 214 may have a material such as Cr or Fe—Co. The above hard bias layer 214 may be applied to any strain sense device described below.

The hard bias layer 214 may have a structure in which the hard bias layer 214 is stacked on a not-shown pinning layer for the hard bias layer. In this case, the exchange coupling between the hard bias layer 214 and the pinning layer for the hard bias layer may set (fix) the magnetization direction of the hard bias layer 214. In this case, the hard bias layer 214 may have a ferromagnetic material that has at least any of Fe, Co, and Ni or has an alloy having at least one of them. In this case, the hard bias layer 214 may have, for example, a $Co_xFe_{100-x}$ alloy (x is not less than 0 at. % and not more than 100 at. %), an $Ni_xFe_{100-x}$ alloy (x is not less than 0 at. % and not more than 100 at. %), or any of these alloys added with a non-magnetic element. The hard bias layer 214 may have the same material as the above first magnetization fixed layer 209. In addition, the pinning layer for the hard bias layer may have the same material as the pinning layer 206 of the above strain sense device 200A. In addition, if the pinning layer for the hard bias layer is provided, an under layer having the same material as the under layer 205 may be provided under the pinning layer for the hard bias layer. In addition, the pinning layer for the hard bias layer may be provided under or on the hard bias layer. In this case, the magnetization direction of the hard bias layer 214 may be determined, likewise the pinning layer 206, by a heat treatment (annealing) in a magnetic field.

The above hard bias layer 214 and the insulating layer 213 may be applied to any strain sense devices 200 according to this embodiment. In addition, if the above stacked structure of the hard bias layer 214 and the pinning layer for the hard bias layer is used, the magnetization direction of the hard bias layer 214 may be easily maintained even if a large external magnetic field is instantaneously applied to the hard bias layer 214.

Figure 13:
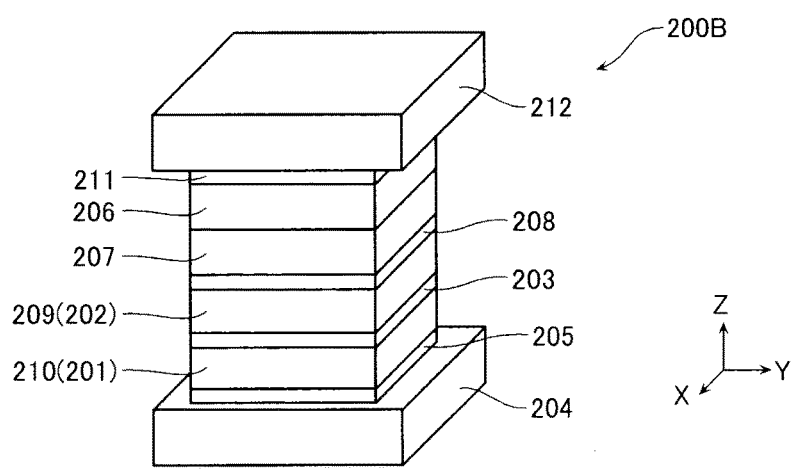
FIG. 13 is a schematic perspective view showing another example configuration of the strain detecting element.

FIG. 13 is a schematic perspective view showing another example configuration 200B of the strain detecting element 200. The strain detecting element 200B has, unlike the strain detecting element 200A, a top spin valve structure. Specifically, as shown in FIG. 13, the strain detecting element 200B has a sequential stack of the bottom electrode 204, the under layer 205, the magnetization free layer 210 (the first magnetic layer 201), the intermediate layer 203, the first magnetization fixed layer 209 (the second magnetic layer 202), the magnetic coupling layer 208, the second magnetization fixed layer 207, the pinning layer 206, the cap layer 211, and the top electrode 212. The first magnetization fixed layer 209 corresponds to the second magnetic layer 202. The magnetization free layer 210 corresponds to the first magnetic layer 201. In addition, the bottom electrode 204 is connected, for example, to the wiring line 131 (FIG. 1) and the electrode 212 is connected, for example, to the wiring line 133 (FIG. 1).

The under layer 205 has, for example, Ta/Cu. The Ta layer has a thickness (a length in the Z axis direction) of, for example, 3 nm. The Cu layer has a thickness of, for example, 5 nm. The magnetization free layer 210 has, for example, $Co_{40}Fe_{40}B_{20}$ of 4 nm thickness. The intermediate layer 203 has, for example, an MgO layer of 1.6 nm thickness. The first magnetization fixed layer 209 has, for example, $Co_{40}Fe_{40}B_{20}/Fe_{50}Co_{50}$. The $Co_{40}Fe_{40}B_{20}$ layer has a thickness of, for example, 2 nm. The $Fe_{50}Co_{50}$ layer has a thickness of, for example, 1 nm. The magnetic coupling layer 208 has, for example, an Ru layer of a 0.9 nm thickness. The second magnetization fixed layer 207 has, for example, a $Co_{75}Fe_{25}$ layer of 2.5 nm thickness. The pinning layer 206 has, for example, an IrMn layer of a 7 nm thickness. The cap layer 211 has, for example, Ta/Ru. The Ta layer has a thickness of, for example, 1 nm. The Ru layer has a thickness of, for example, 5 nm.

In the above strain sense device 200A of a bottom spin valve type, the first magnetization fixed layer 209 (the second magnetic layer 202) is formed under (in the −Z axis direction) the magnetization free layer 210 (the first magnetic layer 201). In contrast, in the strain detecting element 200B of a top spin valve type, the first magnetization fixed layer 209 (the second magnetic layer 202) is formed on (in the +Z axis direction) the magnetization free layer 210 (the first magnetic layer 201). Therefore, the materials of the layers included in the strain sense device 200B may be a horizontal inversion of the materials of the layers included in the strain detecting element 200A. In addition, the above diffusion barrier layer may be provided between the under layer 205 and the magnetization free layer 210 of the strain sense device 200B.

Figure 14:
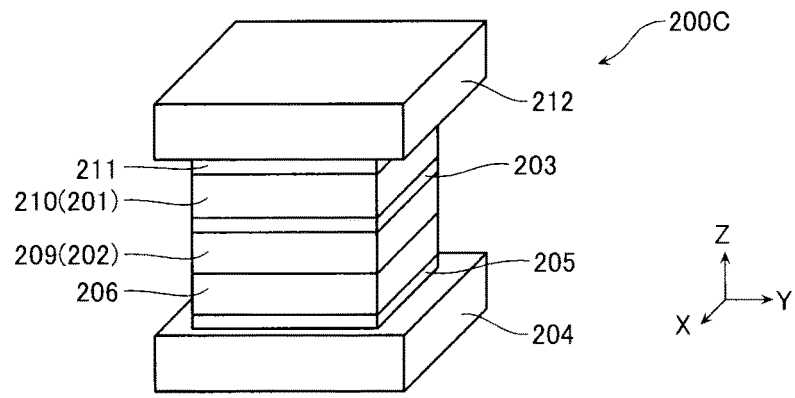
FIG. 14 is a schematic perspective view showing another example configuration of the strain detecting element.

FIG. 14 is a schematic perspective view showing another example configuration 200C of the strain detecting element 200. The strain detecting element 200C has a single pin structure having a single magnetization fixed layer. Specifically, as shown in FIG. 14, the strain detecting element 200C has a sequential stack of the bottom electrode 204, the under layer 205, the pinning layer 206, the first magnetization fixed layer 209 (the second magnetic layer 202), an intermediate layer 203, the magnetization free layer 210 (the first magnetic layer 201), and the cap layer 211. The first magnetization fixed layer 209 corresponds to the second magnetic layer 202. The magnetization free layer 210 corresponds to the first magnetic layer 201. In addition, the bottom electrode 204 is connected, for example, to the wiring line 131 (FIG. 1) and the top electrode 212 is connected, for example, to the wiring line 133 (FIG. 1).

The under layer 205 has, for example, Ta/Ru. The Ta layer has a thickness (a length in the Z axis direction) of, for example, 3 nm. The Ru layer has a thickness of, for example, 2 nm. The pinning layer 206 has, for example, an IrMn layer of a 7 nm thickness. The first magnetization fixed layer 209 has, for example, a $Co_{40}Fe_{40}B_{20}$ layer of 3 nm thickness. The intermediate layer 203 has, for example, an MgO layer of 1.6 nm thickness. The magnetization free layer 210 has, for example, $Co_{40}Fe_{40}B_{20}$ of 4 nm thickness. The cap layer 211 has, for example, Ta/Ru. Ta layer has a thickness of, for example, 1 nm. The Ru layer has a thickness of, for example, 5 nm.

The layers of the strain detecting element 200C may have similar materials to the respective layers of the strain detecting element 200A.

Figure 15:
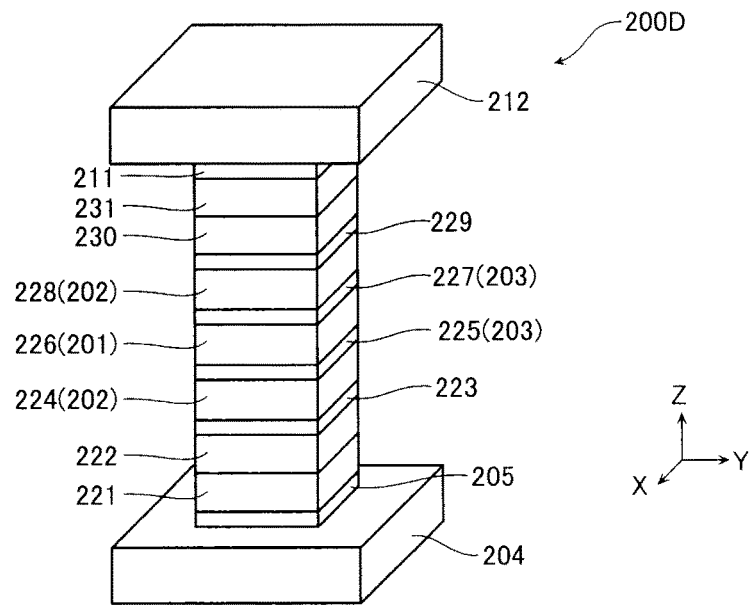
FIG. 15 is a schematic perspective view showing another example configuration of the strain detecting element.

FIG. 15 is a schematic perspective view showing another example configuration 200D of the strain detecting element 200. As shown in FIG. 15, the strain detecting element 200D has a sequential stack of the bottom electrode 204, the under layer 205, a lower pinning layer 221, a second lower magnetization fixed layer 222, a lower magnetic coupling layer 223, a first lower magnetization fixed layer 224, a lower intermediate layer 225, a magnetization free layer 226, an upper intermediate layer 227, a first upper magnetization fixed layer 228, an upper magnetic coupling layer 229, a second upper magnetization fixed layer 230, an upper pinning layer 231, and the cap layer 211. The first lower magnetization fixed layer 224 and the first upper magnetization fixed layer 228 correspond to the second magnetic layer 202. The magnetization free layer 226 corresponds to the first magnetic layer 201. In addition, the bottom electrode 204 is connected, for example, to the wiring line 131 (FIG. 1) and the top electrode 212 is connected, for example, to the wiring line 133 (FIG. 1).

The under layer 205 has, for example, Ta/Ru. The Ta layer has a thickness (a length in the Z axis direction) of, for example, 3 nanometer (nm). The Ru layer has a thickness of, for example, 2 nm. The lower pinning layer 221 has, for example, an IrMn layer of a 7 nm thickness. The second lower magnetization fixed layer 222 has, for example, a $Co_{75}Fe_{25}$ layer of 2.5 nm thickness. The lower magnetic coupling layer 223 has, for example, an Ru layer of a 0.9 nm thickness. The first lower magnetization fixed layer 224 has, for example, a $Co_{40}Fe_{40}B_{20}$ layer of 3 nm thickness. The lower intermediate layer 225 has, for example, an MgO layer of 1.6 nm thickness. The magnetization free layer 226 has, for example, $Co_{40}Fe_{40}B_{20}$ of 4 nm thickness. The upper intermediate layer 227 has, for example, an MgO layer of 1.6 nm thickness. The first upper magnetization fixed layer 228 has, for example, $Co_{40}Fe_{40}B_{20}/Fe_{50}Co_{50}$. The $Co_{40}Fe_{40}B_{20}$ layer has a thickness of, for example, 2 nm. The $Fe_{50}Co_{50}$ layer has a thickness of, for example, 1 nm. The upper magnetic coupling layer 229 has, for example, an Ru layer of a 0.9 nm thickness. The second upper magnetization fixed layer 230 has, for example, a $Co_{75}Fe_{25}$ layer of 2.5 nm thickness. The upper pinning layer 231 has, for example, an IrMn layer of a 7 nm thickness. The cap layer 211 has, for example, Ta/Ru. The Ta layer has a thickness of, for example, 1 nm. The Ru layer has a thickness of, for example, 5 nm.

The layers of the strain detecting element 200D may have similar materials to the respective layers of the strain detecting element 200A.

Figure 16:
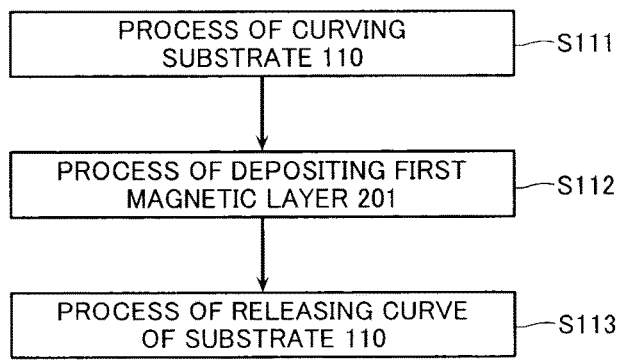
FIG. 16 is a schematic flowchart showing a method of manufacturing the pressure sensor.

Next, with reference to FIG. 16 and FIGS. 17A, 17B, 17C, 17D, 17E and 17F, the method of manufacturing the pressure sensor 100A according to this embodiment will be outlined. FIG. 16 is a flowchart showing some of the method of manufacturing the pressure sensor 100A according to this embodiment. FIGS. 17A, 17B, 17C, 17D, 17E and 17F are schematic side views for illustrating the method of manufacturing the pressure sensor 100A according to this embodiment. Note that FIGS. 17A, 17B, 17C, 17D, 17E and 17F show examples where the substrate 110 is bended in the X direction around a predetermined line extending in the Y direction.

As shown in FIG. 16, the method of manufacturing the pressure sensor 100A according to this embodiment has the process of bending the substrate 110 (step S111), the process of depositing the first magnetic layer 201 with the substrate 110 bended (step S112), and the process of releasing the bend of the substrate 110 (step S113).

Figure 17A:
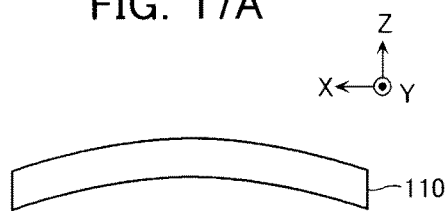
FIGS. 17A, 17B, 17C, 17D, 17E and 17F are schematic cross-sectional views showing the manufacturing method.
Figure 17D:
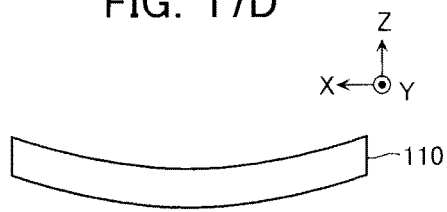
Figure 17B:
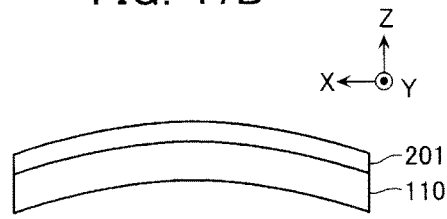

For example, in the manufacturing method according to this embodiment, as shown in FIG. 17A, step S111 may convexly bend the substrate 110, and as shown in FIG. 17B, step S112 may deposit the first magnetic layer 201. In this case, the first magnetic layer 201 experiences little stress with the substrate 110 convexly bended. Therefore, as shown in FIG. 17C, if step S113 releases the bend of the substrate 110, the first magnetic layer 201 experiences compressive strain in the X direction due to the internal stress.

Figure 17E:
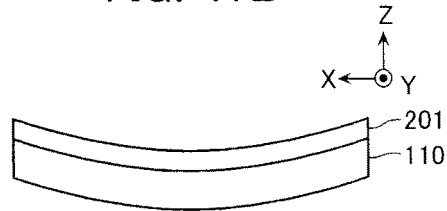
Figure 17C:
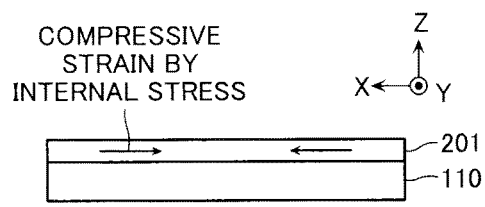
Figure 17F:
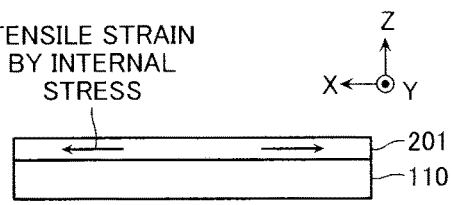

In addition, in the manufacturing method according to this embodiment, as shown in FIG. 17D, step S111 may concavely bend the substrate 110, and as shown in FIG. 17E, step S112 may deposit the first magnetic layer 201, for example. In this case, the first magnetic layer 201 experiences little stress with the substrate 110 concavely bended. Therefore, as shown in FIG. 17F, if step S113 releases the bend of the substrate 110, the first magnetic layer 201 experiences tensile strain in the X direction due to the internal stress.

Therefore, the manufacturing method according to this embodiment may freely adjust the strain due to the internal stress of the first magnetic layer 201, which may adjust the initial magnetization direction of the first magnetic layer 201. This may freely adjust the range of strain that is sensed by the strain sense device 200, and thus may provide the strain sense device 200 that shows high strain sensitivity in the strain detection range necessary for a device mounting the strain sense device 200.

Next, with reference to FIG. 18 to FIG. 23, modes of bending the substrate 110 will be described. FIG. 18 to FIG. 23 are schematic plan views for illustrating the modes of bending the substrate 110. Note that FIG. 18 to FIG. 23 illustrate examples where the first magnetic layer 201 has a magnetic material having a positive magnetostriction constant.

As described with reference to FIG. 7B, the initial magnetization direction of the first magnetic layer 201 according to this embodiment has an angle larger than 0° and smaller than 180° with respect to the magnetization direction of the second magnetic layer 202. In addition, the initial magnetization direction of the first magnetic layer 201 has an angle larger than 0° and smaller than 90° with respect to the direction of the strain to be detected. Specifically, the process of bending the substrate 110 (step S111 in FIG. 16) is performed to meet such a condition.

Figure 18:
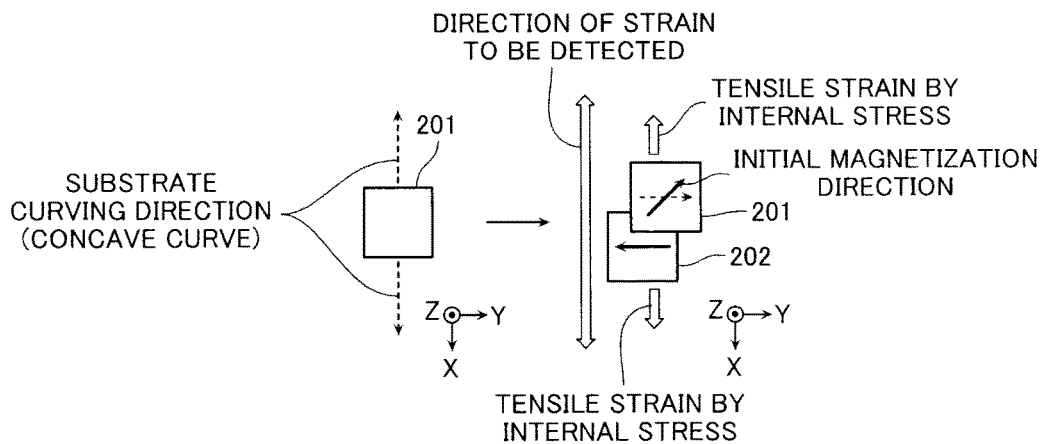
FIG. 18 is a schematic plan view for illustrating the manufacturing method.

For example, as shown in FIG. 18, if the magnetization direction of the second magnetic layer 202 is in the −Y direction and the direction of the strain to be detected is in the X direction, the substrate 110 may be concavely bended in the X direction around a predetermined line extending in the Y direction. Thus, the first magnetic layer 201 experiences tensile strain due to the internal stress in the X direction. Therefore, the initial magnetization direction of the first magnetic layer 201 is directed toward the X direction by the strain due to the internal stress and directed toward the Y direction by the induced magnetic anisotropy due to the annealing in the magnetic field parallel to the magnetization of the second magnetic layer 202. As a result, the initial magnetization direction of the first magnetic layer 201 is adjusted to meet the above condition.

Note that in the example shown in FIG. 18, as the bend of the substrate 110 is larger (as the curvature radius is smaller, or, as the strain of the substrate surface is larger), the contribution from the strain to the initial magnetization direction of the first magnetic layer 201 increases, thus approximating the initial magnetization direction to the −X direction. Therefore, the curvature radius at which the substrate 110 is bended may be adjusted to freely adjust the initial magnetization direction of the first magnetic layer 201.

Figure 19:
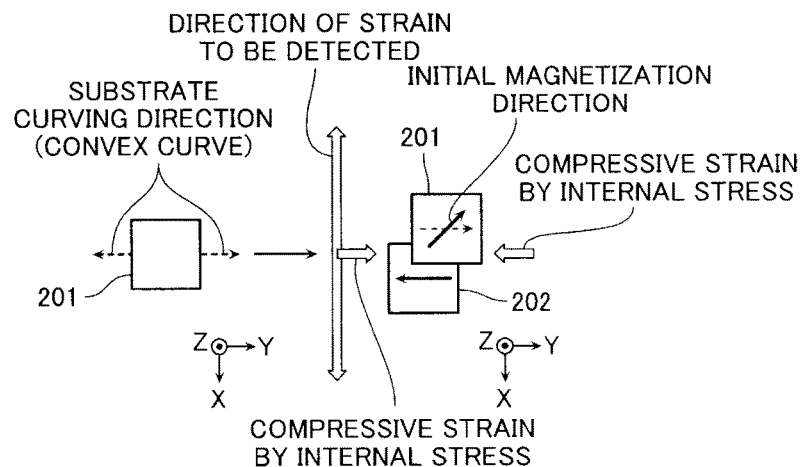
FIG. 19 is a schematic plan view for illustrating the manufacturing method.

In addition, as shown in FIG. 19, the substrate 110 may be convexly bended in the Y direction around a predetermined line extending in the X direction. Thus, the first magnetic layer 201 experiences compressive strain due to the internal stress in the Y direction. Therefore, the initial magnetization direction of the first magnetic layer 201 is directed toward the X direction by the strain due to the internal stress, and directed toward the Y direction by the induced magnetic anisotropy due to the annealing in the magnetic field parallel to the magnetization of the second magnetic layer 202. As a result, the initial magnetization direction of the first magnetic layer 201 is adjusted to meet the above condition. Note that also in the example shown in FIG. 19, as the bend of the substrate 110 is larger (as the curvature radius is smaller, or, as the strain of the substrate surface is larger), the contribution from the strain to the initial magnetization direction of the first magnetic layer 201 increases, thus approximating the initial magnetization direction to the −X direction.

Figure 20:
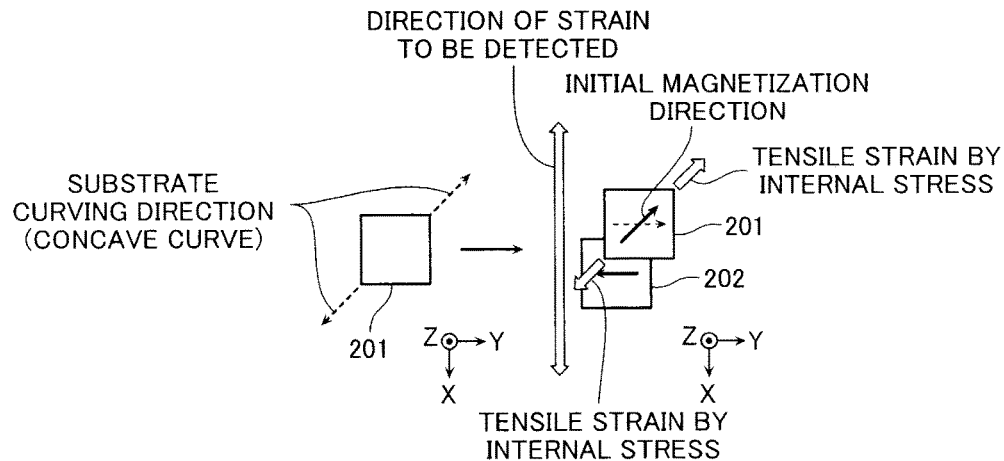
FIG. 20 is a schematic plan view for illustrating the manufacturing method.

In addition, as shown in FIG. 20, the substrate 110 may be concavely bended in the direction extending in the (X, −Y) and (−X, Y) directions around a predetermined line extending in the (X, Y) and (−X, −Y) directions. Thus, the first magnetic layer 201 experiences tensile strain due to the internal stress in the (X, −Y) and (−X, Y) directions. Therefore, the initial magnetization direction of the first magnetic layer 201 is directed toward the X direction by the strain due to the internal stress and directed toward the Y direction by the induced magnetic anisotropy due to the annealing in the magnetic field parallel to the magnetization of the second magnetic layer 202. As a result, the initial magnetization direction of the first magnetic layer 201 is adjusted to meet the above condition.

Figure 21:
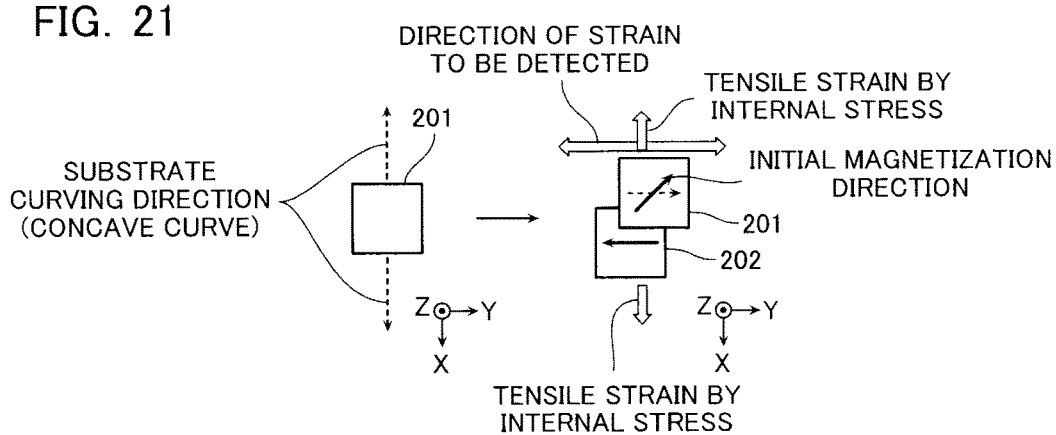
FIG. 21 is a schematic plan view for illustrating the manufacturing method.
Figure 22:
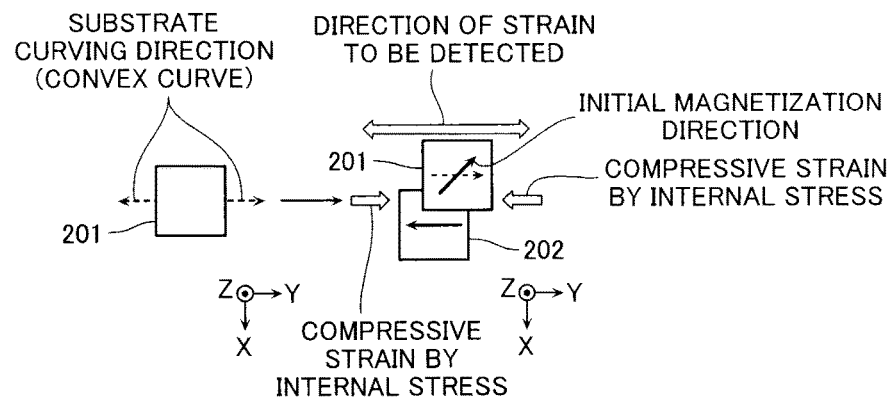
FIG. 22 is a schematic plan view for illustrating the manufacturing method.
Figure 23:
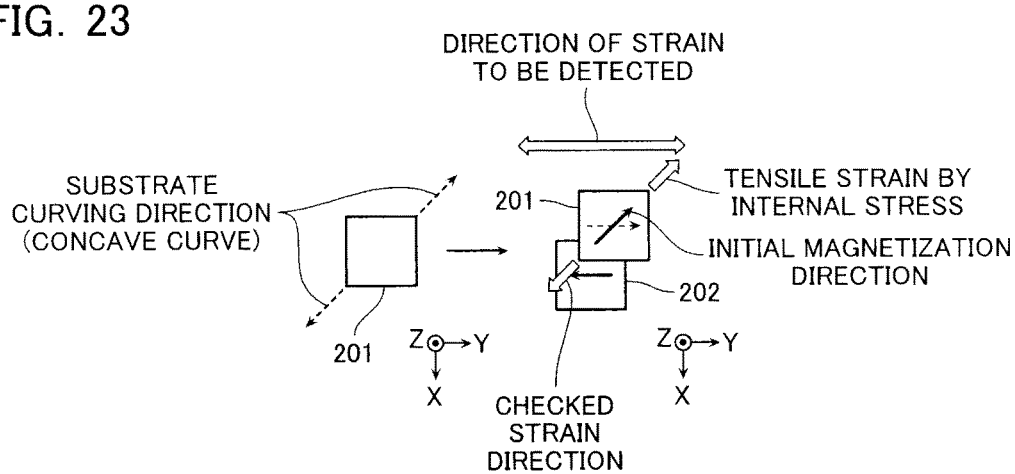
FIG. 23 is a schematic plan view for illustrating the manufacturing method.

Note that, as shown in FIG. 21 to FIG. 23, even if, for example, the magnetization direction of the second magnetic layer 202 is in the −Y direction and the direction of the strain to be detected is in the Y direction, the substrate 110 may be bended according to a similar mode, thus adjusting the initial magnetization direction of the first magnetic layer 201 to meet the above condition. Note that the direction of the initial magnetization may be set in a way that is not limited to the specific examples shown in FIG. 18 to FIG. 23 and that may be adjusted as appropriate in respond to the device requirements.

Figure 24:
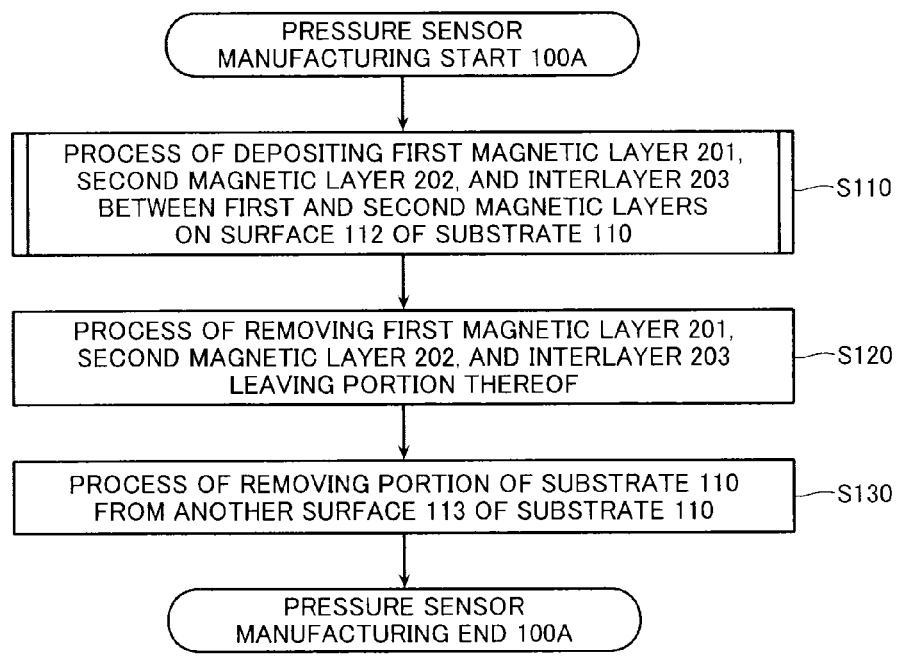
FIG. 24 is a flowchart showing the manufacturing method.

Next, with reference to FIG. 24 and FIGS. 25A, 25B, 25C, 25D and 25E, the method of manufacturing the pressure sensor 100A according to this embodiment will be described in more detail. FIG. 24 is a flowchart showing some of the method of manufacturing the pressure sensor 100A. FIGS. 25A, 25B, 25C, 25D and 25E are schematic perspective views showing the manufacturing method.

As shown in FIG. 24, the method of manufacturing a pressure sensor according to this embodiment includes the process of depositing the first magnetic layer 201, the second magnetic layer 202, and the intermediate layer 203 between the first and second magnetic layers 201 and 202 on one surface of a substrate (step S110), the process of removing the first magnetic layer 201, the second magnetic layer 202, and the intermediate layer 203 leaving a portion thereof (step S120), and the process of removing a portion of the substrate 110 from another surface 113 of the substrate 110 (step S130).

Figure 25A:
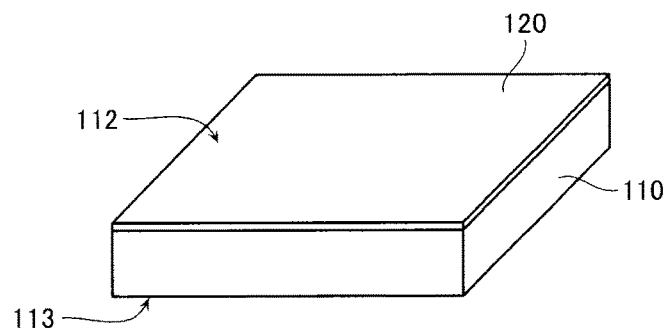
FIGS. 25A, 25B, 25C, 25D and 25E are schematic perspective views showing the manufacturing method.

Specifically, in the method of manufacturing the pressure sensor 100A according to this embodiment, as shown in FIG. 25A, the film portion 120 is formed on one surface 112 of the substrate 110. If, for example, the substrate 110 is a Si substrate, the film portion 120 may be deposited by sputtering an SiOx/a-Si thin film.

Note that if, for example, the substrate 110 has a Silicon On Insulator (SOI) substrate, a stacked film of $SiO_2$/Si on the Si substrate may be used as the film portion 120. In this case, the film portion 120 is formed by bonding the Si substrate and the stacked film of $SiO_2$/Si.

Figure 25B:
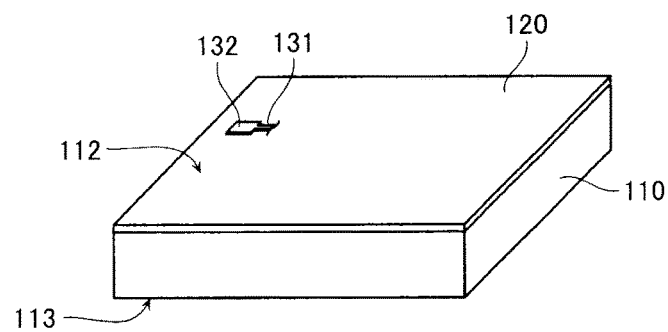

Next, as shown in FIG. 25B, the wiring line portion 131 and the pad 132 are formed on the one surface 112 of the substrate 110. Specifically, an electrically conductive film that provides the wiring line portion 131 and the pad 132 is deposited and the electrically conductive film is removed leaving a portion thereof. The present process may include photolithography and etching, or lift off.

In addition, the periphery of the wiring line portion 131 and the pad 132 may be embedded with a not-shown insulating film. In this case, lift off may be used, for example. The lift off is performed by, for example, depositing, after etching the pattern of the wiring line portion 131 and the pad 132 and before stripping the resist, a not-shown insulating film on the entire surface, and then removing the resist.

Figure 25C:
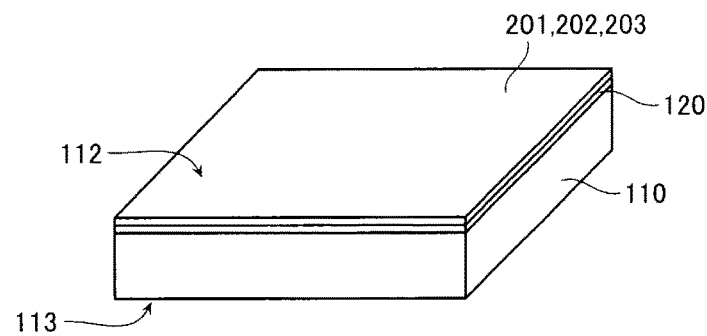

Next, as shown in FIG. 25C, on the one surface 112 of the substrate 110, the first magnetic layer 201, the second magnetic layer 202, and the intermediate layer 203 positioned between the first and second magnetic layers 201 and 202 are deposited (step S110). Note that the deposition of the first magnetic layer 201 is performed with the substrate 110 bended, as described above.

Figure 25D:
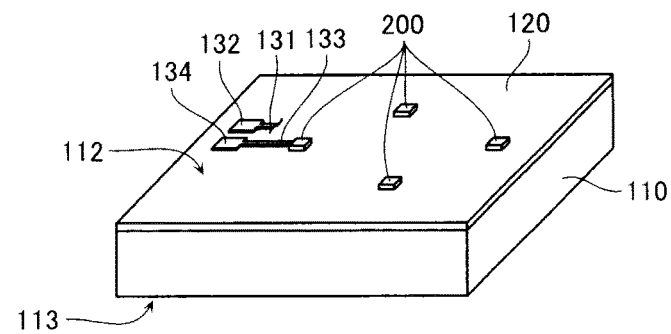

Next, as shown in FIG. 25D, the first magnetic layer 201, the second magnetic layer 202, and the intermediate layer 203 are removed leaving a portion thereof (step S120), thus forming the strain detecting element 200. The present process may include photolithography and etching, or lift off.

In addition, the periphery of the strain detecting element 200 may be embedded with a not-shown insulating film. In this case, lift off may be used, for example. The lift off is performed by, for example, depositing, after etching the pattern of the strain detecting element 200 and before stripping the resist, a not-shown insulating film on the entire surface, and then removing the resist.

Next, as shown in FIG. 25D, the wiring line portion 133 and the pad 134 are formed on the one surface 112 of the substrate 110. Specifically, an electrically conductive film that provides the wiring line portion 133 and the pad 134 is deposited and the electrically conductive film is removed leaving a portion thereof. The present process may include photolithography and etching, or lift off.

In addition, the periphery of the wiring line portion 133 and the pad 134 may be embedded with a not-shown insulating film. In this case, lift off may be used, for example. The lift off is performed by, for example, depositing, after etching the pattern of the wiring line portion 133 and the pad 134 and before stripping the resist, a not-shown insulating film on the entire surface, and then removing the resist.

Figure 25E:
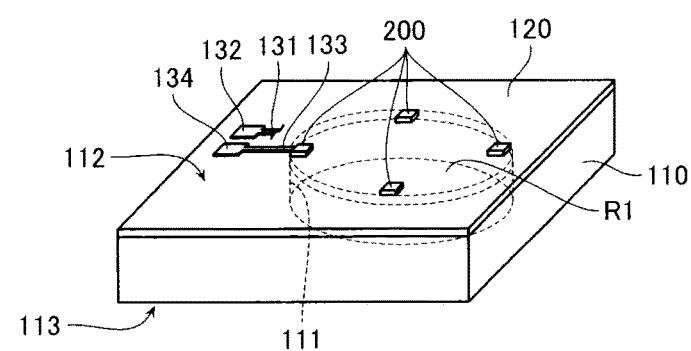

Next, as shown in FIG. 25E, a portion of the substrate 110 is removed from another surface 113 of the substrate 110 to form the cavity portion 111 in the substrate 110 (step S130).

Step S130 removes a region corresponding to the first region R1 of the substrate 110. Note that although this embodiment removes all portions of the substrate 110 that are within the first region R1, a portion of the substrate 110 may be left. For example, if the film portion 120 and the substrate 110 are formed integrally, step S130 may remove a portion of the substrate 110 to thin it and the thinned portion may provide the film portion 120.

In this embodiment, step S130 includes etching. If, for example, the film portion 120 is a stacked film of $SiO_2$/a-Si, the present process may be performed by digging the another surface 113 of the substrate 110. In addition, the present process may be performed using a double-sided aligner exposing device. Thus, according to the position of the strain detecting element 200, the hole pattern in the resist may be patterned on the another surface 113.

In addition, the etching in step S130 may include, for example, the Bosch process using RIE. The Bosch process repeats, for example, an etching process using an $SF_6$ gas and a deposition process using a $C_4F_8$ gas. Thus, selective etching is performed in the depth direction (Z axis direction) of the substrate 110, while reducing the etching of the side wall of the substrate 110. An endpoint of the etching includes, for example, an SiOx layer. Specifically, the etching is ended using an SiOx layer having a different etching selection ratio from the Si layer. The SiOx layer that functions as the etching stopper layer may also be used as a portion of the film portion 110. After etching, the SiOx layer may be removed, for example, by processes such as anhydrous hydrofluoric acid and alcohol or the like. The etching of the substrate 110 may include, in addition to the Bosch process, anisotropic wet etching or etching using a sacrificing layer.

Figure 26:
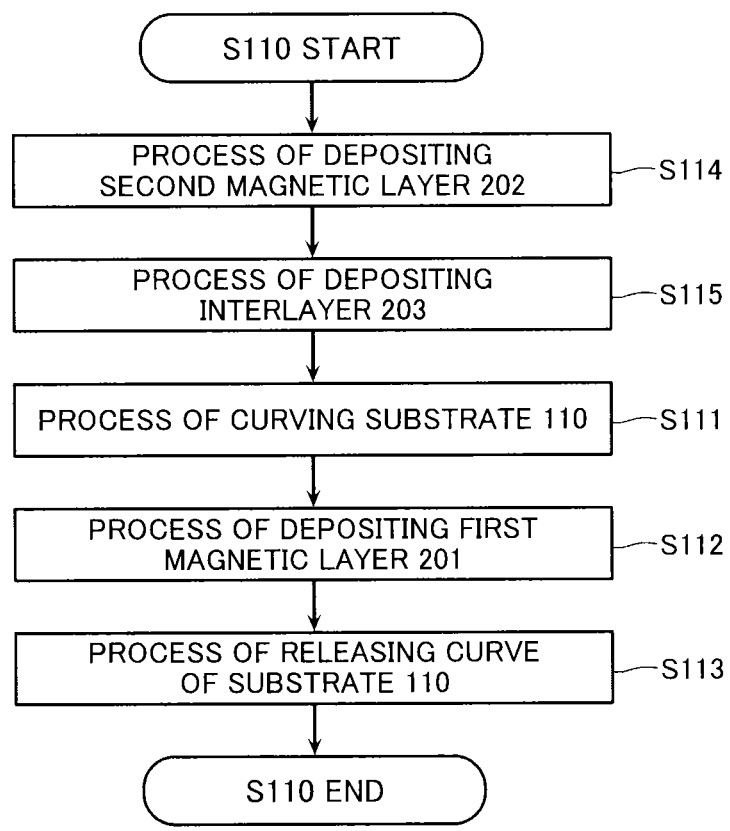
FIG. 26 is a schematic flowchart showing the manufacturing method.

Next, with reference to FIG. 26, FIGS. 27A, 27B, 27C, 27D, 27E, 27F, 27G, 27H, 27I, 27J, 27K, 27L, 27M, 27N and 27O, some processes of the method of manufacturing the pressure sensor 100A according to this embodiment will be described in more detail. FIG. 26 is a schematic flowchart for illustrating an example of the processes. FIGS. 27A, 27B, 27C, 27D, 27E, 27F, 27G, 27H, 27I, 27J, 27K, 27L, 27M, 27N and 27O are schematic cross-sectional views showing the manufacture of, for example, the strain detecting element 200A shown in FIG. 12 by the manufacturing method according to this embodiment.

In the example shown in FIG. 26, step S110 includes the process of depositing the second magnetic layer 202 (step S114), the process of depositing the intermediate layer 203 (step S115), the process of bending the substrate 110 (step S111), the process of depositing the first magnetic layer 201 (step S112), and the process of releasing the bend of the substrate 110 (step S113).

Figure 27A:
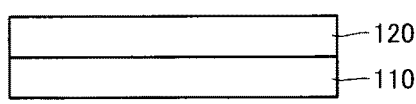
FIGS. 27A, 27B, 27C, 27D, 27E, 27F, 27G, 27H, 27I, 27J, 27K, 27L, 27M, 27N and 27O are schematic cross-sectional views showing an example of a method of manufacturing the strain detecting element.
Figure 27B:
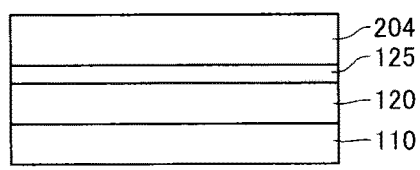

FIG. 27A is an enlarged cross-sectional view of a portion of the configuration shown in FIG. 25B. Note, however, that FIG. 27A omits the wiring line 131 and the pad 132. As shown in FIG. 27B, the insulating layer 125 and the bottom electrode 204 are formed on the film portion 120. For example, as the insulating layer 125, SiOx (80 nm) is formed. For example, as the bottom electrode 204, Ta (5 nm)/Cu (200 nm)/Ta (35 nm) is formed. Then, the top surface of the bottom electrode 204 may be subjected to a surface smoothing process such as the CMP process to smooth the configuration formed on the bottom electrode. Here, if the top surface of the film portion 120 has an insulating material, the insulating layer 125 need not necessarily be formed.

Figure 27C:
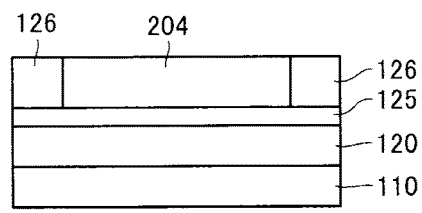

Next, as shown in FIG. 27C, the plane shape of the bottom electrode 204 is processed. This process patterns the resist by photolithography and then performs physical milling or chemical milling using a not-shown resist pattern as the mask. For example, an Ar ion milling is performed. Further, the periphery of the bottom electrode 204 is embedded and deposited with the insulating layer 126. The process includes, for example, the lift off process. For example, with the resist pattern formed by photolithography being left, the insulating layer 126 is deposited on the entire surface and then the resist pattern is removed. The insulating layer 126 may have, for example, SiOx, AlOx, SiNx, AlNx, and the like.

Figure 27D:
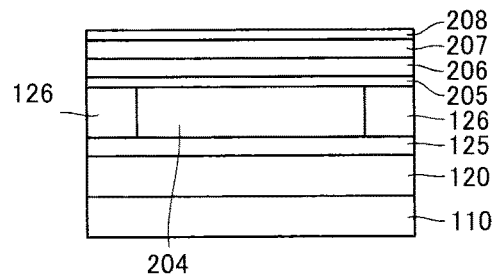

Next, as shown in FIG. 27D, the under layer 205, the pinning layer 206, the second magnetization fixed layer 207, and the magnetic coupling layer 208 are sequentially stacked on the bottom electrode 204. For example, as the under layer 205, Ta (3 nm)/Ru (2 nm) is formed. On the under layer 205, as the pinning layer 206, IrMn (7 nm) is formed. On IrMn, as the second magnetization fixed layer 207/the magnetic coupling layer 208, $Co_{75}Fe_{25}$ (2.5 nm)/Ru (0.9 nm) is formed.

Figure 27E:
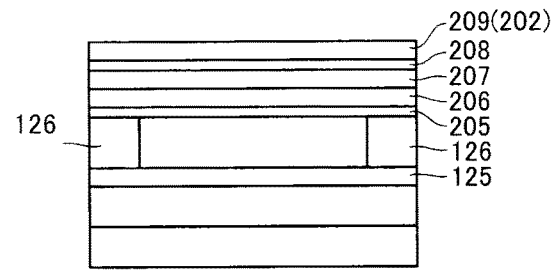

As shown in FIG. 27E, step S114 stacks the first magnetization fixed layer 209 (the second magnetic layer 202) on the magnetic coupling layer 208. For example, as the first magnetization fixed layer (the second magnetic layer), $CO_{75}Fe_{25}$ (2.5 nm)/Ru (0.9 nm)/$Co_{40}Fe_{40}B_{20}$ (4 nm) is formed.

Figure 27F:
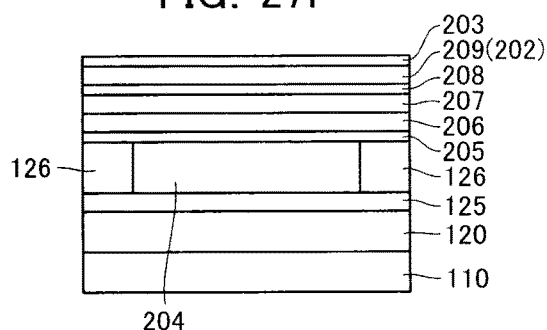

As shown in FIG. 27F, step S115 stacks the intermediate layer 203 on the first magnetization fixed layer 209 (the second magnetic layer 202). For example, as the intermediate layer 203, MgO (1.6 nm) is formed.

Figure 27G:
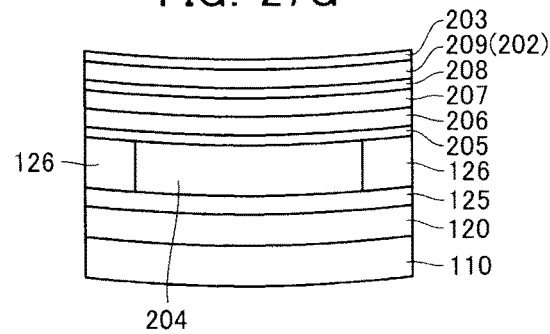
Figure 27H:
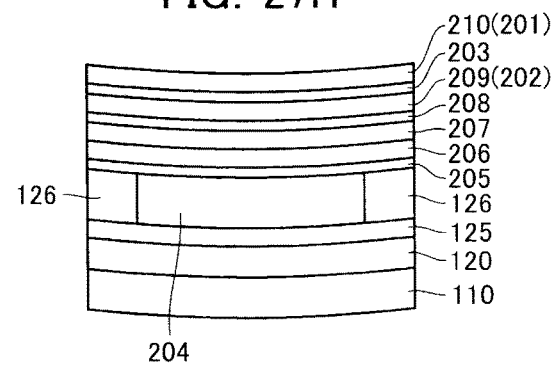
Figure 27I:
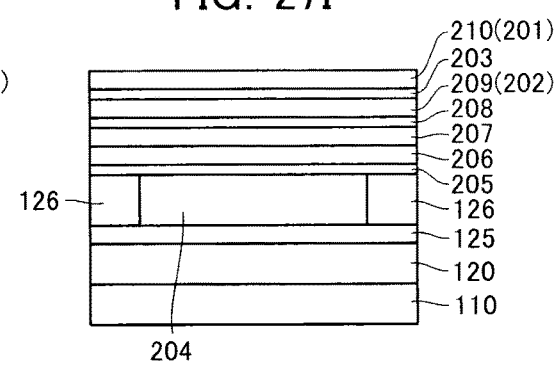

As shown in FIG. 27G, step S111 bends the substrate 110. As shown in FIG. 27H, step S112 stacks, with the substrate 110 bended, the magnetization free layer 210 (the first magnetic layer 201) on the intermediate layer 203. For example, as the magnetization free layer 210, $Co_{40}Fe_{40}B_{20}$ (4 nm) is formed. As shown in FIG. 27I, step S113 releases the bend of the substrate 110.

Figure 27J:
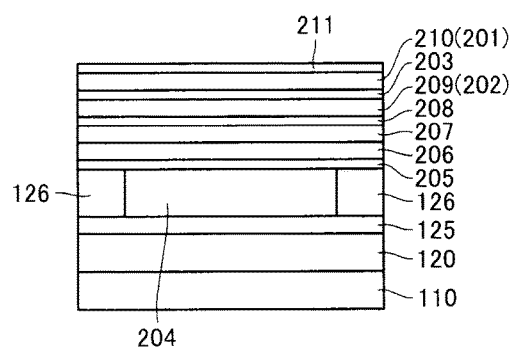

As shown in Next, FIG. 27J, on the magnetization free layer 210, the cap layer 211 is stacked. For example, as the cap layer 211, Cu (3 nm)/Ta (2 nm)/Ru (10 nm) is formed. Note that as a not-shown diffusion barrier layer, MgO (1.5 nm) may be formed between the magnetization free layer 210 and the cap layer 211.

Figure 27M:
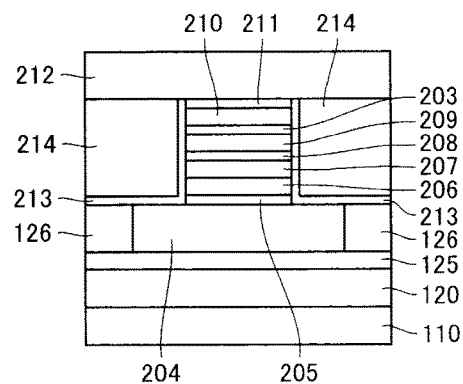
Figure 27K:
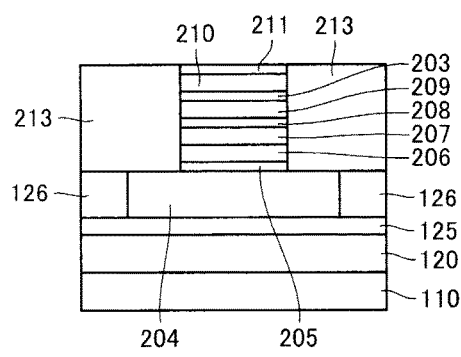

As shown in FIG. 27K, step S120 (FIG. 24) removes the under layer 205, the pinning layer 206, the second magnetization fixed layer 207, the magnetic coupling layer 208, the first magnetization fixed layer 209 (the second magnetic layer 202), the intermediate layer 203, the magnetization free layer 210 (the first magnetic layer 201), and the cap layer 211, leaving a portion thereof. This process patterns the resist by photolithography and then performs physical milling or chemical milling using a not-shown resist pattern as the mask. For example, the Ar ion milling is performed.

Next, the periphery of the stack including the first magnetic layer 201 is embedded and deposited with the insulating layer 213. The process includes, for example, the lift off process. For example, with the resist pattern formed by photolithography being left, the insulating layer 213 is deposited on the entire surface, and then the resist pattern is removed. The insulating layer 213 may include, for example, materials such as SiOx, AlOx, SiNx, and AlNx.

Next, the magnetic field annealing is performed to fix the magnetization direction of the first magnetization fixed layer 209 (the second magnetic layer 202). For example, one hour annealing is performed at 300° C. under application of an external magnetic field of 7 kOe. Here, the magnetic field annealing may be performed at any timing after the process of forming the stack including the second magnetic layer 202 in FIG. 27E.

Figure 27N:
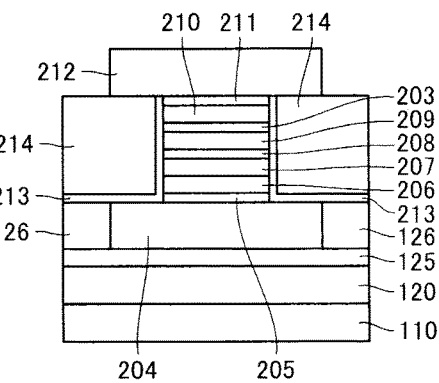
Figure 27L:
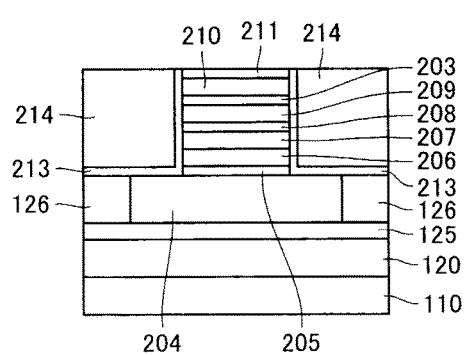

Next, as shown in FIG. 27L, the insulating layer 213 is embedded with the hard bias layer 214. For example, a hole is formed in the insulating layer 213 to be embedded with the hard bias layer 214. This process patterns the resist by photolithography and then performs physical milling or chemical milling using a not-shown resist pattern as the mask. In this process, the hole forming may be performed until it passes through the peripheral insulating layer 213 or may be stopped on the way. FIG. 27L illustrates an example where the hole forming is stopped on the way not to pass through the insulating layer 213. If the hole is etched through the insulating layer 213, the process of embedding the hard bias layer 214 shown in FIG. 27L requires deposition of a not-shown insulating layer under the hard bias layer 214.

Next, the formed hole is embedded with the hard bias layer 214. The process includes, for example, the lift off process. For example, with the resist pattern formed by photolithography being left, the hard bias layer 214 is deposited on the entire surface, and then the resist pattern is removed. Here, for example, Cr (5 nm) is formed as an under layer for the hard bias layer, and for example, $Co_{80}Pt_{20}$ (20 nm) is formed thereon as the hard bias layer 214. On the hard bias layer 214, a not-shown cap layer may be further formed. The cap layer may have the above materials that are described as the materials available as the cap layer of the strain sense device 200A or have insulating layers such as SiOx, AlOx, SiNx, and AlNx.

Next, an external magnetic field is applied at ambient temperature to set the magnetization direction of the hard magnetic materials included in the hard bias layer 214. The magnetization direction of the hard bias layer 214 may be set by the external magnetic field at any timing after the hard bias layer 214 is embedded.

Note that the embedding process of the hard bias layer 214 shown in FIG. 27L may be performed at the same time as the embedding process of the insulating layer 213 shown in FIG. 27K. In addition, the embedding process of the hard bias layer 214 shown in FIG. 27K may not necessarily be performed.

Next, as shown in FIG. 27M, the top electrode 212 is stacked on the cap layer 211. Next, as shown in FIG. 27N, the top electrode 212 is removed leaving a portion thereof. This process patterns a resist by photolithography and then performs physical milling or chemical milling using a not-shown resist pattern as the mask.

Figure 27O:
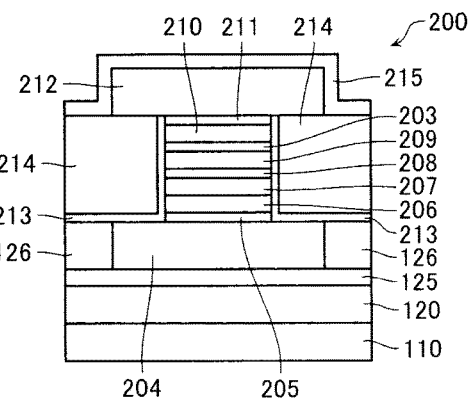

Next, as shown in FIG. 27O, the protection layer 215 is deposited to cover the top electrode 212 and the hard bias 214. For example, the protection layer 215 may have insulating layers such as SiOx, AlOx, SiNx, and AlNx. Note that the protection layer 215 may not necessarily be provided.

The above method includes step S115 of depositing the intermediate layer 203 followed by step S111 of bending the substrate 110, and thus the first magnetic layer 201 may be efficiently provided with strain. Note that although not shown in FIG. 27A to FIG. 27O, contact holes may be formed to the bottom electrode 204 and the top electrode 212.

Figure 28:
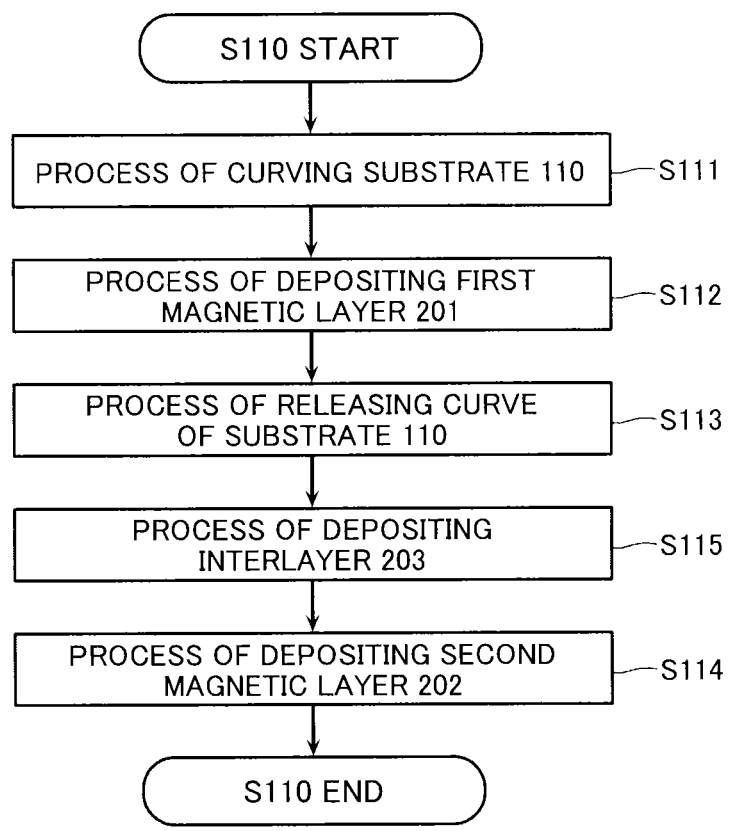
FIG. 28 is a schematic flowchart showing a method of manufacturing another strain detecting element according to the embodiment.

Next, another mode of step S110 will be described. FIG. 28 is a schematic flowchart for illustrating the another mode of step S110. In the example shown in FIG. 28, the first magnetic layer 201 is deposited before the second magnetic layer 202.

Specifically, in the example shown in FIG. 28, step S110 includes the process of bending the substrate 110 (step S111), the process of depositing the first magnetic layer 201 (step S112), the process of releasing the bend of the substrate 110 (step S113), the process of depositing the intermediate layer 203 (step S115), and the process of depositing the second magnetic layer 202 (step S114).

The above method may manufacture the pressure sensor 100A that mounts the strain detecting element 200 having the first magnetic layer 201 under the second magnetic layer 202, like for example the strain detecting element 200B (FIG. 13).

In addition, the above method includes step S112 of depositing the first magnetic layer 201 followed by step S111 of bending the substrate 110, and thus the first magnetic layer 201 may be efficiently provided with strain.

Figure 29:
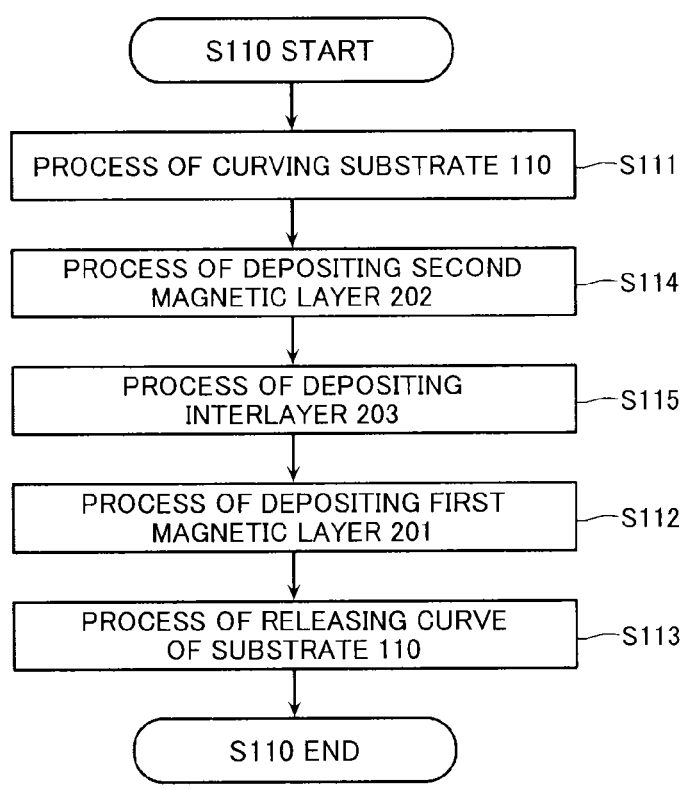
FIG. 29 is a schematic flowchart showing a method of manufacturing another strain detecting element according to the embodiment.
Figure 30:
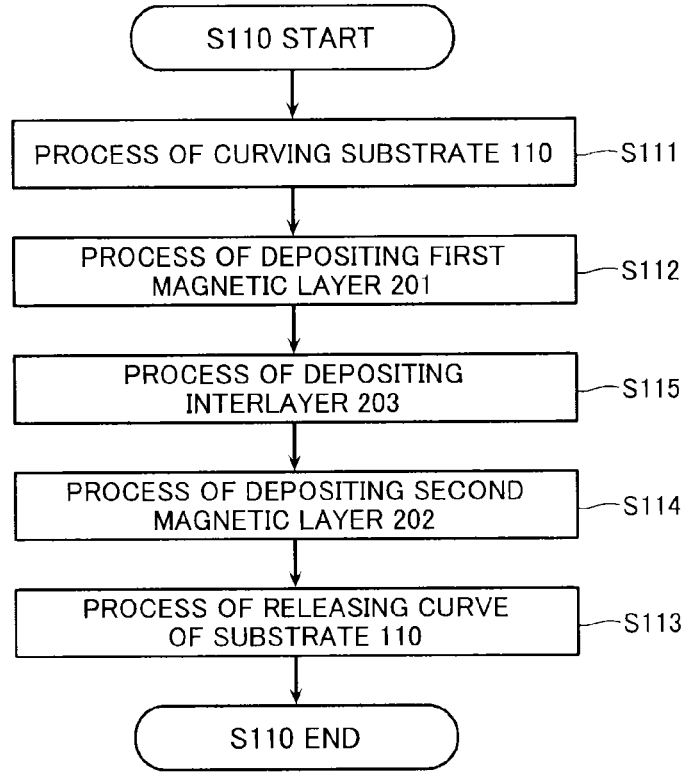
FIG. 30 is a schematic flowchart showing a method of manufacturing another strain detecting element according to the embodiment.

Note that as shown in FIG. 29 and FIG. 30, when the second magnetic layer 202 or the intermediate layer 203 are deposited, the substrate 110 may already be bended. FIG. 29 and FIG. 30 are schematic flowcharts for illustrating other modes of step S110.

Specifically, in the example shown in FIG. 29, step S110 includes the process of bending the substrate 110 (step S111), the process of depositing the second magnetic layer 202 (step S114), the process of depositing the intermediate layer 203 (step S115), the process of depositing the first magnetic layer 201 (step S112), and the process of releasing the bend of the substrate 110 (step S113).

In addition, in the example shown in FIG. 30, step S110 includes the process of bending the substrate 110 (step S111), the process of depositing the first magnetic layer 201 (step S112), the process of depositing the intermediate layer 203 (step S115), the process of depositing the second magnetic layer 202 (step S114), and the process of releasing the bend of the substrate 110 (step S113).

For example, if the methods as shown in FIG. 29 and FIG. 30 are used to manufacture the strain detecting element 200A, 200B, 200C or 200D shown in FIG. 10 to FIG. 15, one may bend the substrate 110 (step S111) when, for example, the structure shown in FIG. 27C is created, and with the substrate 110 bended, deposit films of from the under layer 205 to the cap layer 211 corresponding to the configurations of the respective strain detecting elements (step S112, step S114, and step S115), and then release the bend of the substrate 110 (step S113).

Next, with reference to FIGS. 31A, 31B, 31C and 31D, another mode of the strain detecting element 200 according to this embodiment will be described. Although, in the above description, a mode has been described in which the second magnetic layer 202 is the magnetization fixed layer, as described with reference to FIG. 5, the second magnetic layer 202 may be a magnetization free layer. A description will be given below of an example where the second magnetic layer 202 is a magnetization free layer and the strain detecting element 200 has a so-called two-layer free structure.

Figure 31A:
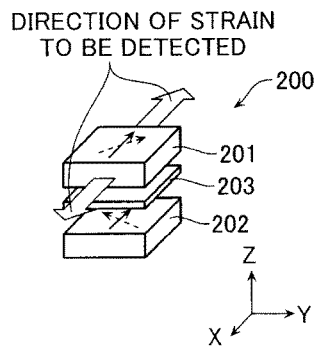
FIGS. 31A, 31B, 31C and 31D are schematic diagrams for illustrating the operation of another strain detecting element according to the embodiment.
Figure 31B:
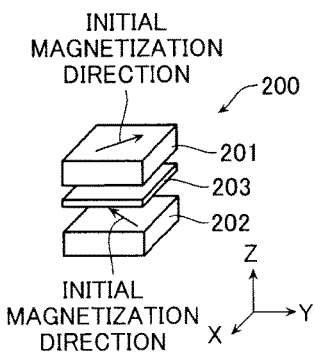
Figure 31C:
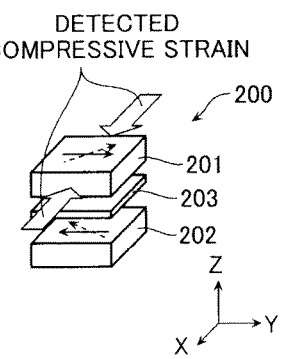

FIGS. 31A, 31B and 31C are schematic perspective views representing the strain detecting element 200 experiencing the tensile strain, experiencing no strain, and experiencing the compressive strain, respectively. In addition, it is assumed in the examples shown in FIG. 31A, FIG. 31B and FIG. 31C that the second magnetic layer 202 is a magnetization free layer and the strain detecting element 200 experiences the strain in the X direction.

As shown in FIG. 31B, if the strain detecting element 200 according to this embodiment experiences no strain, the relative angle between the magnetization direction of the first magnetic layer 201 and the magnetization direction of the second magnetic layer 202 may be larger than 0° and smaller than 180°. In the example shown in FIG. 31B, the initial magnetization direction of the first magnetic layer 201 has an angle of 90° with respect to the initial magnetization direction of the second magnetic layer 202. In addition, these initial magnetization directions each have an angle of 45° (135°) with respect to the strain generating direction.

As shown in FIG. 31A, if the strain detecting element 200Z experiences the tensile strain in the X direction, the first and second magnetic layers 201 and 202 have the inverse magnetostriction effect, which relatively changes the magnetization direction of the magnetic layers. The first and second magnetic layers 201 and 202 of the strain detecting element 200 have a ferromagnetic material having a positive magnetostriction constant. Therefore, as shown in FIG. 31A, the magnetization directions of the first and second magnetic layers 201 and 202 approach parallel to the tensile strain direction. Note that the first magnetic layer 201 may have a negative magnetostriction constant. In the example shown in FIG. 31A, these magnetization directions are changed to decrease the angle difference therebetween.

Meanwhile, as shown in FIG. 31C, if the strain detecting element 200 experiences the compressive strain in the X direction, the first and second magnetic layers 201 and 202 have the inverse magnetostriction effect, which causes the magnetization directions of the first and second magnetic layers 201 and 202 to approach perpendicular to the compressive strain direction. In the example shown in FIG. 31C, these magnetization directions are changed to increase the angle difference therebetween.

Figure 31D:
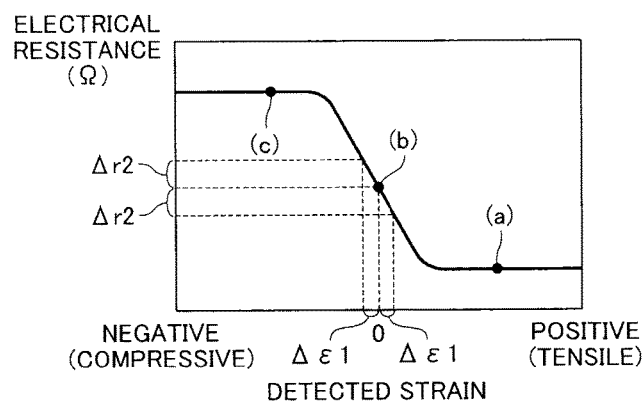

FIG. 31D is a schematic graph showing the relationship between the electrical resistance of the strain detecting element 200 and the amount of strain generated in the strain detecting element 200. Note that in FIG. 31D, the tensile direction strain is the positive direction strain and the compressive direction strain is the negative direction strain.

As shown in FIG. 31D, the strain detecting element 200 according to this embodiment has an electrical resistance value that decreases for the positive direction strain (tensile strain) and increases for the negative direction strain (compressive strain). Therefore, the strain detecting element 200 may be directly used to a device such as a microphone, for example, that is sensitive to the positive/negative pressures.

In addition, if the strain detecting element 200 experiences strain around zero, addition of small strain $\Delta\epsilon 1$ in the positive direction (tensile direction) and addition of small strain $\Delta\epsilon 1$ in the negative direction (compressive direction) may both provide a relatively large resistance change $\Delta r2$. Specifically, the strain detecting element 200 according to this embodiment has a large gauge factor for extremely small strain and thus is suitable for the manufacture of the high sensitivity pressure sensor 100A.

Figure 32:
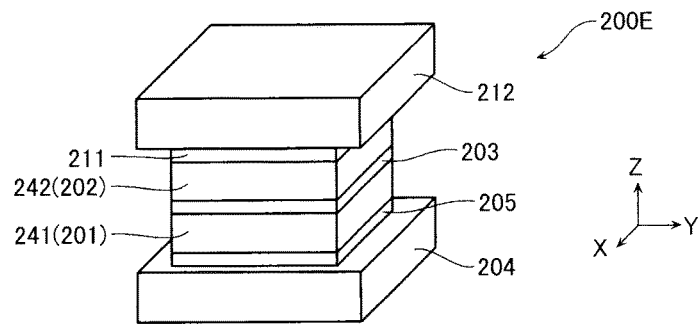
FIG. 32 is a schematic perspective view showing an example configuration of another strain detecting element according to the embodiment.

Next, with reference to FIG. 32, a description is given of an example configuration of the strain detecting element 200 that has the second magnetic layer 202 as the magnetization free layer. FIG. 32 is a schematic perspective view showing one example configuration 200E of the strain detecting element 200. As shown in FIG. 32, the strain detecting element 200E has a sequential stack of the bottom electrode 204, the under layer 205, the first magnetization free layer 241 (the first magnetic layer 201), the intermediate layer 203, the second magnetization free layer 242 (the second magnetic layer 202), the cap layer 211, and the top electrode 212. The first magnetization free layer 241 corresponds to the first magnetic layer 201. The second magnetization free layer 242 corresponds to the second magnetic layer 202. In addition, the bottom electrode 204 is connected, for example, to the wiring line 131 (FIG. 1) and top electrode 212 is connected, for example, to the wiring line 133 (FIG. 1).

The under layer 205 has, for example, Ta/Cu. The Ta layer has a thickness (a length in the Z axis direction) of, for example, 3 nm. The Cu layer has a thickness of, for example, 5 nm. The first magnetization free layer 241 has, for example, $Co_{40}Fe_{40}B_{20}$ of 4 nm thickness. The intermediate layer 203 has, for example, an MgO layer of 1.6 nm thickness. The second magnetization free layer 242 has, for example, $Co_{40}Fe_{40}B_{20}$ of 4 nm thickness. The cap layer 211 has, for example, Cu/Ta/Ru. The Cu layer has a thickness of, for example, 5 nm. The Ta layer has a thickness of, for example, 1 nm. The Ru layer has a thickness of, for example, 5 nm.

The layers of the strain detecting element 200E may have similar materials to the respective layers of the strain detecting element 200A. In addition, the first and second magnetization free layers 241 and 242 may have, for example, similar materials to the magnetization free layer 210 of the strain detecting element 200A (FIG. 10).

Next, with reference to FIG. 24, FIGS. 25A, 25B, 25C, 25D and 25E and FIG. 33, a method of manufacturing the pressure sensor 100A that mounts the strain detecting element 200E is described.

Figure 33:
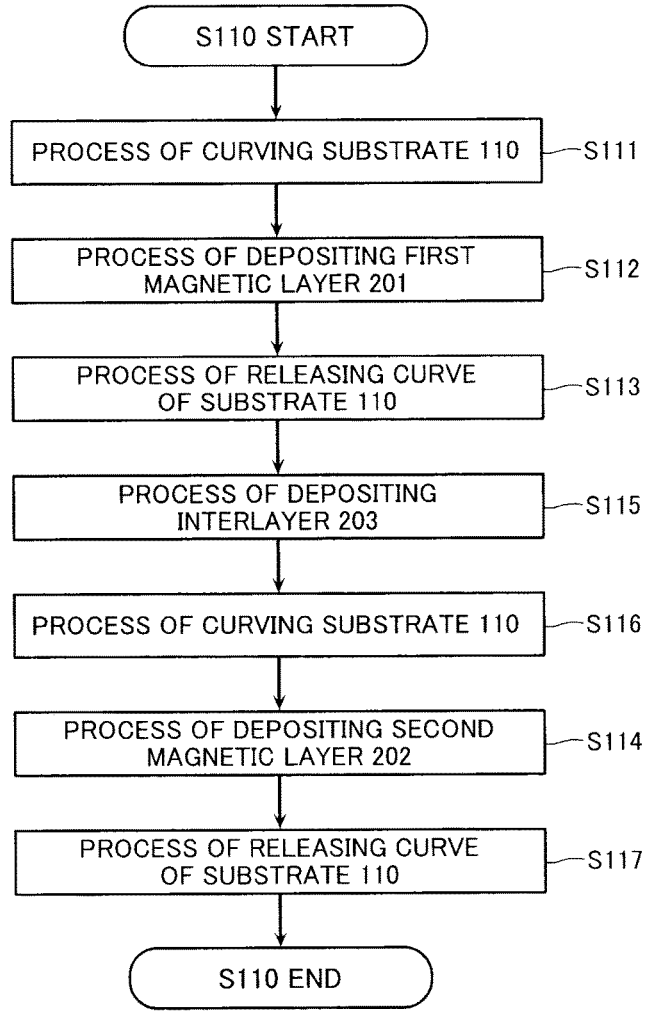
FIG. 33 is a schematic flowchart showing a method of manufacturing the strain detecting element.

Such a pressure sensor 100A may be manufactured using the manufacturing method described with reference to FIG. 24 and FIGS. 25A, 25B, 25C, 25D and 25E. However, step S110 (FIG. 24) performs the process shown in FIG. 33. FIG. 33 is a schematic flowchart for illustrating an example of step S110. In the example shown in FIG. 33, in the stages of depositing the first and second magnetic layers 201 and 202, the substrate 110 is bended in different directions.

Specifically, in the example shown in FIG. 33, step S110 includes the process (Sill) of bending the substrate, the process (S112) of depositing the first magnetic layer, the process (S113) of releasing the bend of the substrate, the process (S115) of depositing the intermediate layer, the process (S116) of bending the substrate, the process (S114) of depositing the second magnetic layer, and the process (S117) of releasing the bend of the substrate. Specifically, both processes of bending the substrate and releasing the bend of the substrate are performed twice. Here, step S111 and step S116 bend the substrate in different directions.

Note that the processes shown in FIG. 33 are merely an example of step S110. For example, the process (S112) of depositing the first magnetic layer may be followed by the process (S115) of depositing the intermediate layer, which may then be followed by the process (S113) of releasing the bend of the substrate. In addition, the process (S112) of depositing the first magnetic layer may be followed by the process (S113) of releasing the bend of the substrate, which may then be followed by the process (S115) of depositing the intermediate layer.

Next, with reference to FIG. 34 to FIG. 37, states of bending the substrate 110 will be described. FIG. 34 to FIG. 37 are schematic plan views for illustrating the states of bending the substrate 110. Note that FIG. 34 to FIG. 37 illustrate an example where the first and second magnetic layers 201 and 202 have magnetic materials having a positive magnetostriction constant.

As described with reference to FIG. 31B, the initial magnetization direction of the first magnetic layer 201 according to this embodiment is more than 0° and less than 180° with respect to the magnetization direction of the second magnetic layer 202. In addition, the initial magnetization direction of the first and second magnetic layers 201 and 202 have an angle larger than 0° and smaller than 90° with respect to the direction of the strain to be detected. Specifically, the process of bending the substrate 110 (step S111 and step S116 in FIG. 33) is performed to meet such a condition.

Figure 34:
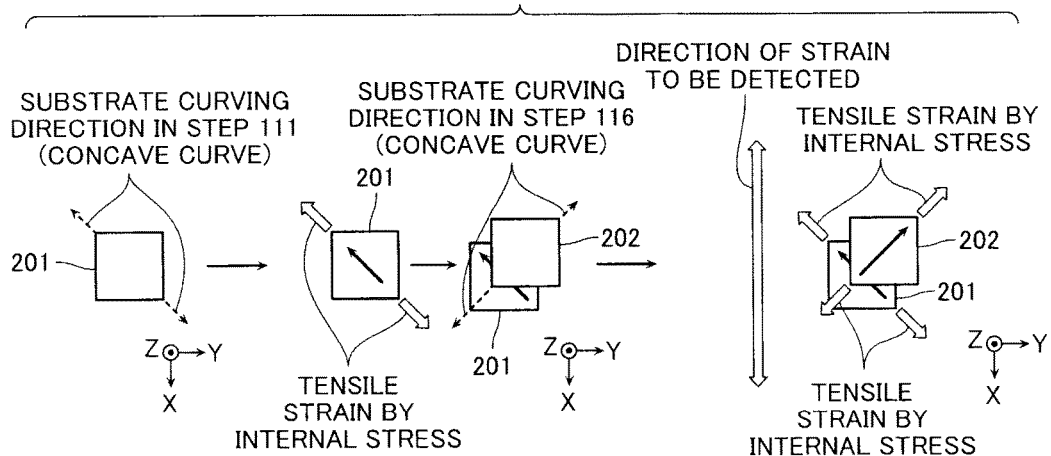
FIG. 34 is a schematic plan view for illustrating the method of manufacturing the strain detecting element.

For example, as shown in FIG. 34, if the direction of the strain to be detected is in the X direction, step S111 may concavely bend the substrate 110 in the direction extending in the (X, Y) and (−X, −Y) directions around a predetermined line extending in the (X, −Y) and (−X, Y) directions. Thus, the first magnetic layer 201 experiences the tensile strain due to the internal stress in the (X, Y) and (−X, −Y) directions. Therefore, the initial magnetization direction of the first magnetic layer 201 is directed toward the (X, Y) or (−X, −Y) direction.

In addition, as shown in FIG. 34, step S116 may concavely bend the substrate 110 in the direction extending in the (X, −Y) and (−X, Y) directions around a predetermined line extending in the (X, Y) and (−X, −Y) directions. Thus, the second magnetic layer 202 experiences the tensile strain due to the internal stress in the (X, −Y) and (−X, Y) directions. Therefore, the initial magnetization direction of the second magnetic layer 202 is directed toward the (X, −Y) or (−X, Y) direction by the strain due to the internal stress.

Therefore, in the manufacturing method shown in FIG. 33, step S111 and step S116 adjust the initial magnetization direction of the first and second magnetic layers 201 and 202 to meet the above condition.

Figure 35:
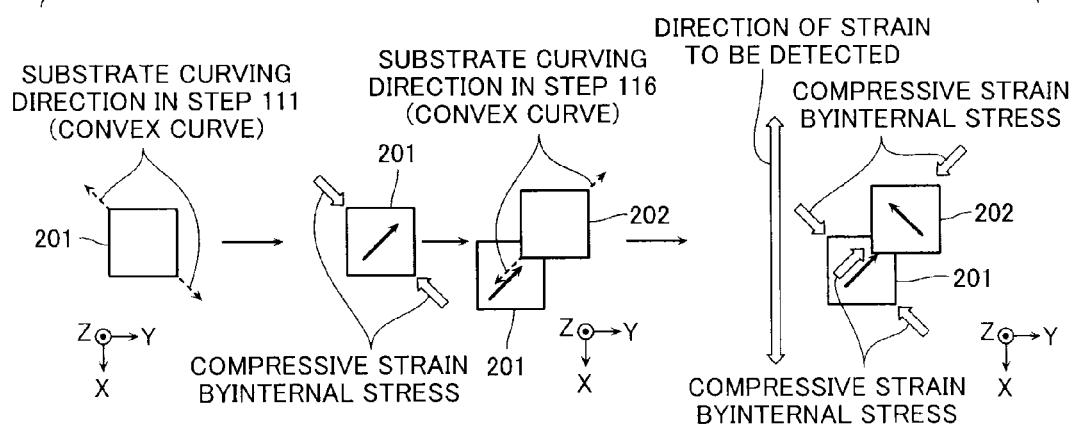
FIG. 35 is a schematic plan view for illustrating a method of manufacturing another strain detecting element according to the embodiment.

In addition, as shown in FIG. 35, if, for example, the direction of the strain to be detected is in the X direction, step S111 may convexly bend the substrate 110 in the direction extending in the X, Y) and (−X, −Y) directions around a predetermined line extending in the (X, −Y) and (−X, Y) directions. Thus, the first magnetic layer 201 experiences the compressive strain due to the internal stress in the (X, Y) and (−X, −Y) directions. Therefore, the initial magnetization direction of the first magnetic layer 201 is directed toward the (X, −Y) or (−X, Y) direction by the strain due to the internal stress.

In addition, as shown in FIG. 35, step S116 may convexly bend the substrate 110 in the direction extending in the (X, −Y) and (−X, Y) directions around a predetermined line extending in the (X, Y) and (−X, −Y) directions. Thus, the second magnetic layer 202 experiences the tensile strain due to the internal stress in the (X, −Y) and (−X, Y) directions. Therefore, the initial magnetization direction of the second magnetic layer 202 is directed toward the (X, Y) or (−X, −Y) direction.

Therefore, in the manufacturing method shown in FIG. 33, step S111 and step S116 also adjust the initial magnetization direction of the first and second magnetic layers 201 and 202 to meet the above condition.

Note that in the examples shown in FIG. 34 and FIG. 35, as the bend of the substrate 110 is larger (as the curvature radius is smaller, or, as the strain of the substrate surface is larger), the contribution from the strain to the initial magnetization directions of the first and second magnetic layers 201 and 202 increases. Therefore, the curvature radius at which the substrate 110 is bended may be adjusted to freely adjust the initial magnetization directions of the first and second magnetic layers 201 and 202.

Figure 36:
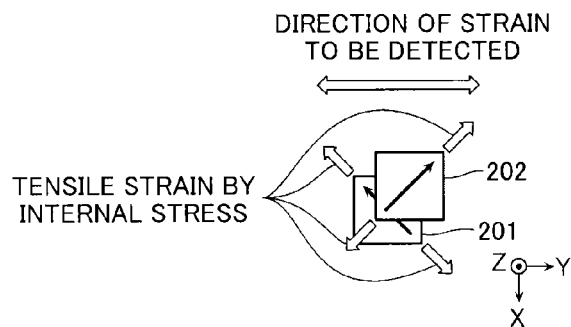
FIG. 36 is a schematic plan view for illustrating a method of manufacturing another strain detecting element according to the embodiment.
Figure 37:
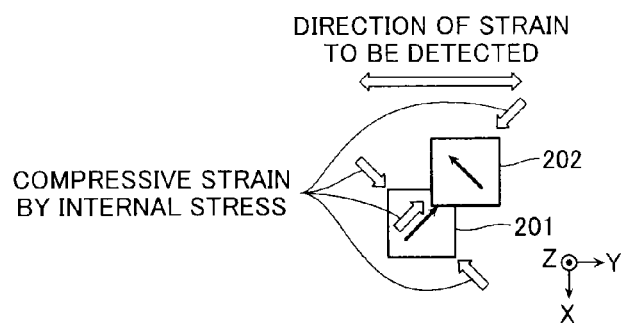
FIG. 37 is a schematic plan view for illustrating a method of manufacturing another strain detecting element according to the embodiment.

In addition, as shown in FIG. 36 and FIG. 37, even if, for example, the direction of the strain to be detected is in the Y direction, the substrate 110 may be bended in a similar mode to adjust the initial magnetization direction of the first magnetic layer 201 to meet the above condition. Note that the initial magnetization may be set in a way that is not limited to the specific examples shown in FIG. 34 to FIG. 37 and that may be adjusted as appropriate in respond to the device requirements.

2. Second Embodiment

Figure 38:
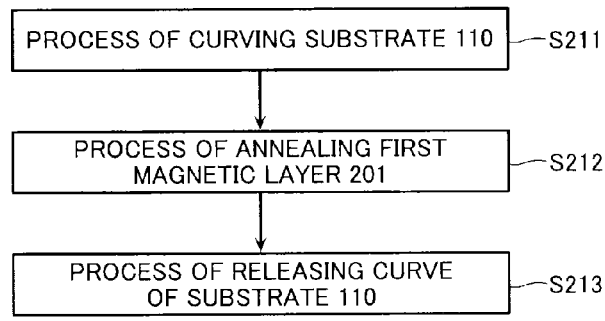
FIG. 38 is a schematic flowchart showing a method of manufacturing a pressure sensor according to a second embodiment.

Next, with reference to FIG. 38 and FIGS. 39A, 39B, 39C, 39D, 39E and 39F, a method of manufacturing the pressure sensor 100A according to a second embodiment will be outlined. FIG. 38 is a flowchart showing apart of the method of manufacturing the pressure sensor 100A according to this embodiment. FIGS. 39A, 39B, 39C, 39D, 39E and 39F are schematic side views for illustrating the method of manufacturing the pressure sensor 100A according to this embodiment. Note that in the example shown in FIGS. 39A, 39B, 39C, 39D, 39E and 39F, the substrate 110 is bended in the X direction around a predetermined line extending in the Y direction.

The first embodiment deposits the first magnetic layer 201 with the substrate 110 bended, thus setting the initial magnetization direction of the first magnetic layer 201. In contrast, this embodiment bends the substrate 110 that has the first magnetic layer 201 deposited thereon and anneals the substrate 110 with it bended, thus setting the initial magnetization direction of the first magnetic layer 201.

Specifically, as shown in FIG. 38, the method of manufacturing the pressure sensor 100A according to this embodiment includes the process of bending the substrate 110 (step S211), the process of annealing the first magnetic layer 201 (step S212), the process of releasing the bend of the substrate 110 (step S213).

Figure 39A:
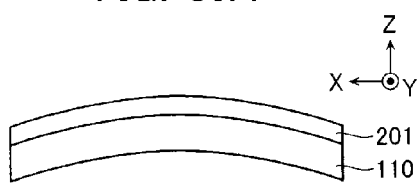
FIGS. 39A, 39B, 39C, 39D, 39E and 39F are schematic cross-sectional views showing the manufacturing method.
Figure 39D:
Figure 39B:
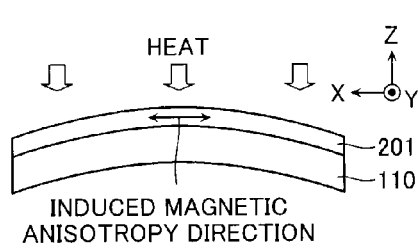

For example, in the manufacturing method according to this embodiment, as shown in FIG. 39A, step S211 may convexly bend the substrate 110 that has the first magnetic layer 201 deposited thereon, and as shown in FIG. 39B, step S212 may anneal the first magnetic layer 201. In this case, the induced magnetic anisotropy is generated in the first magnetic layer 201 and the initial magnetization direction of the first magnetic layer 201 is oriented to the X or −X direction. Therefore, as shown in FIG. 39C, even if step S213 releases the bend of the substrate 110, the initial magnetization direction of the first magnetic layer 201 remains in the X or −X direction.

Figure 39E:
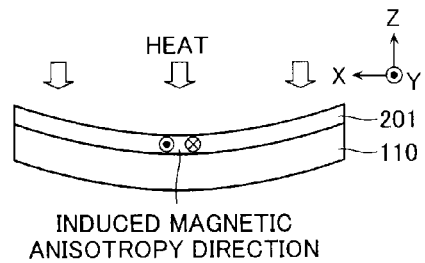
Figure 39C:
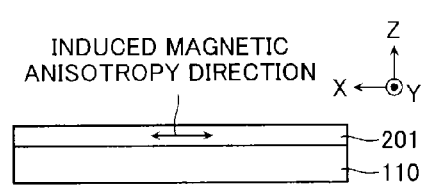
Figure 39F:
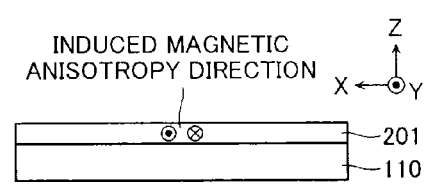

In addition, in the manufacturing method according to this embodiment, for example, as shown in FIG. 39D, step S211 may concavely bend the substrate 110 that has the first magnetic layer 201 deposited thereon, and as shown in FIG. 39E, step S212 may anneal the first magnetic layer 201. In this case, the induced magnetic anisotropy is generated in the first magnetic layer 201 and the initial magnetization direction of the first magnetic layer 201 is oriented to the Y or −Y direction. Therefore, as shown in FIG. 39F, even if step S213 releases the bend of the substrate 110, the initial magnetization direction of the first magnetic layer 201 remains in the Y or −Y direction.

Therefore, the manufacturing method according to this embodiment may freely adjust the strain due to the internal stress of the first magnetic layer 201, and thus may adjust the initial magnetization direction of the first magnetic layer 201. This may freely adjust the range of strain that is sensed by the strain sense device 200, and thus may provide the strain sense device 200 that shows high strain sensitivity in the strain detection range necessary for a device mounting the strain sense device 200. Note that the method of manufacturing the pressure sensor 100A according to this embodiment may be combined with the manufacturing method according to the first embodiment.

Next, with reference to FIG. 40 to FIG. 45, states of bending the substrate 110 will be described. FIG. 40 to FIG. 45 are schematic plan views for illustrating the modes of bending the substrate 110. Note that FIG. 40 to FIG. 45 illustrate examples where the first magnetic layer 201 has a magnetic material having a positive magnetostriction constant example.

Even if the strain detecting element 200 is manufactured according to the manufacturing method according to this embodiment, as shown in FIG. 7B, for example, the initial magnetization direction of the first magnetic layer 201 has an angle larger than 0° and smaller than 180° with respect to the magnetization direction of the second magnetic layer 202. In addition, the initial magnetization direction of the first magnetic layer 201 has an angle larger than 0° and smaller than 90° with respect to the direction of the strain to be detected. Specifically, the process of bending the substrate 110 (step S211 in FIG. 38) is performed to meet such a condition.

Figure 40:
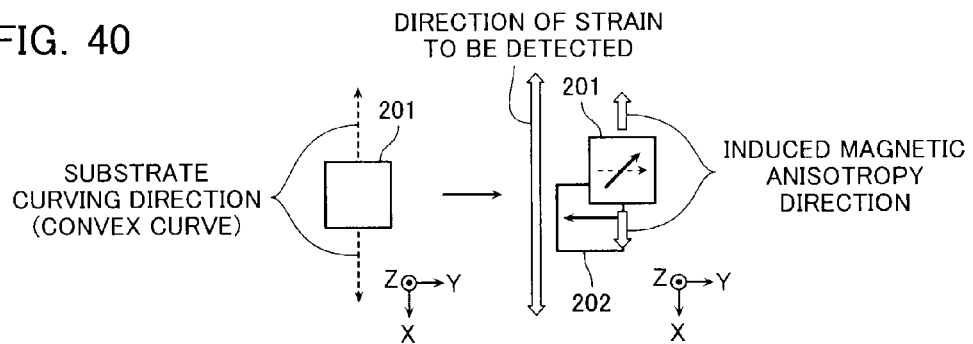
FIG. 40 is a schematic plan view for illustrating a method of manufacturing the strain detecting element according to the second embodiment.

For example, as shown in FIG. 40, if the magnetization direction of the second magnetic layer 202 is in the −Y direction and the direction of the strain to be detected is in the X direction, the substrate 110 may be convexly bended in the X direction around a predetermined line extending in the Y direction, and then be annealed. Thus, the induced magnetic anisotropy in the X direction is generated in the first magnetic layer 201. Therefore, the initial magnetization direction of the first magnetic layer 201 is directed toward the X direction by the magnetization by the induced magnetic anisotropy due to the bending and the annealing, and is directed toward the Y direction by the induced magnetic anisotropy due to the annealing in the magnetic field parallel to the magnetization of the second magnetic layer 202. As a result, the initial magnetization direction of the first magnetic layer 201 is adjusted to meet the above condition.

Note that in the example shown in FIG. 40, as the bend of the substrate 110 is larger (as the curvature radius is smaller, or, as the strain of the substrate surface is larger), the contribution from the strain to the initial magnetization direction of the first magnetic layer 201 increases, thus approximating the initial magnetization direction to the −X direction. Therefore, the curvature radius at which the substrate 110 is bended may be adjusted to freely adjust the initial magnetization direction of the first magnetic layer 201.

Figure 41:
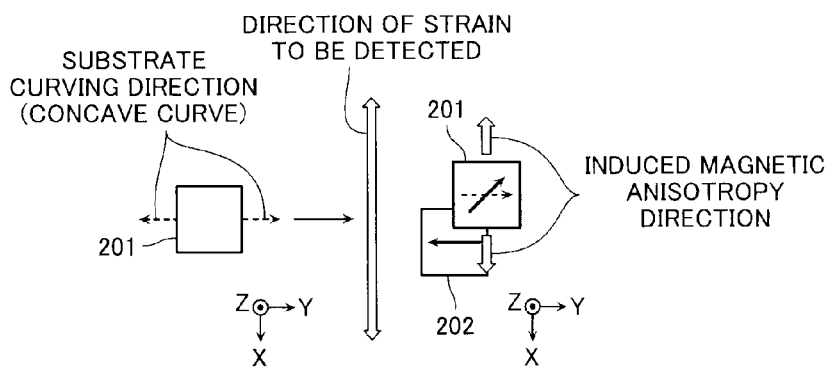
FIG. 41 is a schematic plan view for illustrating a method of manufacturing another strain detecting element according to the embodiment.

In addition, as shown in FIG. 41, the substrate 110 may be concavely bended in the Y direction around a predetermined line extending in the X direction. Thus, the induced magnetic anisotropy in the X direction is generated in the first magnetic layer 201. Therefore, the initial magnetization direction of the first magnetic layer 201 is directed toward the X direction by the magnetization by the induced magnetic anisotropy due to the bending and the annealing, and is directed toward the Y direction by the induced magnetic anisotropy due to the annealing in the magnetic field parallel to the magnetization of the second magnetic layer 202. As a result, the initial magnetization direction of the first magnetic layer 201 is adjusted to meet the above condition. Note that also in the example shown in FIG. 41, as the bend of the substrate 110 is larger (as the curvature radius is smaller, or, as the strain of the substrate surface is larger), the contribution from the strain to the initial magnetization direction of the first magnetic layer 201 increases, thus approximating the initial magnetization direction to the −X direction.

Figure 42:
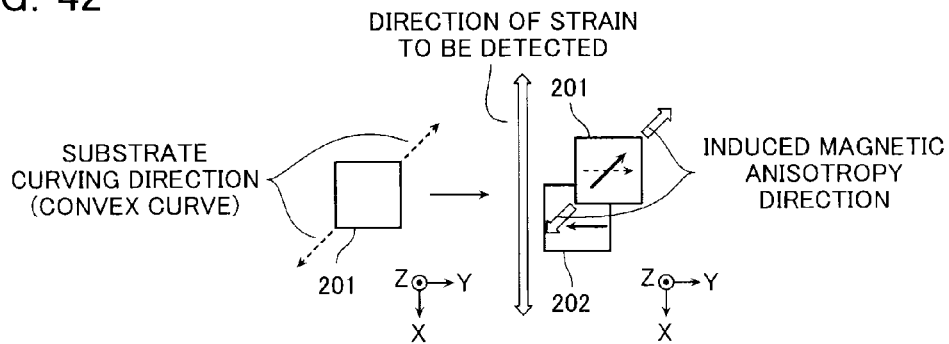
FIG. 42 is a schematic plan view for illustrating a method of manufacturing another strain detecting element according to the embodiment.

In addition, as shown in FIG. 42, the substrate 110 may be convexly bended in a direction extending in the (X, −Y) and (−X, Y) directions around a predetermined line extending in the (X, Y) and (−X, −Y) directions. Thus, the induced magnetic anisotropy in the (X, −Y) and (−X, Y) directions is generated in the first magnetic layer 201. Therefore, the initial magnetization direction of the first magnetic layer 201 is directed toward the X direction by the magnetization by the induced magnetic anisotropy due to the bending and annealing, and is directed toward the Y direction by the induced magnetic anisotropy due to the annealing in the magnetic field parallel to the magnetization of the second magnetic layer 202. As a result, the initial magnetization direction of the first magnetic layer 201 is adjusted to meet the above condition.

Figure 43:
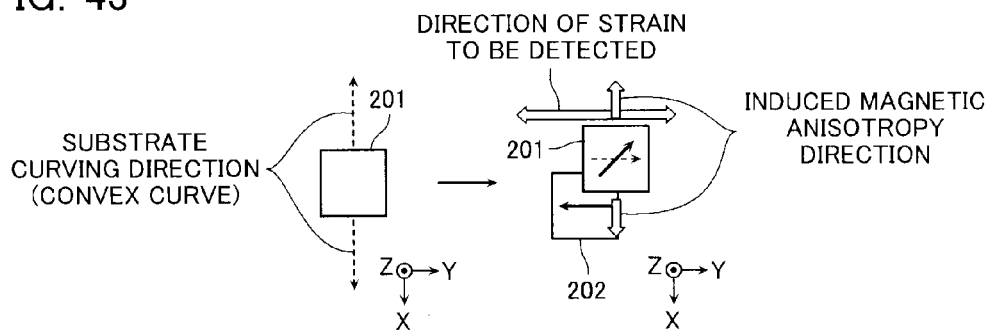
FIG. 43 is a schematic plan view for illustrating a method of manufacturing another strain detecting element according to the embodiment.
Figure 44:
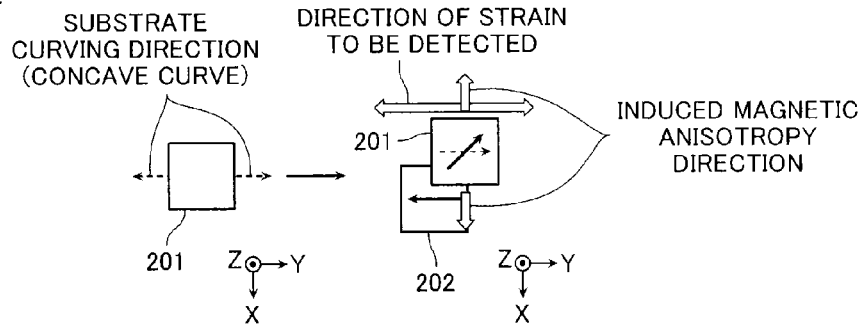
FIG. 44 is a schematic plan view for illustrating a method of manufacturing another strain detecting element according to the embodiment.
Figure 45:
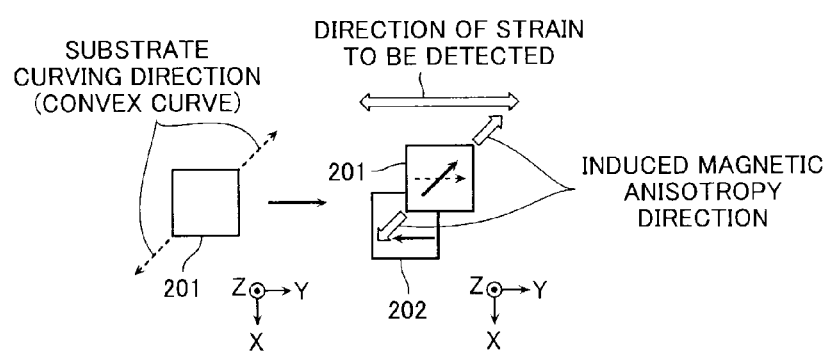
FIG. 45 is a schematic plan view for illustrating a method of manufacturing another strain detecting element according to the embodiment.

Note that as shown in FIG. 43 to FIG. 45, even if, for example, the magnetization direction of the second magnetic layer 202 is in the −Y direction and the direction of the strain to be detected is in the Y direction, the substrate 110 may also be bended in a similar way to adjust the initial magnetization direction of the first magnetic layer 201 to meet the above condition. Note that the initial magnetization may be set in a way that is not limited to the specific examples shown in FIG. 40 to FIG. 45 and that may be adjusted as appropriate in respond to the device requirements.

Figure 46:
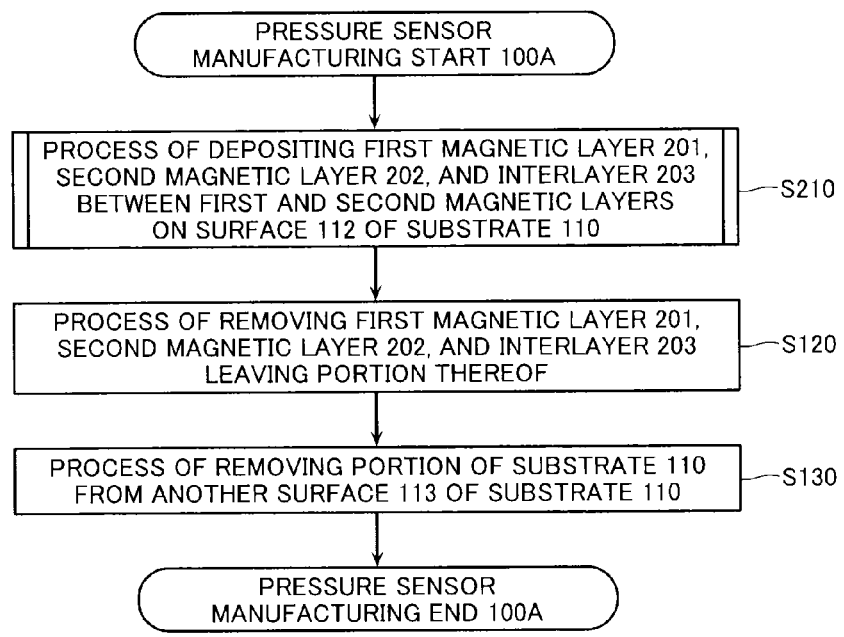
FIG. 46 is a schematic flowchart showing a method of manufacturing a pressure sensor according to the second embodiment.

Next, with reference to FIG. 46, the method of manufacturing the pressure sensor 100A according to this embodiment will be described in more detail. FIG. 46 is a flowchart showing some of the method of manufacturing the pressure sensor 100A according to this embodiment.

As shown in FIG. 46, a method of manufacturing a pressure sensor according to this embodiment includes the process of depositing the first magnetic layer 201, the second magnetic layer 202, and the intermediate layer 203 between the first and second magnetic layers 201 and 202 on one surface 112 of a substrate 110 (step S210), the process of removing the first magnetic layer 201, the second magnetic layer 202, and the intermediate layer 203 leaving a portion thereof (step S120), and the process of removing a portion of the substrate 110 from another surface 113 of the substrate 110 (step S130). Note that the processes except S210 are performed as described with reference to FIG. 24 and FIGS. 25A, 25B, 25C, 25D and 25E.

Step S210 deposits, on one surface 112 of the substrate 110, the first magnetic layer 201, the second magnetic layer 202, and the intermediate layer 203 positioned between the first and second magnetic layers 201 and 202. Note that although in the first embodiment, step S110 deposits the first magnetic layer 201 with the substrate 110 bended, in this embodiment, step S210 may deposit the first magnetic layer 201 without the substrate 110 bended.

Figure 47:
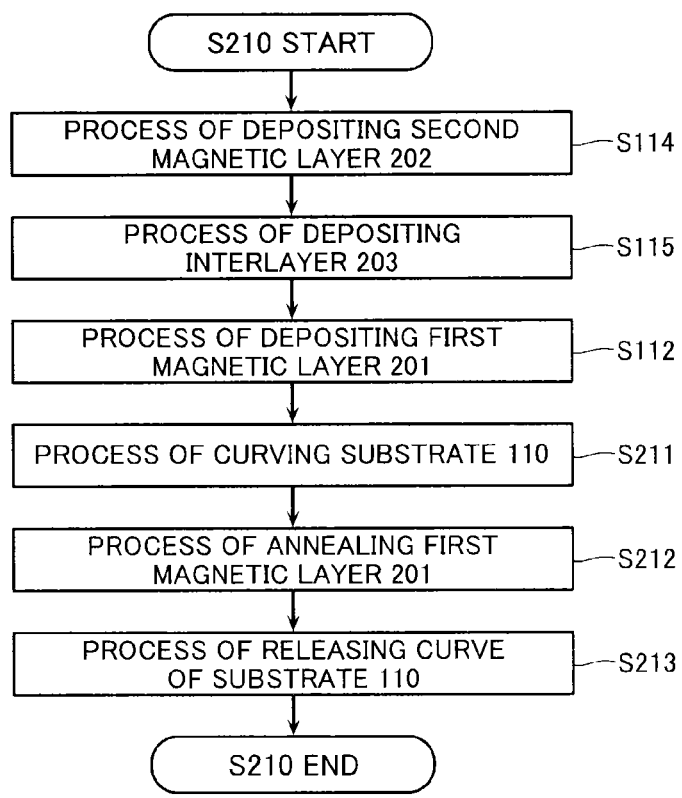
FIG. 47 is a schematic flowchart showing the manufacturing method.

Next, with reference to FIG. 47, a partial process (step S210) in the method of manufacturing the pressure sensor 100A according to this embodiment will be described in more detail. FIG. 47 is a schematic flowchart for illustrating an example of the process.

In the example shown in FIG. 47, the step S210 includes the process of depositing the second magnetic layer (step S114), the process of depositing the intermediate layer 203 (step S115), the process of depositing the first magnetic layer 201 (step S112), the process of bending the substrate 110 (step S211), the process of annealing the first magnetic layer 201 (step S212), and the process of releasing the bend of the substrate 110 (step S213).

The above method may manufacture the pressure sensor 100A that mounts the strain detecting element 200 having the first magnetic layer 201 above the second magnetic layer 202, like for example the strain detecting element 200A (FIG. 10).

Figure 48:
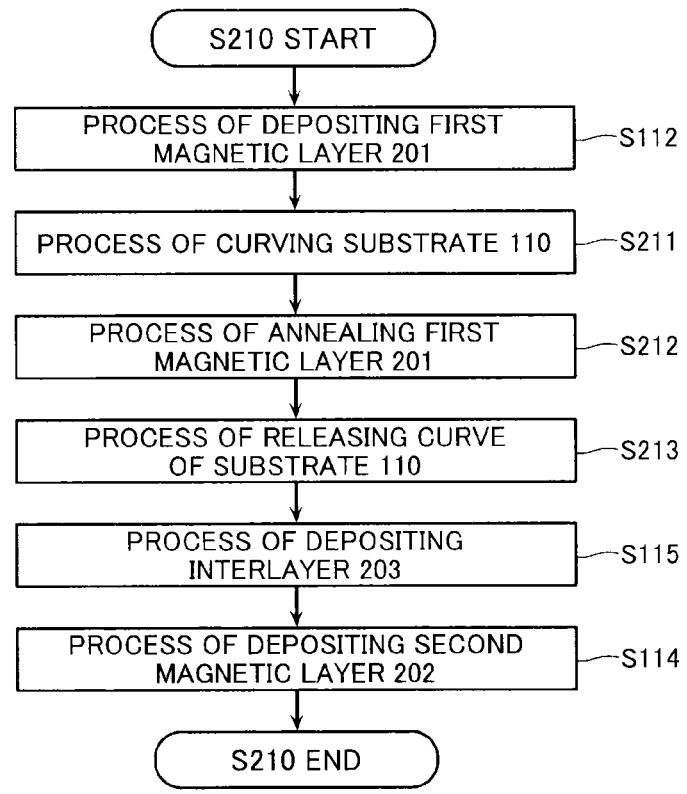
FIG. 48 is a schematic flowchart showing a method of manufacturing another strain detecting element according to the embodiment.

Next, another mode of step S210 will be described. FIG. 48 is a schematic flowchart for illustrating the another mode of step S210. In the example shown in FIG. 48, the first magnetic layer 201 is deposited before the second magnetic layer 202.

Specifically, in the example shown in FIG. 48, step S210 includes the process of depositing the first magnetic layer 201 (step S112), the process of bending the substrate 110 (step S211), the process of annealing the first magnetic layer 201 (step S212), the process of releasing the bend of the substrate 110 (step S213), the process of depositing the intermediate layer 203 (step S115), and the process of depositing the second magnetic layer 203 (step S114).

The above method may manufacture the pressure sensor 100A that mounts the strain detecting element 200 having the first magnetic layer 201 under the second magnetic layer 202, like for example the strain detecting element 200B (FIG. 13).

Figure 49:
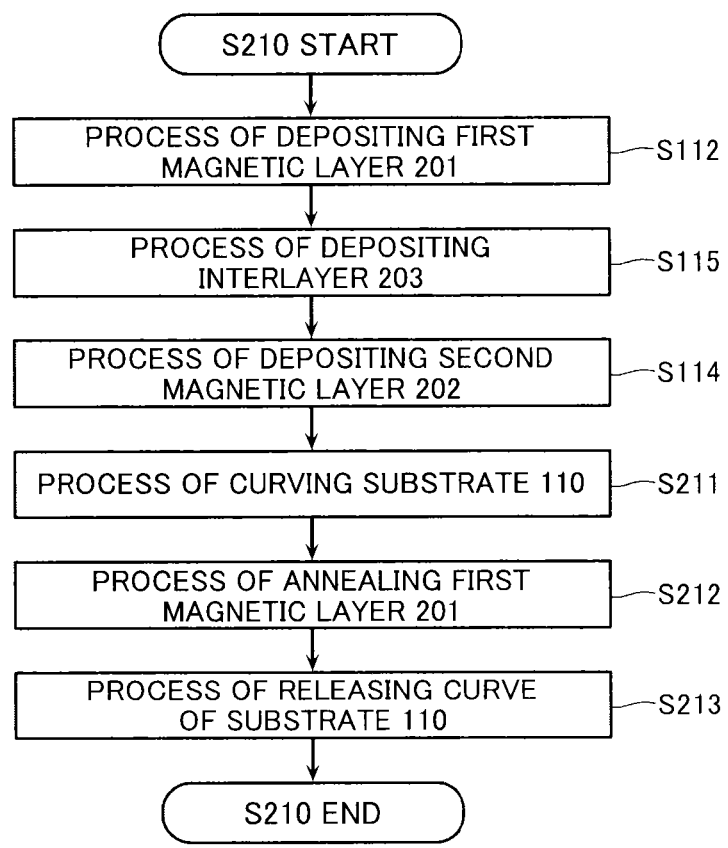
FIG. 49 is a schematic flowchart showing a method of manufacturing another strain detecting element according to the embodiment.

Next, another mode of step S210 will be described. FIG. 49 is a schematic flowchart for illustrating the another mode of step S210.

Specifically, in the example shown in FIG. 49, step S210 includes the process of depositing the first magnetic layer 201 (step S112), the process of depositing the intermediate layer 203 (step S115), the process of depositing the second magnetic layer 202 (step S114), the process of bending the substrate 110 (step S211), the process of annealing the first magnetic layer 201 (step S212), and the process of releasing the bend of the substrate 110 (step S213).

The method according to this embodiment may manufacture, for example, the pressure sensor 100A that mounts the strain detecting element 200A, 200B, 200C, or 200D shown in FIG. 10 to FIG. 15.

Third Embodiment

Figure 50:
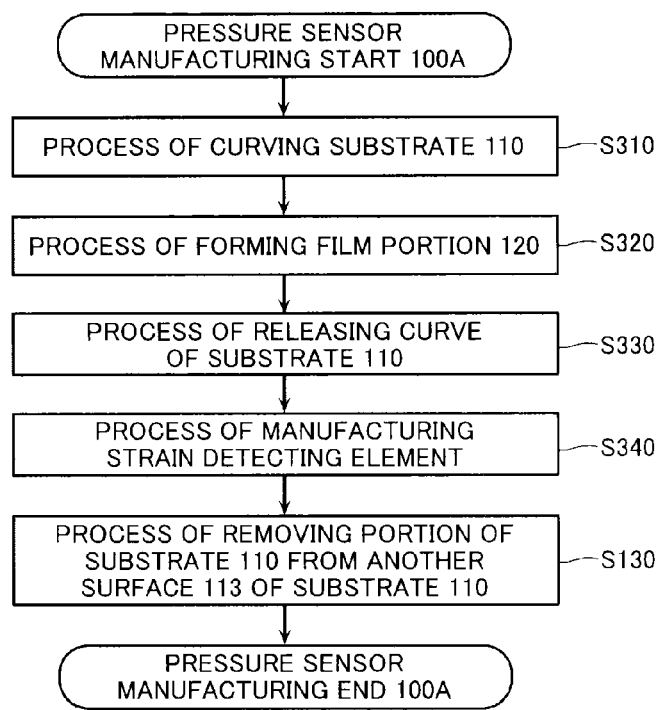
FIG. 50 is a schematic flowchart showing a method of manufacturing a pressure sensor according to a third embodiment.

Next, with reference to FIG. 50 to FIG. 52F, a method of manufacturing a pressure sensor according to a third embodiment will be described. FIG. 50 is a flowchart of showing some of the method of manufacturing a pressure sensor according to this embodiment. FIGS. 51A, 51B, 51C, 51D, 51E and 51F and FIGS. 52A, 52B, 52C, 52D 52E and 52F are schematic side views for illustrating the method of manufacturing a pressure sensor according to this embodiment. Note that FIGS. 51A, 51B, 51C, 51D, 51E and 51F and FIGS. 52A, 52B, 52C, 52D 52E and 52F show examples where the substrate 110 is bended isotropically (spherically). This embodiment bends the substrate 110 in the Z direction around a predetermined point.

The first embodiment deposits, as shown in FIGS. 17A, 17B, 17C, 17D, 17E and 17F for example, the first magnetic layer 201 with the substrate 110 bended to set the initial magnetization direction of the first magnetic layer 201. In contrast, the method of manufacturing a pressure sensor according to this embodiment deposits, as shown in FIG. 50 to FIG. 52F, the film portion 120 with the substrate 110 bended, thus adjusting the internal stress of the film portion 120 and providing strain.

Specifically, as shown in FIG. 50, the method of manufacturing a pressure sensor according to this embodiment includes the process of bending the substrate 110 (step S310), the process of forming the film portion 120 (step S320), the process of releasing the bend of the substrate 110 (step S330), the process of manufacturing the strain detecting element (step S340), and the process of removing a portion of the substrate 110 from another surface 113 of the substrate 110 (step S130). Note that the processes shown in step S130 may be performed similarly to the processes described with reference to FIG. 24 and FIG. 25E. In addition, other layer may be formed between the substrate 110 and the film portion 120.

Figure 51A:
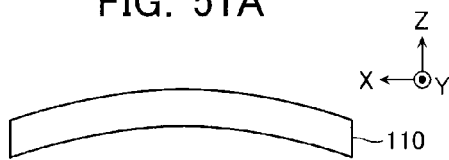
FIGS. 51A, 51B, 51C, 51D, 51E and 51F are schematic cross-sectional views showing the manufacturing method.
Figure 51D:
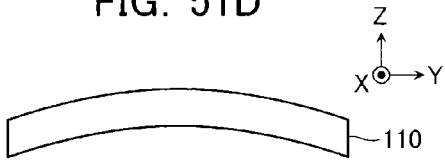
Figure 51B:
Figure 51E:
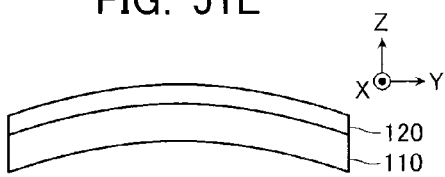
Figure 51C:
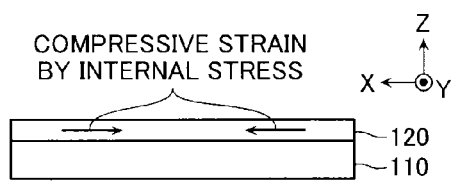
Figure 51F:
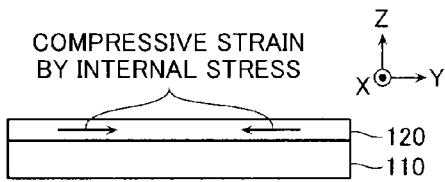

For example, in the manufacturing method according to this embodiment, as shown in FIG. 51A and FIG. 51D, step S310 may convexly bend the substrate 110, and as shown in FIG. 51B and FIG. 51E, step S320 may form the film portion 120. In this case, the film portion 120 experiences little stress with the substrate 110 convexly bended. Therefore, as shown in FIG. 51C and FIG. 51F, if step S330 releases the bend of the substrate 110, the film portion 120 experiences isotropic compressive strain due to the internal stress.

Figure 52A:
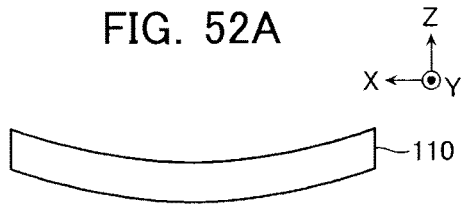
FIGS. 52A, 52B, 52C, 52D 52E and 52F are schematic cross-sectional views showing the manufacturing method.
Figure 52D:
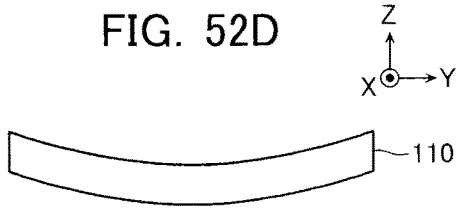
Figure 52B:
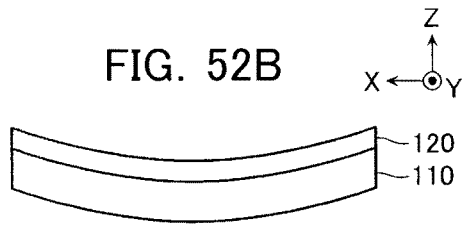
Figure 52E:
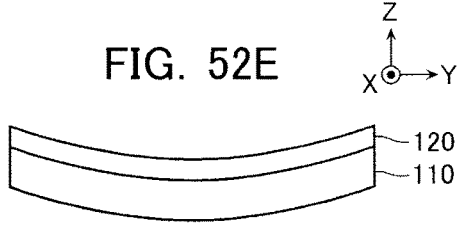
Figure 52C:
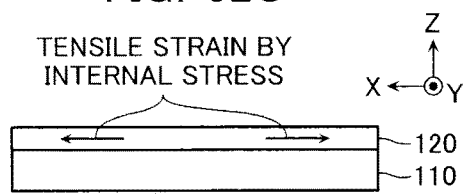
Figure 52F:
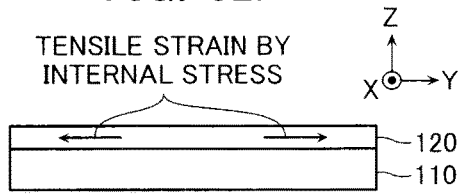

In addition, in the manufacturing method according to this embodiment, as shown in FIG. 52A and FIG. 52D, step S310 may concavely bend the substrate 110 and as shown in FIG. 52B and FIG. 52E, step S320 may form the film portion 120. In this case, the film portion 120 experiences little stress with the substrate 110 concavely bended. Therefore, as shown in FIGS. 52C and 52C, if step S330 releases the bend of the substrate 110, the film portion 120 experiences isotropic tensile strain due to the internal stress.

Specifically, in order to increase the sensitivity of the pressure sensor, it is preferable for the film portion 120 to be largely bent in response to a weak external pressure. Here, in the process of forming the film portion 120, the film portion 120 may have residual stress. If the film portion 120 has residual stress, the spring constant of the film portion 120 may increase depending on the amount of the stress, which may decrease the deformation of the film portion 120 in response to the external pressure. This may not provide a high sensitivity pressure sensor.

The residual stress in the film portion 120 may also be adjusted by the material selection or the deposition condition (such as the process gas pressure or the substrate bias condition) or the like. Note, however, that if the material is selected from a material group that has a Young's modulus providing a large deformation in response to the external pressure, it may be difficult to make the residual stress around zero only by adjusting the deposition condition.

Here, the method of manufacturing a pressure sensor according to this embodiment may adjust the internal stress of the film portion 120 and provide strain to the film portion 120 to reduce the above residual stress. Therefore, without depending on the material of the film portion 120, the curvature of the substrate in the bended deposition may freely control the residual stress value. This may increase the amount of deformation of the film portion 120 in response to the external pressure to provide a highly sensitive pressure sensor.

Note that in FIG. 50, step S340 may manufacture a strain detecting element in a method generally similar to the method described in first embodiment. Note, however, that step S340 need not necessarily bend the substrate 110.

Figure 53:
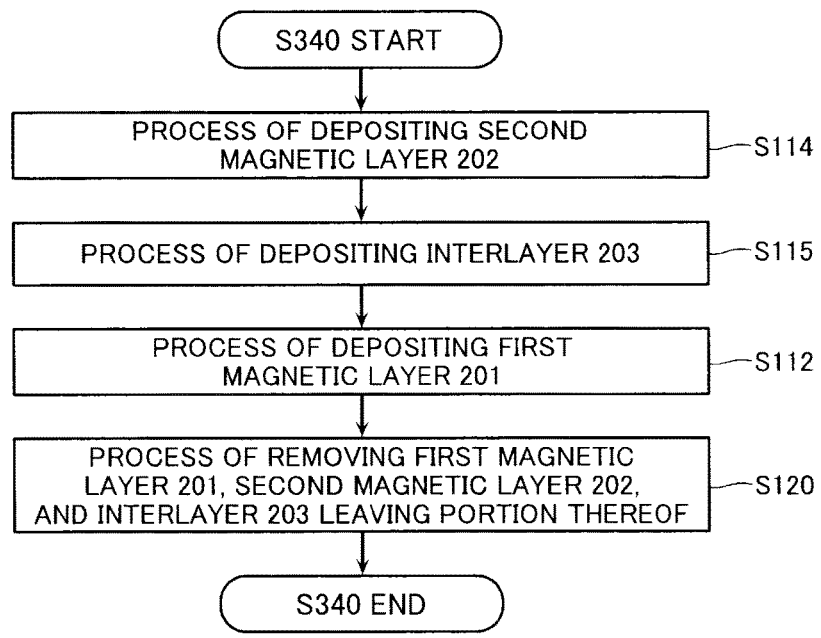
FIG. 53 is a schematic flowchart showing an example of the method of manufacturing the strain detecting element according to the embodiment.
Figure 54:
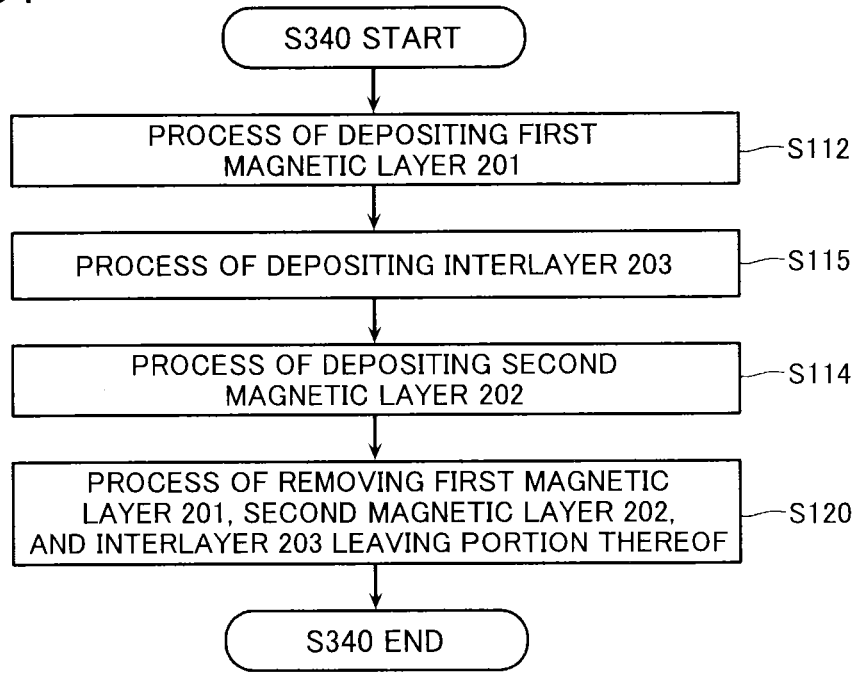
FIG. 54 is a schematic flowchart showing a method of manufacturing another strain detecting element according to the embodiment.

For example, the strain detecting element may be manufactured by the methods shown in FIG. 53 and FIG. 54. FIG. 53 and FIG. 54 are each flowcharts of showing some of processes of manufacturing a strain detecting element. FIG. 53 and FIG. 54 show processes that do not include the process of bending the substrate 110.

Specifically, in the example shown in FIG. 53, step S340 includes the process of depositing the second magnetic layer 202 (step S114), the process of depositing the intermediate layer 203 (step S115), the process of depositing the first magnetic layer 201 (step S112), and the process of removing the first magnetic layer 201, the second magnetic layer 202, and the intermediate layer 203 leaving a portion thereof (step S120).

In addition, in the example shown in FIG. 54, step S340 includes the process of depositing the first magnetic layer 201 (step S112), the process of depositing the intermediate layer 203 (step S115), the process of depositing the second magnetic layer 202 (step S114), and the process of removing the first magnetic layer 201, the second magnetic layer 202, and the intermediate layer 203 leaving a portion thereof (step S120).

Note that the processes shown in step S112, step S114, and step S115 may be performed similarly to the processes as described with reference to FIG. 26, FIGS. 27A, 27B, 27C, 27D, 27E, 27F, 27G, 27H, 27I, 27J, 27K, 27L, 27M, 27N and 27O. In addition, the process shown in step S120 may be performed similarly to the process as described with reference to FIG. 24 and FIG. 25D.

In addition, for example, the method of manufacturing a pressure sensor according to this embodiment may be combined with the method of manufacturing a pressure sensor according to the first or second embodiment. This may manufacture a pressure sensor that has the film portion 120 having reduced residual stress and a strain detecting element having a large gauge factor, and thus may manufacture a pressure sensor having even higher pressure sensitivity.

Fourth Embodiment

Figure 55:
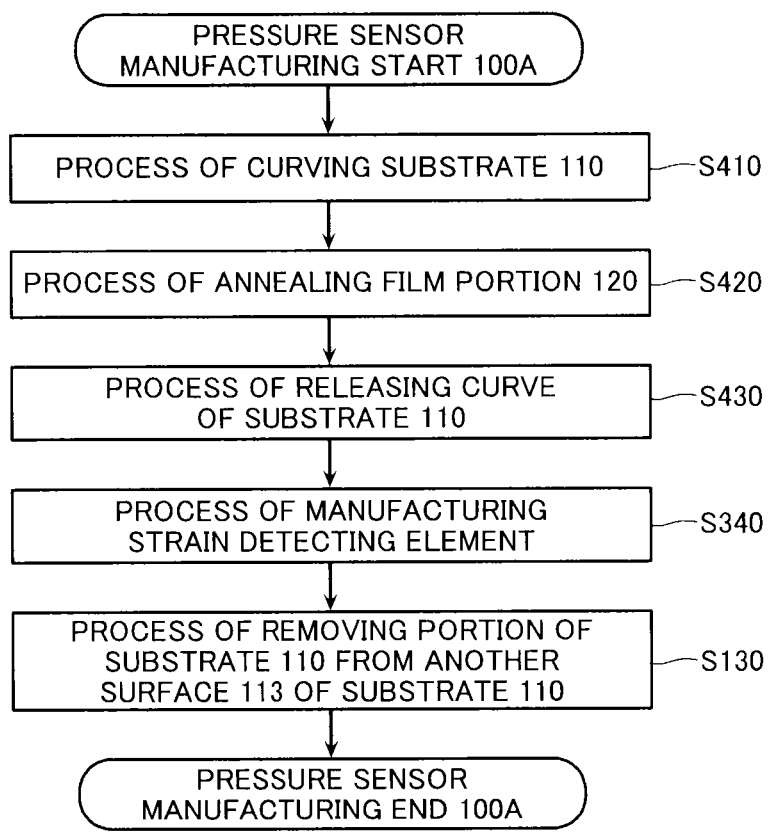
FIG. 55 is a schematic flowchart showing a method of manufacturing a pressure sensor according to a fourth embodiment.

Next, with reference to FIG. 55 to FIG. 57F, a method of manufacturing a pressure sensor according to a fourth embodiment will be described. FIG. 55 is a flowchart of showing some of the method of manufacturing a pressure sensor according to this embodiment. FIGS. 56A, 56B, 56C, 56D, 56E and 56F and FIGS. 57A, 57B, 57C, 57D, 57E and 57F are schematic side views for illustrating the method of manufacturing a pressure sensor according to this embodiment. Note that FIGS. 56A, 56B, 56C, 56D, 56E and 56F and FIGS. 57A, 57B, 57C, 57D, 57E and 57F show examples where the substrate 110 is bended isotropically (spherically). This embodiment bends the substrate 110 in the Z direction around a predetermined point.

The third embodiment deposits, as shown in FIGS. 51A, 51B, 51C, 51D, 51E and 51F or FIGS. 52A, 52B, 52C, 52D 52E and 52F for example, the film portion 120 with the substrate 110 bended to adjust the internal stress of the film portion 120 and provide strain. In contrast, the method of manufacturing a pressure sensor according to this embodiment anneals, as shown in FIG. 55 to FIG. 57F, the film portion 120 with the substrate 110 bended to adjust the internal stress of the film portion 120 and provide strain.

Specifically, as shown in FIG. 55, a method of manufacturing a pressure sensor according to this embodiment includes the process of bending the substrate 110 (step S410), the process of annealing the film portion 120 (step S420), the process of releasing the bend of the substrate 110 (step S430), the process of manufacturing the strain detecting element (step S340), and the process of removing a portion of the substrate 110 from another surface 113 of the substrate 110 (step S130). Note that the process shown in step S130 may be performed similarly to the process described with reference to FIG. 24 and FIG. 25E, and the process in step S340 may be performed similarly to the process described with reference to FIG. 53 and FIG. 54. In addition, other layer may be formed between the substrate 110 and the film portion 120.

Figure 56A:
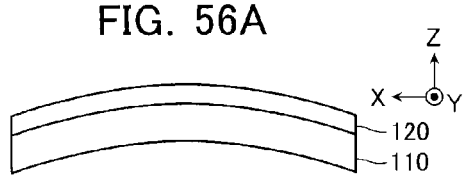
FIGS. 56A, 56B, 56C, 56D, 56E and 56F are schematic cross-sectional views showing the manufacturing method.
Figure 56D:
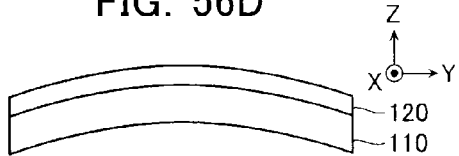
Figure 56B:
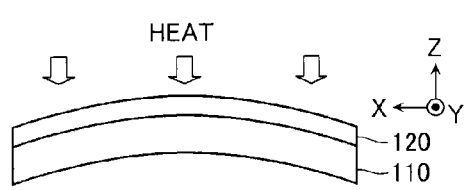
Figure 56E:
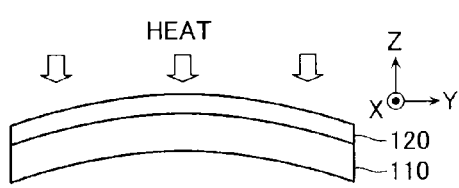
Figure 56C:
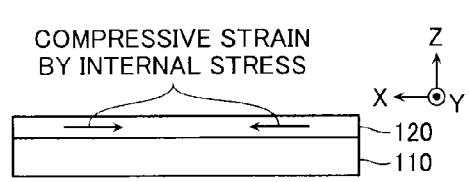
Figure 56F:
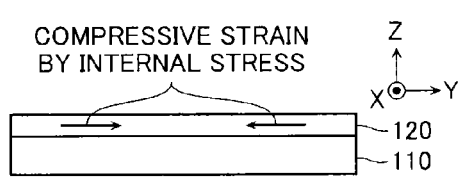

For example, in the manufacturing method according to this embodiment, as shown in FIGS. 56A and 56D, step S410 may convexly bend the substrate 110 having the film portion 120 formed thereon, and as shown in FIGS. 56B and 56E, step S420 may anneal the film portion 120. In this case, the film portion 120 experiences little stress with the substrate 110 convexly bended. Therefore, as shown in FIGS. 56C and 56F, if step S430 releases the bend of the substrate 110, the film portion 120 experiences isotropical compressive strain due to the internal stress.

Figure 57A:
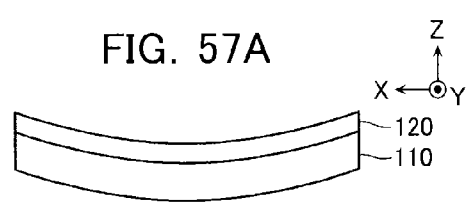
FIGS. 57A, 57B, 57C, 57D, 57E and 57F are schematic cross-sectional views showing the manufacturing method.
Figure 57D:
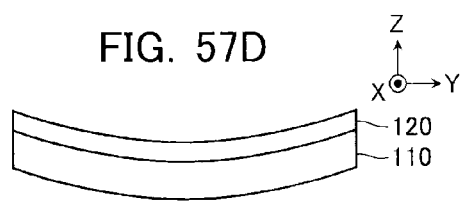
Figure 57B:
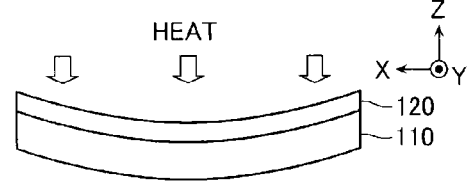
Figure 57E:
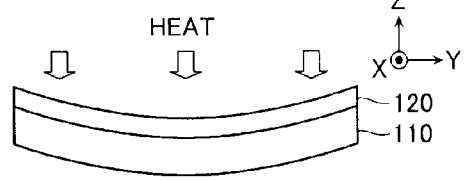
Figure 57C:
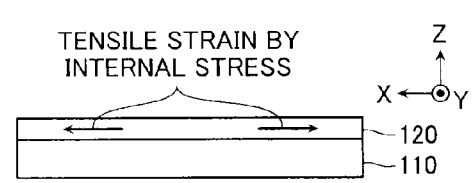
Figure 57F:
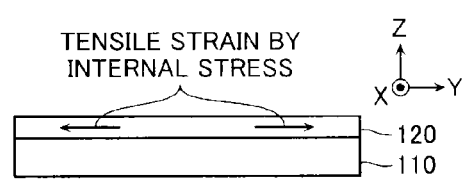

In addition, in the manufacturing method according to this embodiment, as shown in FIGS. 57A and 57D, step S410 may concavely bend the substrate 110, and as shown in FIGS. 57B and 57E, step S420 may anneal the film portion 120. In this case, the film portion 120 experiences little stress with the substrate 110 concavely bended. Therefore, as shown in FIGS. 57C and 57F, if step S430 releases the bend of the substrate 110, the film portion 120 experiences isotropic tensile strain due to the internal stress.

In the method of manufacturing a pressure sensor according to this embodiment, the internal stress of the film portion 120 may be adjusted to provide strain to the film portion 120, thus reducing the above residual stress. Therefore, without depending on the material of the film portion 120, the curvature of the substrate in the bended deposition may freely control the residual stress value. This may increase the amount of deformation of the film portion 120 in response to the external pressure to provide a highly sensitive pressure sensor.

Note that for example, the method of manufacturing a pressure sensor according to this embodiment may be combined with the method of manufacturing a pressure sensor according to the first or second embodiment. This may manufacture a pressure sensor that has the film portion 120 having reduced residual stress and a strain detecting element having a large gauge factor, and thus may manufacture a pressure sensor having even higher pressure sensitivity.

Fifth Embodiment

Figure 58:
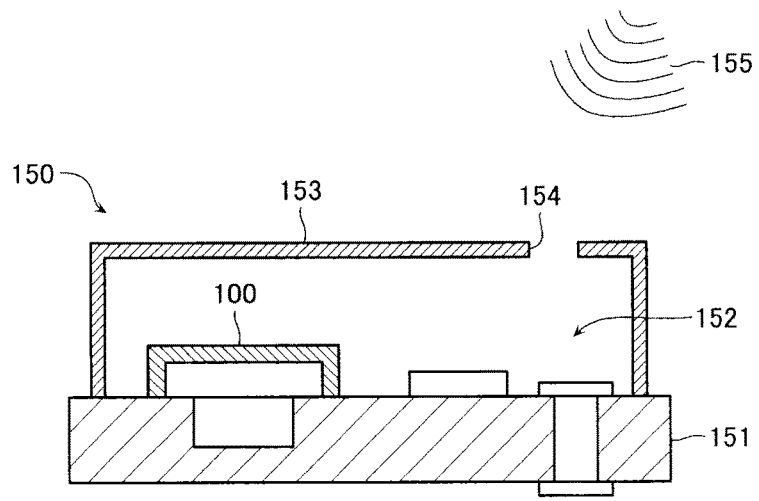
FIG. 58 is a schematic cross-sectional view showing the configuration of a microphone according to a fifth embodiment.

Next, with reference to FIG. 58, a fifth embodiment will be described. FIG. 58 is a schematic cross-sectional view showing the configuration of a microphone 150 according to this embodiment. The pressure sensor 100 manufactured by the method according to any of the first to fourth embodiments may be mounted in, for example, a microphone.

The microphone 150 according to this embodiment has a printed circuit board 151 having the pressure sensor 100, an electron circuit 152 mounted on the printed circuit board 151, and a cover 153, the cover 153 and the printed circuit board 151 together covering the pressure sensor 100 and the electron circuit 152. The pressure sensor 100 is a pressure sensor manufactured by the manufacturing method according to any of the first to fourth embodiments.

The cover 153 has an acoustic hole 154. A sound wave 155 enters the acoustic hole 154. If the sound wave 155 enters the cover 153, the pressure sensor 100 senses the sound wave 155. The electron circuit 152 conducts, for example, a current in the strain detecting element mounted in the pressure sensor 100, thus detecting the resistance change of the pressure sensor 100. In addition, the electron circuit 152 may amplify the current value with a device such as an amplification circuit.

As the pressure sensor manufactured by the method according to any of the first to fourth embodiments has high sensitivity, the microphone 150 having the pressure sensor may detect the sound wave 155 with high sensitivity.

6. Sixth Embodiment

Figure 59:
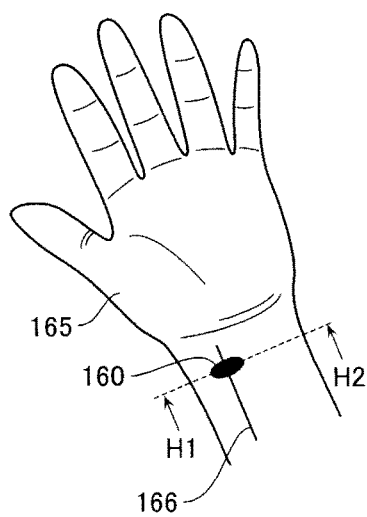
FIG. 59 is a schematic diagram showing the configuration of a blood pressure sensor according to a sixth embodiment.
Figure 60:
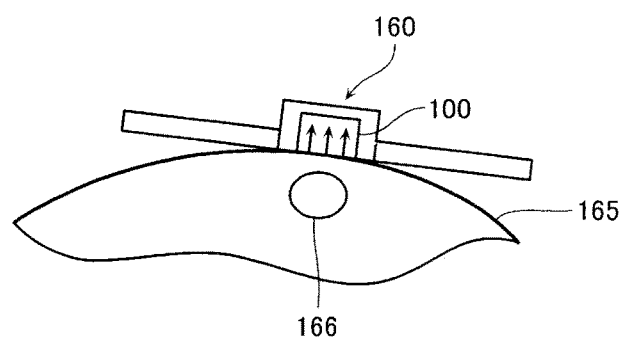
FIG. 60 is a schematic cross-sectional view of the blood pressure sensor as viewed from the line H1-H2.

Next, with reference to FIG. 59 and FIG. 60, a sixth embodiment will be described. FIG. 59 is a schematic diagram showing the configuration of a blood pressure sensor 160 according to the sixth embodiment. FIG. 60 is a schematic cross-sectional view of the blood pressure sensor 160 along the H1-H2. The pressure sensor 100 manufactured by the method according to any of the first to fourth embodiments may be mounted in, for example, a blood pressure sensor 160.

As shown in FIG. 59, the blood pressure sensor 160 is attached to, for example, an arm 165 over an artery 166 of a person. In addition, as shown in FIG. 60, the blood pressure sensor 160 mounts the pressure sensor 100 manufactured by the method according to any of the first to fourth embodiments, and thus the blood pressure sensor 160 may measure the blood pressure.

As the pressure sensor manufactured by the method according to any of the first to fourth embodiments has high sensitivity, the blood pressure sensor 160 having the pressure sensor may detect the blood pressure continuously with high sensitivity.

7. Seventh Embodiment

Figure 61:
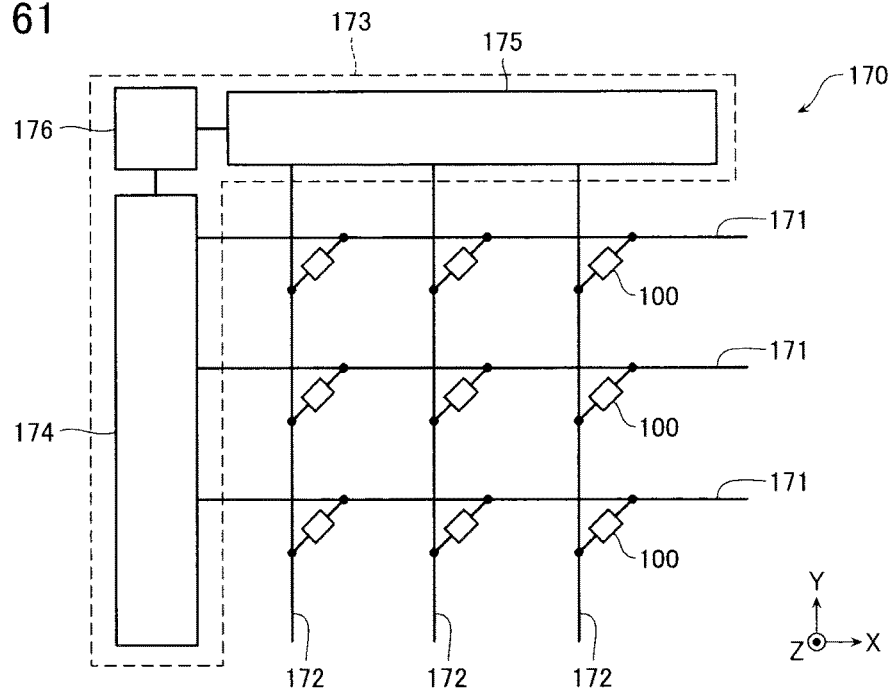
FIG. 61 is a schematic circuit diagram showing the configuration of a touch panel according to a seventh embodiment.

Next, with reference to FIG. 61, a seventh embodiment will be described. FIG. 61 is a schematic circuit diagram showing the configuration of a touch panel 170 according to the seventh embodiment. The touch panel 170 is mounted on at least one of inside and outside of a not-shown display.

The touch panel 170 has a plurality of pressure sensors 100 disposed in a matrix, a plurality of first wiring lines 171 disposed in the Y direction, each first wiring lines 171 being connected to first ends of the pressure sensors 100 in the X direction, a plurality of second wiring lines 172 disposed in the X direction, each second wiring lines 172 being connected to second ends of the pressure sensors 100 in the Y direction, and a control portion 173 controlling the first and second wiring lines 171 and 172. These pressure sensors 100 are pressure sensors manufactured by any of the manufacturing methods according to the first to fourth embodiments.

In addition, the control portion 173 has a first control circuit 174 controlling the first wiring line 171, a second control circuit 175 controlling the second wiring line 172, and a third control circuit 176 controlling the first and second control circuits 174 and 175.

For example, the control portion 173 conducts a current in the pressure sensors 100 via the first and second wiring lines 171 and 172. Here, if a not-shown touch surface is pressed, each pressure sensor 100 changes the resistance of the strain detecting element in response to the pressure. The control portion 173 detects the resistance change to locate the pressure sensor 100 that has detected the pressing pressure.

As the pressure sensors 100 manufactured by the method according to any of the first to fourth embodiments have high sensitivity, the touch panel 170 mounting the pressure sensors 100 may detect the pressing pressure with high sensitivity. In addition, the pressure sensors 100 are compact and thus the touch panel 170 may be manufactured with high resolution.

Note that the touch panel 170 may have, in addition to the pressure sensors 100, a detection element for detecting touch.

Other Application Examples

With reference to the specific examples, some application examples of the pressure sensor 100 manufactured by the method according to any of the first to fourth embodiments are described above. However, the pressure sensor 100 may be applied, in addition to the fifth to seventh embodiments, to various pressure sensor devices such as an atmosphere sensor and a tire pressure sensor.

In addition, the specific configurations of the elements, such as the film portion, the strain detecting element, the first magnetic layer, the second magnetic layer, and the intermediate layer, which are included in the strain detecting element, the pressure sensor 100, the microphone 150, the blood pressure sensor 160, and the touch panel 170, may be within the scope of the present invention as long as those skilled in the art may select them as appropriate from the well-known scope to implement them similarly and obtain similar effects.

In addition, any two or more elements of each specific example that are combined in a technically possible range may also be included within the scope of present invention as long as they comprehend the spirit of the present invention.

In addition, on the basis of the strain detecting element, the pressure sensor 100, the microphone 150, the blood pressure sensor 160, and the touch panel 170 described above in the embodiments of the present invention, those skilled in the art may implement, with design changes as appropriate, the strain detecting element, the pressure sensor 100, the microphone 150, the blood pressure sensor 160, and the touch panel 170, all of which are within the scope of the present invention as long as they comprehend the spirit of the present invention.

8. Eighth Embodiment

Figure 62:
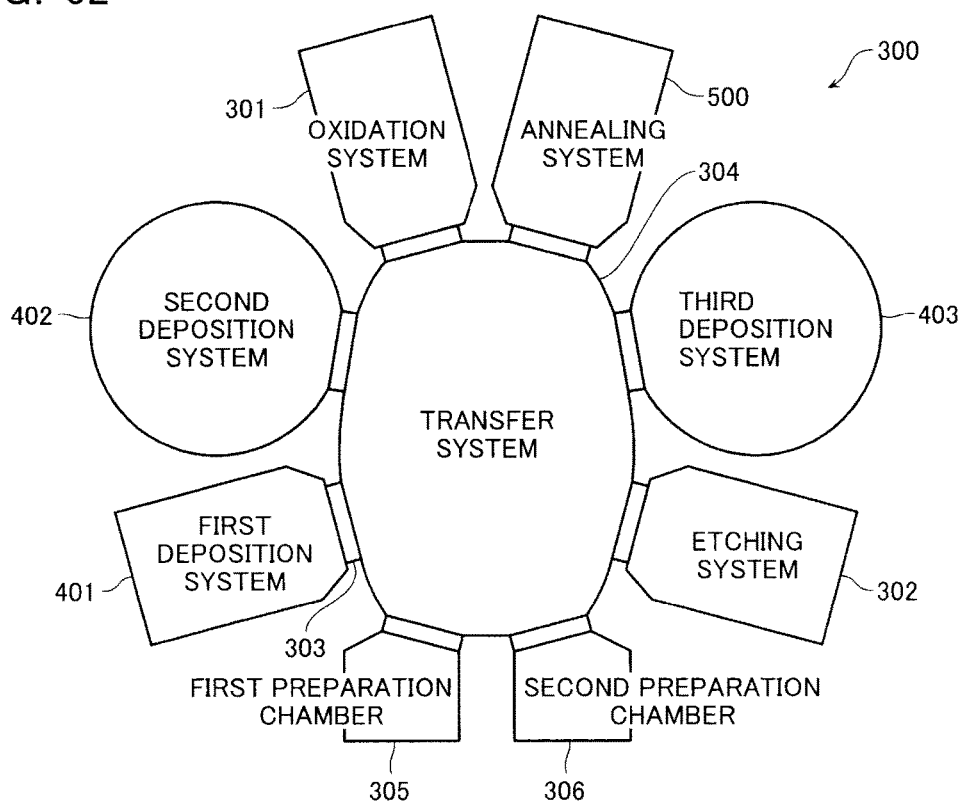
FIG. 62 is a schematic diagram showing the configuration of a pressure sensor manufacturing system according to an eighth embodiment.

Next, with reference to FIG. 62, an eighth embodiment will be described. FIG. 62 is a schematic diagram showing the configuration of a pressure sensor manufacturing system 300 according to the eighth embodiment. The pressure sensor manufacturing system 300 is configured, for example, such that it may bend the substrate 110 to achieve the manufacturing methods shown in the first to fourth embodiments.

The pressure sensor manufacturing system 300 has a first deposition device 401, a second deposition device 402, a third deposition device 403, an annealing device 500, an oxidation device 301, an etching device 302, a transfer device 304 connected to each device via a gate valve 303, a first preparation chamber (load lock chamber) 305, and a second preparation chamber (load lock chamber) 306.

Each device has a vacuum chamber and a vacuum pump. Each device is always maintained under vacuum except the first and second preparation chambers 305 and 306. Note that if one of the first and second preparation chambers 305 and 306 functions as both of them, the other may be omitted. In addition, the gate valve 303 is closed except when the substrate is transferred.

The first, second, and third deposition devices 401, 402, and 403 are deposition devices to perform deposition by a method such as sputtering or the like.

The annealing device 500 is used, for example, to provide heat to a surface of a thin film to anneal the thin film, the thin film being deposited in the first, second, and third deposition devices 401, 402, and 403. The annealing device 500 has, for example, a structure having a heating lamp opposite to a substrate stage or a structure having a resistance heating heater adjacent to a substrate support stage.

The oxidation device 301 supplies, for example, an oxygen gas to an oxidation chamber evacuated to vacuum and thus oxidates a surface of a thin film deposited in the deposition chambers, thus forming oxide. The oxidation chamber may have a structure of natural oxidation by simply supplying oxygen as well as plasma oxidation by plasmatizing oxygen using devices such as an ion beam gun and a reverse sputter etching mechanism. Otherwise, the oxidation chamber may have a structure of ion beam assist oxidation by supplying oxygen to the oxidation chamber while irradiating a plasmatized inert gas (such as Ar) to the substrate surface through an ion beam gun or the like.

The etching device 302 has, for example, a device such as a reverse sputter etching mechanism for removing the oxide and contamination on the substrate surface.

The transfer device 304 has a not-shown substrate transfer robot. The substrate transfer robot loads or removes the substrate from a predetermined device. The substrate transfer robot may be operated by a computer program.

The first preparation chamber 305 is used to introduce the substrate into the transfer device 304. Specifically, if the substrate is introduced into the transfer device 304, the gate valve 303 shuts off the first preparation chamber 305 and the transfer device 304, and the atmosphere in the first preparation chamber 305 is set to the atmospheric pressure. Next, the substrate is introduced into the first preparation chamber 305, and the first preparation chamber 305 is evacuated to vacuum. After the first preparation chamber 305 is evacuated to vacuum, the gate valve 303 is opened, and the substrate is introduced into the transfer device 304.

The second preparation chamber 306 is used to remove the substrate from the transfer device 304. Specifically, the substrate is removed by first opening the gate valve 303 and transferring the substrate from the transfer device 304 to the second preparation chamber 306. Then, the gate valve 303 shuts off the second preparation chamber 306 and the transfer device 304, and the second preparation chamber 306 is set to the atmospheric pressure. After the second preparation chamber 306 is sufficiently close to the atmospheric pressure, the substrate may be removed.

Note that the pressure sensor manufacturing system 300 may have other devices such as a process device for other processes than the sputtering deposition. For example, the pressure sensor manufacturing system 300 may have a process device for removing the substrate or a thin film formed on the substrate, with plasma, an ion beam, an atom beam, a molecule beam, or a gas cluster beam. In addition, the pressure sensor manufacturing system 300 may also have a process device for forming a thin film on the substrate or on a thin film formed on the substrate by the chemical vapor deposition, a process chamber for chemical reaction of the substrate or a thin film formed on the substrate in an atmosphere of a gas, natural activity species, ions, or a mixture thereof, or a process device for heating or cooling or heating and cooling the substrate.

Figure 63:
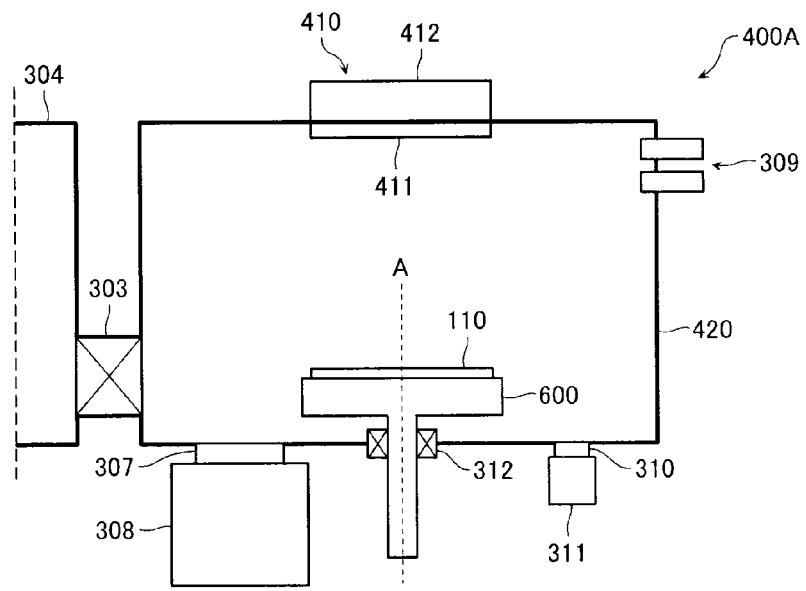
FIG. 63 is a schematic side view showing the configuration of a deposition system according to the embodiment.
Figure 64:
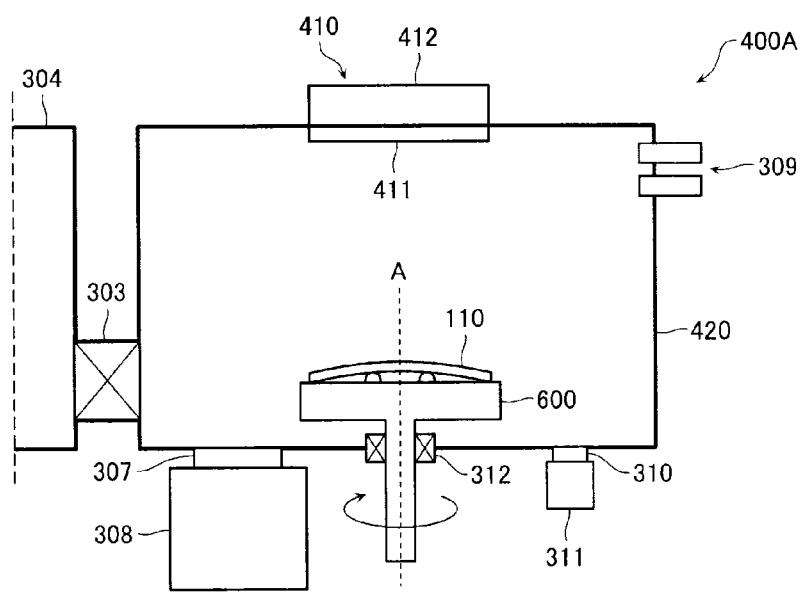
FIG. 64 is a schematic side view showing the operation of the deposition system according to the embodiment.

Next, with reference to FIG. 63 and FIG. 64, a description is given of an example configuration 400A of the first deposition device 401, the second deposition device 402, or the third deposition device 403. FIG. 63 is a schematic cross-sectional view for showing the deposition device 400A. FIG. 64 is a schematic cross-sectional view for illustrating the operation of the deposition device 400A.

As shown in FIG. 63, the deposition device 400A have a substrate holder 600 configured to be able to support and bend the substrate 110, a deposition portion 410 depositing on the substrate 110 supported on the substrate holder 600, and a deposition chamber 420 containing the substrate holder 600 and the deposition portion 410.

The deposition device 400A may perform, as shown in FIG. 63, the sputtering process without the substrate 110 bended, and may also perform, as shown in FIG. 64, the sputtering process with the substrate 110 bended. In addition, although in the example shown in FIG. 64, the substrate 110 is bended convexly, it may also be bended concavely.

As shown in FIG. 63, the deposition portion 410 is at a predetermined position opposite to the substrate holder 600 and has a sputtering cathode 412 installed with a sputtering target 411. The sputtering target 411 is installed on the sputtering cathode 412 via a backing plate or the like. In addition, a magnet for magnetron sputtering is preferably disposed on the back side of the sputtering surface of the sputtering target 411.

For example, the deposition portion 410 introduces, with the deposition chamber 420 supplied with an inert gas (such as Ar), DC or RF power to the sputtering cathode 412 to generate a plasma near the sputtering cathode 412, to sputter the sputtering target 411, and to deposit the material of the sputtering target 411 on the substrate 110.

The substrate holder 600 is configured to be able to support and bend the substrate 110. In addition, the substrate holder 600 is attached to the deposition chamber 420 rotatably around the rotating axis A in FIG. 63 by a rotational drive mechanism 312. Thus, a thin film deposited on the substrate 110 may have a good distribution in the substrate plane.

The deposition chamber 420 is a vacuum chamber and connected to the transfer device 304 via the gate valve 303. In addition, the deposition chamber 420 has a vacuum pump 308 attached thereto via a valve 307, a gas supply opening 309, and a vacuum gauge 311 attached thereto via a valve 310.

The vacuum pump 308 may have a combination of pumps such as, for example, a turbo molecular pump, a cryopump, and a dry pump.

The gas supply opening 309 is connected to a gas supply system (cylinder) to supply an inert gas such as argon (Ar), a mass flow controller to control the flow rate of the gas, and a stop valve to shut off/start the gas supply. The gas supply opening 309 supplies the gas in the deposition chamber 420.

Figure 65:
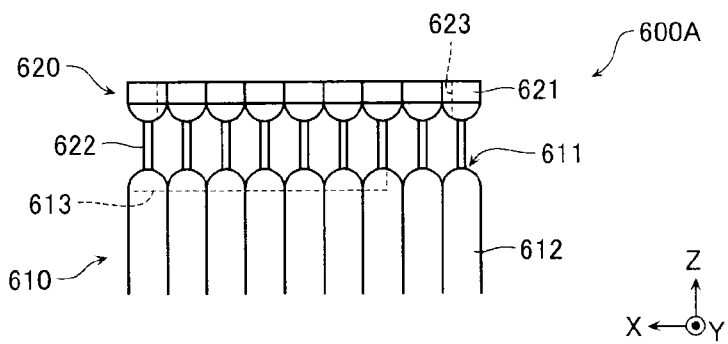
FIG. 65 is a schematic side view showing the configuration of a portion of a substrate holder according to the embodiment.
Figure 66:
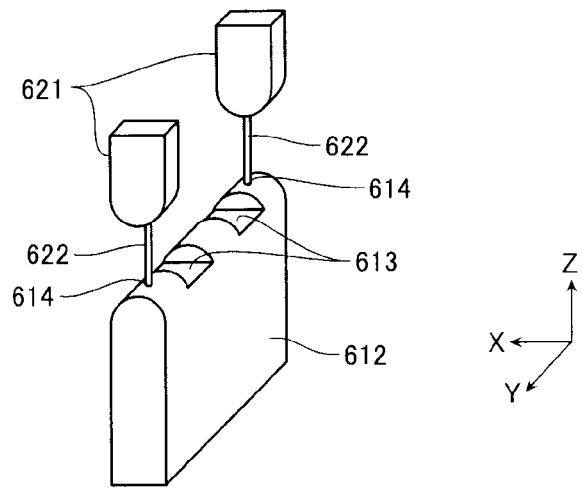
FIG. 66 is a schematic perspective view showing the configuration of a portion of the substrate holder.
Figure 67:
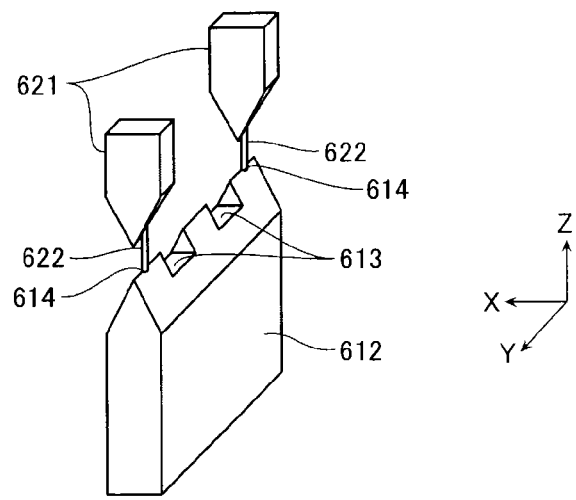
FIG. 67 is a schematic perspective view showing the configuration of a portion of another substrate holder according to the embodiment.

Next, with reference to FIG. 65 to FIG. 69, an example configuration 600A of the substrate holder 600 will be described. FIG. 65 is a schematic side view showing the configuration of a portion of the substrate holder 600A. FIG. 66 is a schematic perspective view showing the configuration of a portion of the substrate holder 600A. FIG. 67 is a schematic perspective view showing another example configuration of the substrate holder 600A. The substrate holder 600A bends the substrate around a predetermined line on the substrate.

As shown in FIG. 65, the substrate holder 600A has a support mechanism 610 that supports the substrate on a support surface 611 and a holding mechanism 620 that holds the substrate on the support surface 611, the support mechanism 610 and the holding mechanism 620 together by sandwiching the substrate. In addition, the holding mechanism 620 has a deposition window 623 formed therein. Via the deposition window 623, the support surface 611 on which the substrate is disposed is exposed to the deposition portion 410.

As shown in FIG. 65, the support mechanism 610 has a plurality of movable support members 612 arranged in the X direction. The movable support members 612 are independently operatable in the direction generally perpendicular to the support surface 611 (Z direction). The holding mechanism 620 has a plurality of movable holding members 621 arranged in the X direction. The movable holding members 621 are supported on the respective movable support members 612 via respective support pins 622. The movable holding members 621 are independently operatable in the direction (Z direction) generally perpendicular to the support surface 611. The substrate holder 600A may adjust the positions of the movable support members 612 and the movable holding members 621 in the Z direction to bend the sandwiched substrate in the X direction around a predetermined line extending in the Y direction.

As shown in FIG. 66, each movable support member 612 extends in the Y direction, and has opposite end portions provided with respective support pin insertion through-holes 614. In addition, each support pin insertion through-hole 614 has a support pin 622 inserted therethrough for supporting one movable holding member 621. A plurality of support pins 622 are connected, via the respective support pin insertion through-holes 614, to respective not-shown elevating mechanisms. The not-shown elevating mechanisms may move up and down the respective support pins 622 independently of the movable support member 612.

In addition, as shown in FIG. 66, the top surface of each movable support member 612 and the bottom surface of each movable holding member 621 have a round knife edge structure formed in a curved surface. Note that as shown in FIG. 67, the top surface of each movable support member 612 and the bottom surface of each movable holding member 621 may have a knife edge structure formed in an angular shape.

Figure 68:
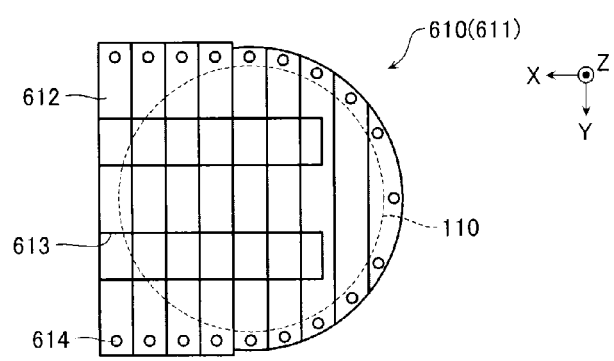
FIG. 68 is a schematic plan view showing the configuration of a portion of the substrate holder according to the embodiment.

FIG. 68 is a schematic plan view showing the configuration of the support mechanism 610. The support surface 611 of the support mechanism 610 has the top surfaces of the movable support members 612, the top surfaces being formed in a curved surface or an angular shape. In addition, the substrate 110 is disposed in the dotted line portion in FIG. 68. Specifically, the support pin insertion through-holes 614 are formed avoiding the portion where the substrate 110 is disposed. In addition, on the support surface 611 of the support mechanism 610, a groove 613 is formed, through which a portion of a robot arm passes.

Figure 69:
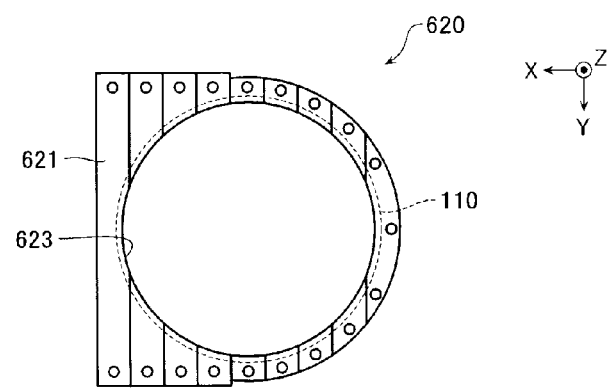
FIG. 69 is a schematic plan view showing the configuration of a portion of the substrate holder.

FIG. 69 is a schematic plan view showing the configuration of the holding mechanism 620. The holding mechanism 620 is opposite to the support surface 611 of the support portion 610 via the bottom surfaces of the movable holding members 621, the bottom surfaces being formed in a curved surface or an angular shape. The holding mechanism 620 and the support surface 611 together sandwich the substrate 110. In addition, the holding mechanism 620 has a central portion in which the deposition window 623 is formed. The substrate is exposed to the deposition portion 410 via the deposition window 623. In other words, some of the movable holding members 621 have a configuration of being separated in the Y direction. Therefore, the deposition is performed on the portion of the top surface of the substrate 110 that is exposed from the deposition window 623. In addition, the deposition window 623 is formed such that the holding mechanism 620 may cover at least a portion of the substrate 110 to sandwich the substrate 110.

Note that although FIG. 65 to FIG. 69 show that the support mechanism 610 has nine movable support members 612 and the holding mechanism 620 has nine movable holding members 621, they are for illustration purpose and may be modified as appropriate. Here, in order to bend the substrate with a uniform curvature radius in the plane, the substrate holder 600A preferably has four or more sets of the movable support member 612 and the movable holding member 621.

Figure 70:
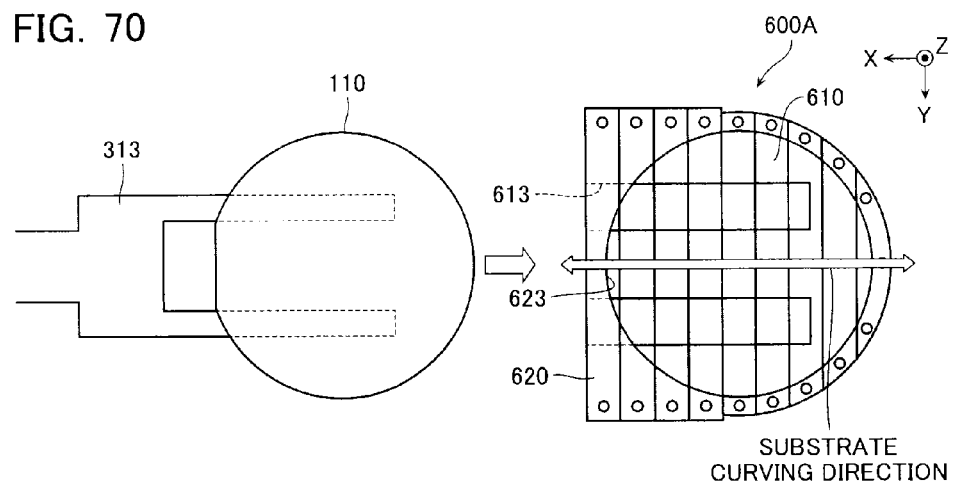
FIG. 70 is a schematic plan view for illustrating the operation of the substrate holder according to the embodiment.
Figure 71:
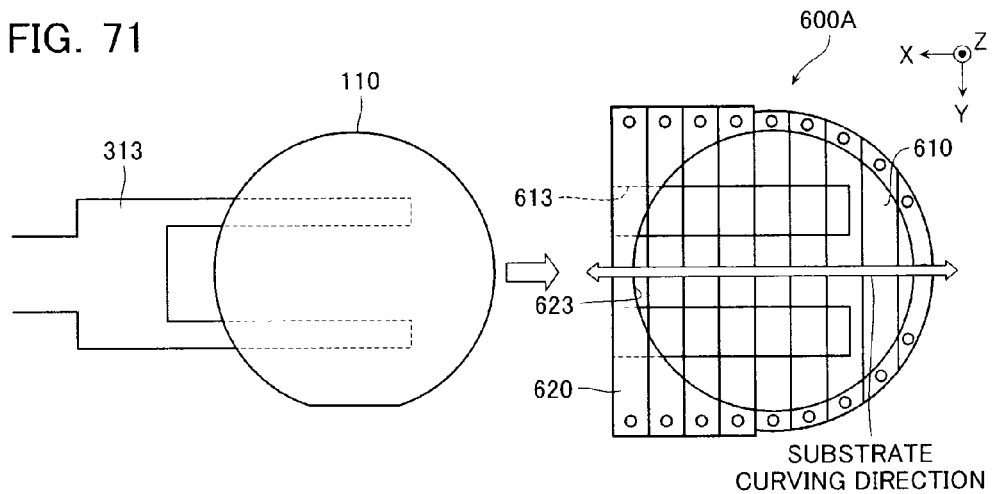
FIG. 71 is a schematic plan view for illustrating the operation of the substrate holder.

Next, with reference to FIG. 70 to FIG. 82, usage modes of the substrate holder 600A will be described. FIG. 70 and FIG. 71 are schematic plan views for illustrating the usage modes of the substrate holder 600A. FIG. 72 to FIG. 82 are schematic side views for illustrating the usage modes of the substrate holder 600A.

First, as shown in FIG. 70 or FIG. 71, the substrate 110 is installed on a robot arm 313. The robot arm 313 moves, when inserting the substrate 110 into the substrate holder 600, along the groove 613 provided on the support mechanism 610.

As shown in FIG. 70 or FIG. 71, the orientation flat direction of the substrate 110 may be adjusted by a not-shown aligner system provided in the transfer device 304. For example, the orientation flat direction may be set on the robot arm 313 as shown in FIG. 70 or FIG. 71. As described above, the orientation flat direction of the substrate 110 may be changed, when transferring the substrate 110, to freely change the orientation flat direction of the substrate 110 and the direction of the bend of the substrate 110.

Figure 72:
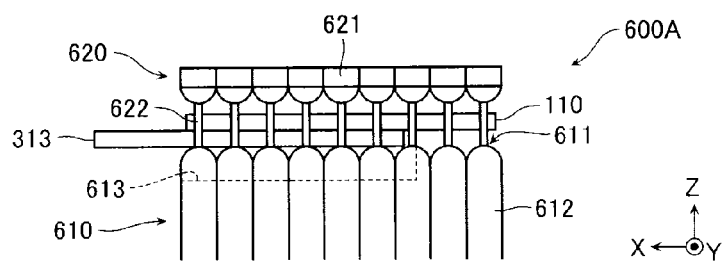
FIG. 72 is a schematic side view for illustrating the operation of the substrate holder.

Next, as shown in FIG. 72, the robot arm 313 is moved along the groove 613 to insert the substrate 110 into the substrate holder 600. In so doing, the positions of the movable support members 612 in the Z direction (height positions) are all aligned, and likewise, the positions in the Z direction (height positions) of the movable holding members 621 are all aligned, and in addition, the support mechanisms 610 and the holding mechanisms 620 are spaced apart to allow the substrate 110 and the robot arm 313 to sufficiently pass therethrough.

Figure 73:
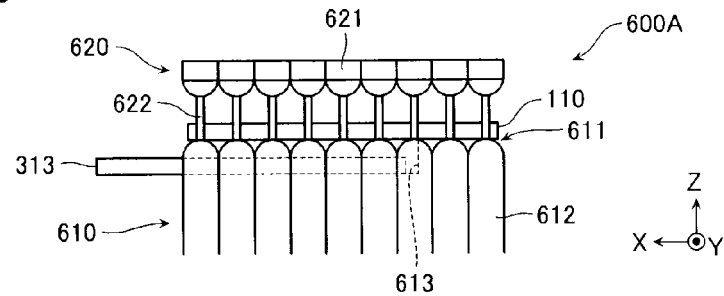
FIG. 73 is a schematic side view for illustrating the operation of the substrate holder.

Next, as shown in FIG. 73, the robot arm 313 is moved in the −Z direction (downward) to install the substrate 110 on the support surface 611 of the support mechanism 610. Note, however, that the support mechanism 610 may also be raised, for example, to install the substrate 110 on the support surface 611. Then, the robot arm 313 is pulled in the X direction along the groove 613.

Figure 74:
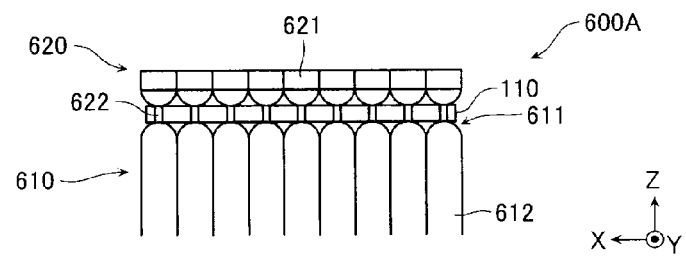
FIG. 74 is a schematic side view for illustrating the operation of the substrate holder.

Next, as shown in FIG. 74, a not-shown elevating mechanism moves down the support pins 622 and the movable holding members 621 to sandwich the substrate 110 by the support mechanism 610 and the holding mechanism 620. Specifically, the substrate 110 is sandwiched by the movable support members 612 and the movable holding members 621 at a plurality of points. Note, however, that the support mechanism 610 may also be raised, for example, to sandwich the substrate 110. If the substrate 110 is subjected to the deposition process without it bended, the deposition process is performed in the state shown in FIG. 74.

Figure 75:
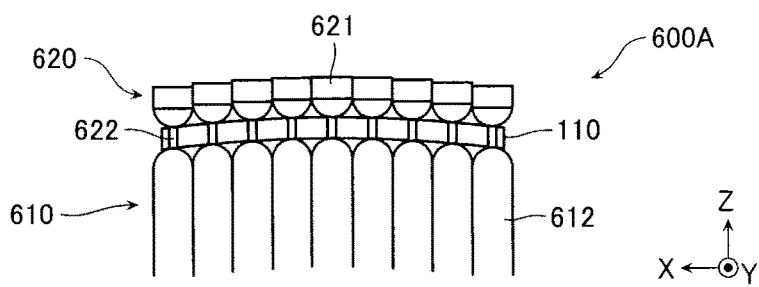
FIG. 75 is a schematic side view for illustrating the operation of the substrate holder.

If the substrate 110 is subjected to the deposition process with it convexly bended, the positions of the movable support members 612 and the movable holding members 621 are individually adjusted to a convexly curved surface, as shown in FIG. 75. Thus, among the points of the substrate 110 sandwiched by the movable support members 612 and the movable holding members 621, the points near the central portion of the substrate 110 are pressed in the Z direction by the movable support members 612 and the points away from the central portion are pressed in the −Z direction by the movable holding members 621, thus bending the substrate 110 convexly.

Figure 76:
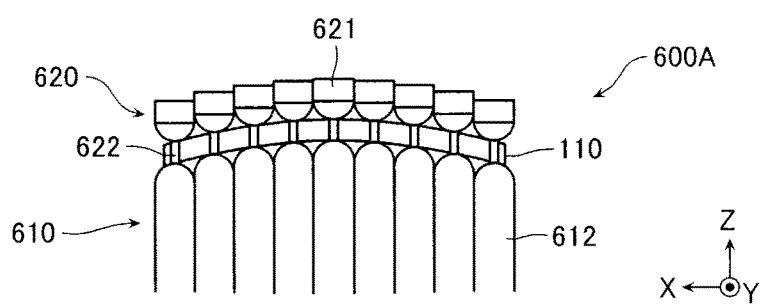
FIG. 76 is a schematic side view for illustrating the operation of the substrate holder.

Note that as shown in FIG. 75 and FIG. 76, the curvature radius at which the substrate 110 is bended or the like may be suitably adjusted by adjusting the positions of the movable support members 612 and the movable holding members 621.

Figure 77:
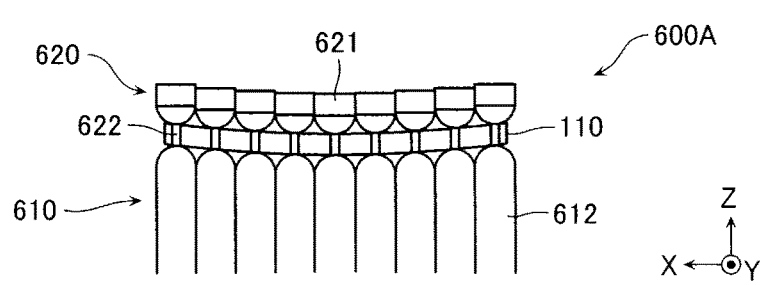
FIG. 77 is a schematic side view for illustrating the operation of the substrate holder.

If the substrate 110 is subjected to the deposition process with it concavely bended, the positions of the movable support members 612 and the movable holding members 621 are individually adjusted to a concave curved surface, as shown in FIG. 77. Thus, among the points of the substrate 110 sandwiched by the movable support members 612 and the movable holding members 621, the points near the central portion of the substrate 110 are pressed in the −Z direction by the movable holding members 621 and the points away from the central portion are pressed in the Z direction by the movable support members 612, thus bending the substrate 110 concavely.

Figure 78:
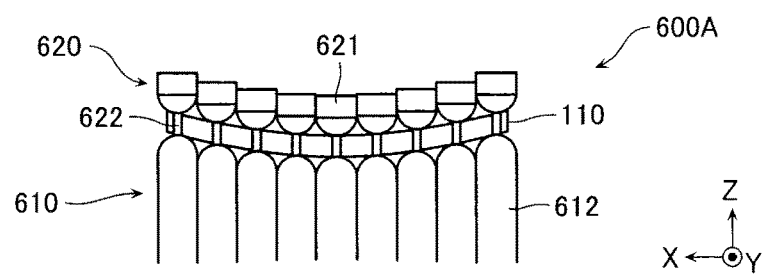
FIG. 78 is a schematic side view for illustrating the operation of the substrate holder.
Figure 79:
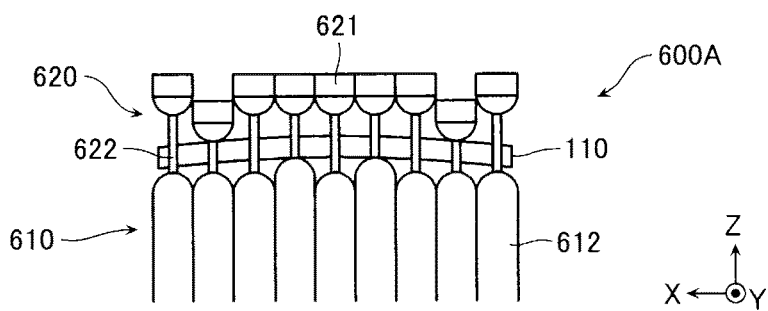
FIG. 79 is a schematic side view for illustrating the operation of the substrate holder.
Figure 80:
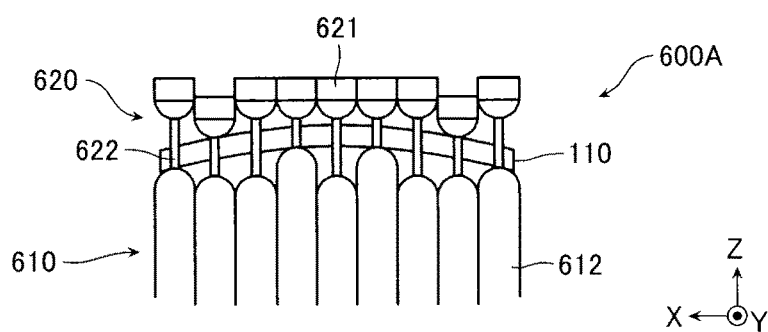
FIG. 80 is a schematic side view for illustrating the operation of the substrate holder.
Figure 81:
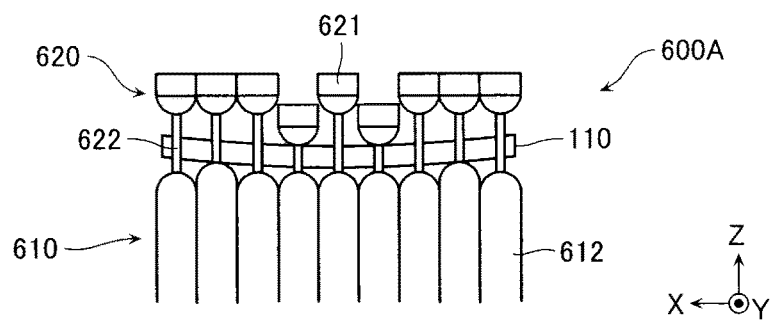
FIG. 81 is a schematic side view for illustrating the operation of the substrate holder.
Figure 82:
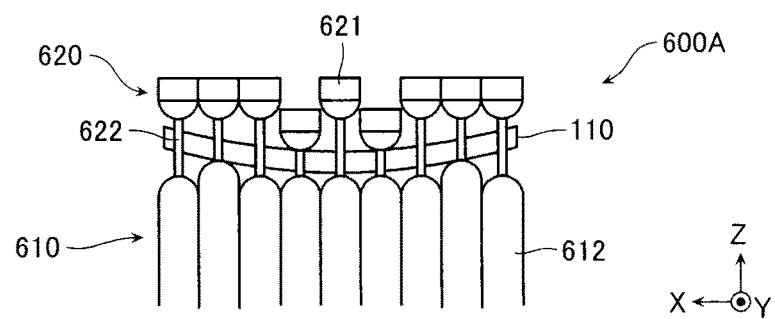
FIG. 82 is a schematic side view for illustrating the operation of the substrate holder.

Note that as shown in FIG. 77 and FIG. 78, the curvature radius at which the substrate 110 is bended or the like may be suitably adjusted by adjusting the positions of the movable support members 612 and the movable holding members 621.

In addition, as shown in FIG. 79 to FIG. 82, only the positions of some of the movable support members 612 and the movable holding members 621 may be adjusted to a curved surface to bend the substrate 110 concavely or convexly at any curvature. In the examples shown in FIG. 79 to FIG. 82, two movable support members 612 and two movable holding member 621 that are all at different positions in the X direction are used to bend the substrate 110 with four-point bending. In addition, for example, the movable support members 612 and the movable holding members 621 that are unused in FIG. 79 to FIG. 82 may be omitted.

Figure 83:
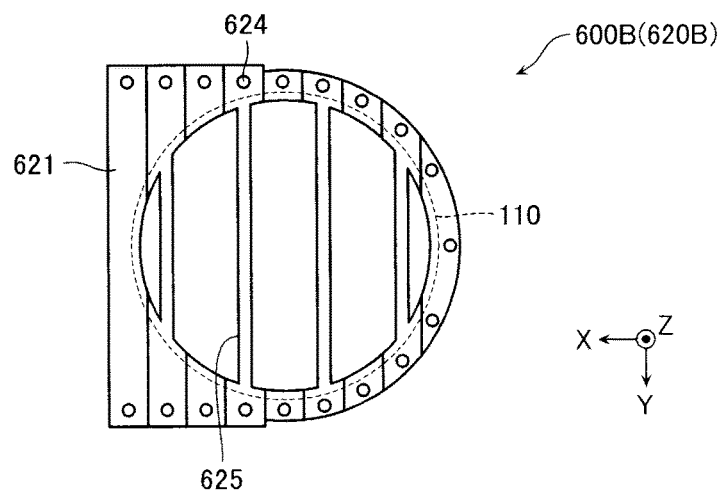
FIG. 83 is a schematic plan view showing a configuration of a portion of another substrate holder according to the embodiment.
Figure 84:
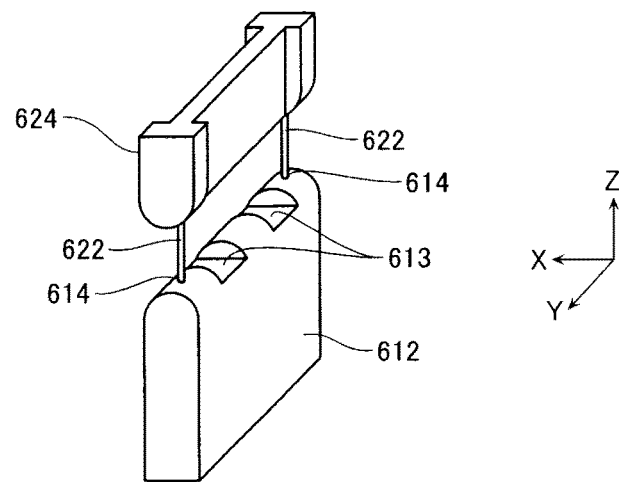
FIG. 84 is a schematic perspective view showing the configuration of a portion of the substrate holder.
Figure 85:
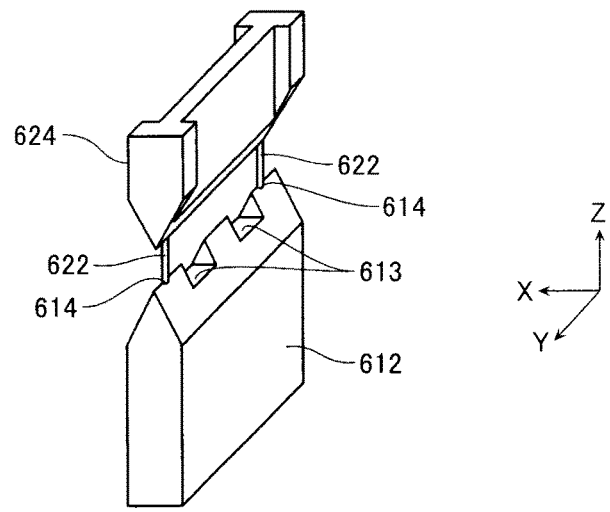
FIG. 85 is a schematic perspective view showing the configuration of a portion of another substrate holder according to the embodiment.

Next, with reference to FIG. 83 to FIG. 85, another example configuration 600B of the substrate holder 600 will be described. FIG. 83 is a schematic plan view showing the configuration of a holding mechanism 620B of the substrate holder 600B. FIG. 84 is a schematic perspective view showing the configuration of a portion of the substrate holder 600B. FIG. 85 is a schematic perspective view showing another example configuration of the substrate holder 600B.

As shown in FIG. 83, the deposition window 623 of the substrate holder 600B has a lattice 625 across the inside of the substrate. Note that the substrate holder 600B is configured generally similarly, in other respects, to the substrate holder 600A shown in FIG. 65 to FIG. 69.

Specifically, as shown in FIG. 83, the holding mechanism 620B of the substrate holder 600B has, at its central portion, the deposition window 623, and the deposition window 623 has a plurality of lattices 625 arranged in the X direction and extending in the Y direction. In addition, the substrate holder 600B replaces some or all of the movable holding members 621 (FIG. 69) separated in the Y direction with movable holding members 624 coupled in the Y direction via the lattices 625.

As shown in FIG. 84, the bottom surface of each movable holding member 624 has a round knife edge structure formed in a curved surface. Note that as shown in FIG. 85, the bottom surface of each movable holding member 624 may have a knife edge structure formed in an angular shape.

The substrate holder 600B puts the lattices 625 on the top surface of the substrate. Therefore, when bending the substrate, a force may be applied to the top surface of the substrate more efficiently, and thus the substrate 110 may be bended more accurately.

Note that if the substrate holder 600B is used, the pressure sensor 100 is formed in a portion different from the exposed portion on the substrate, i.e., the portion in which the lattice 625 is positioned.

Figure 86:
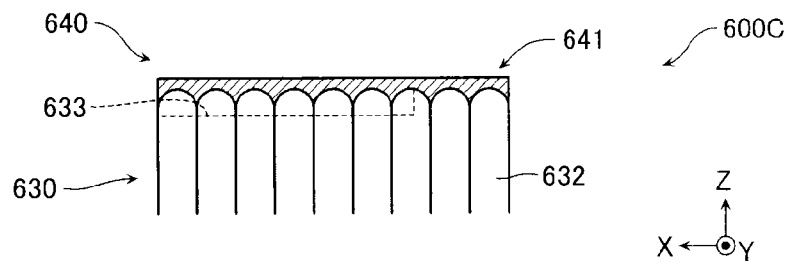
FIG. 86 is a schematic side view showing the configuration of a portion of another substrate holder according to the embodiment.

Next, with reference to FIG. 86 to FIG. 88, another example configuration 600C of the substrate holder 600 will be described. FIG. 86 is a schematic side view showing the configuration of a portion of the substrate holder 600C.

As shown in FIG. 86, the substrate holder 600C has a support mechanism 630 that supports the substrate on a support surface 641 and a holding mechanism 640 that holds the substrate on the support surface 641 by an electrostatic chuck plate (or a vacuum chuck plate). The support mechanism 630 has a plurality of movable support members 632 arranged in the X direction. The movable support members 632 are independently operatable in the direction generally perpendicular to the support surface 641 (Z direction). The holding mechanism 640 has the bendable electrostatic chuck plate and deforms the support surface 641 along the shape of the top surfaces of the movable support members 632. The substrate holder 600C attracts the substrate to the deformed support surface 641, thus bending the substrate in the X direction around a predetermined line extending in the Y direction.

Figure 87:
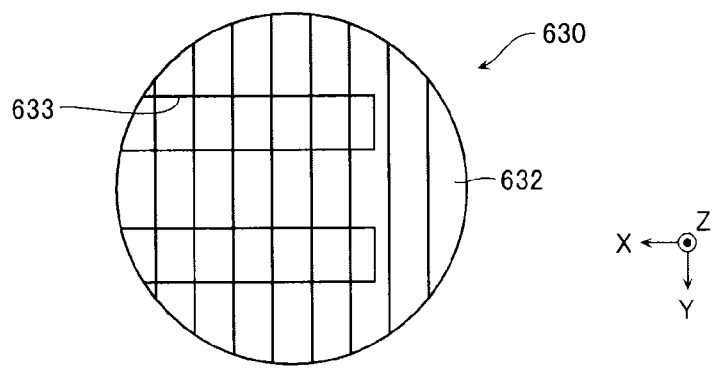
FIG. 87 is a schematic plan view showing the configuration of a portion of the substrate holder.

FIG. 87 is a schematic plan view showing the configuration of the support mechanism 630. The top surface of the support mechanism 630 has the top surfaces of the movable support members 632. In addition, on the top surface of the support mechanism 630, a groove 633 is formed, through which a portion of the robot arm passes.

Here, in the example shown in FIG. 86, the surface on which the substrate is put (support surface 641) is plane. However, as shown in FIG. 88, for example, the top surfaces of the movable support members 632 may be formed in a curved surface, and a plurality of electrostatic chuck plates may be provided that are formed in a curved surface along the respective curved top surfaces, and the whole structure may be used as the holding mechanism 640. In this case, the electrostatic chuck plates may not be bendable.

Figure 88:
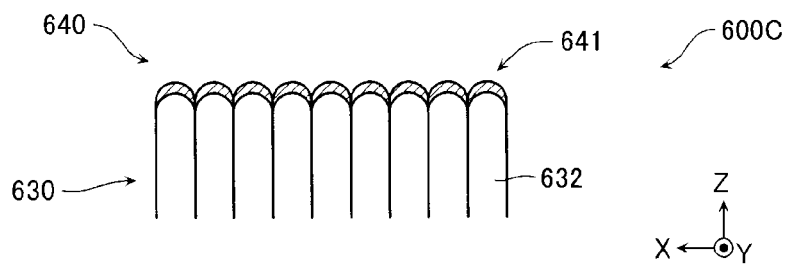
FIG. 88 is a schematic side view showing the configuration of a portion of the substrate holder.

Note that although FIG. 86 to FIG. 88 show that the support mechanism 630 has nine movable support members 632, they are for illustration purpose and may be modified as appropriate. Here, in order to bend the substrate with a uniform curvature radius in the plane, the substrate holder 600C preferably has four or more sets of the movable support members 632.

Next, with reference to FIG. 89 to FIG. 93, usage modes of the substrate holder 600C will be described. FIG. 89 to FIG. 93 are schematic side views for illustrating the usage modes of the substrate holder 600C.

Figure 89:
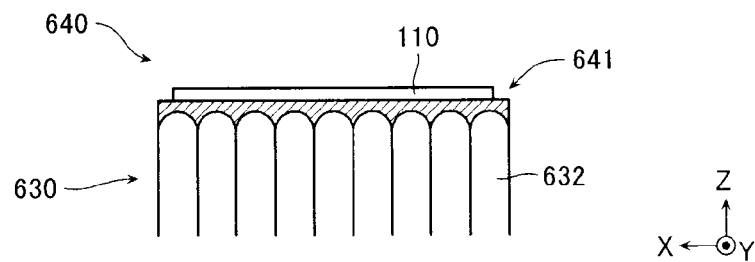
FIG. 89 is a schematic side view for illustrating the operation of the substrate holder.

First, as shown in FIG. 89, the substrate 110 is installed on the support surface 641. In so doing, the positions (height positions) of the movable support members 632 in the Z direction are aligned. Next, the holding mechanism 640 chucks the substrate 110. If the substrate 110 is subjected to the deposition process without it bended, the deposition process is performed in the state shown in FIG. 89.

Figure 90:
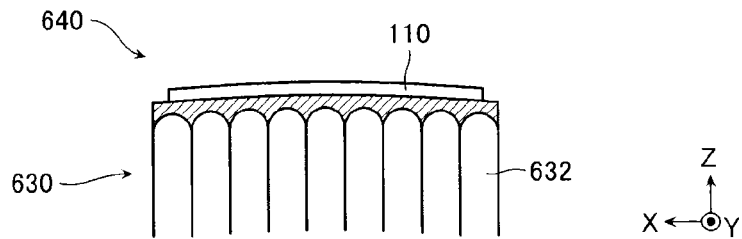
FIG. 90 is a schematic side view for illustrating the operation of the substrate holder.
Figure 91:
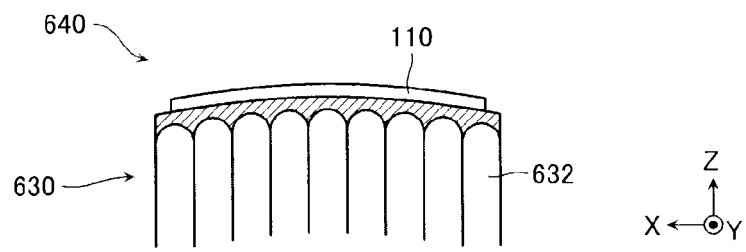
FIG. 91 is a schematic side view for illustrating the operation of the substrate holder.

If the substrate 110 is subjected to the deposition process with it convexly bended, the positions of the movable support members 632 are individually adjusted to a convexly curved surface, as shown in FIG. 90. Thus, the support surface 641 is convexly deformed along the movable support members 632, the points near the central portion of the substrate 110 are pressed in the Z direction, and the points away from the central portion are attracted in the −Z direction by the electrostatic chuck plate, thus bending the substrate 110 convexly. Note that as shown in FIG. 90 and FIG. 91, the curvature radius at which the substrate 110 is bended or the like may be suitably adjusted by adjusting the positions of the movable support members 632.

Figure 92:
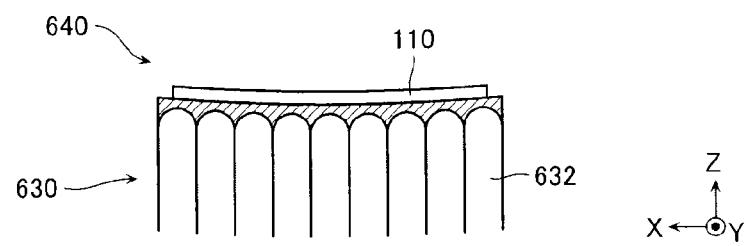
FIG. 92 is a schematic side view for illustrating the operation of the substrate holder.
Figure 93:
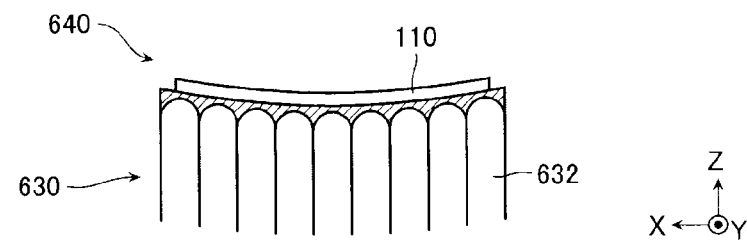
FIG. 93 is a schematic side view for illustrating the operation of the substrate holder.

If the substrate 110 is subjected to the deposition process with it concavely bended, the positions of the movable support members 632 are individually adjusted to a concave curved surface, as shown in FIG. 92. Thus, the support surface 641 is concavely deformed along the movable support members 632, the points near the central portion of the substrate 110 are attracted in the −Z direction by the electrostatic chuck plate, and the points away from the central portion are pressed in the Z direction, thus bending the substrate 110 concavely. Note that as shown in FIG. 92 and FIG. 93, the curvature radius at which the substrate 110 is bended or the like may be suitably adjusted by adjusting the positions of the movable support members 632.

Figure 94:
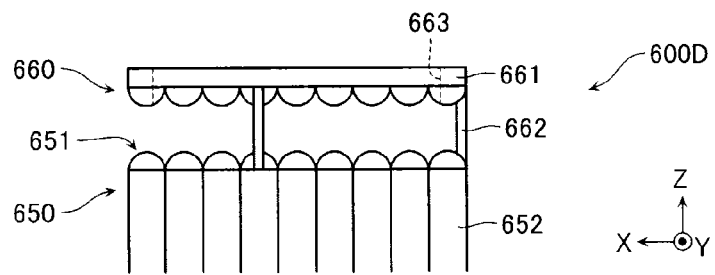
FIG. 94 is a schematic side view showing the configuration of a portion of another substrate holder according to the embodiment.

Next, with reference to FIG. 94 to FIG. 97, another example configuration 600D of the substrate holder 600 will be described. FIG. 94 is a schematic side view showing the configuration of a portion of the substrate holder 600D. The substrate holder 600D bends the substrate isotropically (spherically).

As shown in FIG. 94, the substrate holder 600D has a support mechanism 650 that supports the substrate on a support surface 651 and a holding mechanism 660 that holds the substrate on the support surface 651, the support mechanism 650 and the holding mechanism 660 together sandwiching the substrate. In addition, the holding mechanism 660 has a deposition window 663 formed therein. Via the deposition window 663, the support surface 651 on which the substrate is disposed is exposed to the deposition portion 410.

The support mechanism 650 has a plurality of movable support members 652. The movable support members 652 are independently operatable in the direction generally perpendicular to the support surface 611 (Z direction). The holding mechanism 660 is supported on the movable support members 652 by support pins 662. The holding mechanism 660 has a movable holding member 661 independently operatable in the direction generally perpendicular to the support surface 651 (Z direction). The substrate holder 600D adjusts the Z direction positions of the movable support members 652 and the movable holding member 661 to bend the sandwiched substrate in the Z direction around predetermined points.

The support pins 662 are connected, via respective support pin insertion through-holes 654 described below (FIG. 95), to not-shown respective elevating mechanisms. The support pins 662 may thus be moved up and down independently of the movable support members 652.

Figure 95:
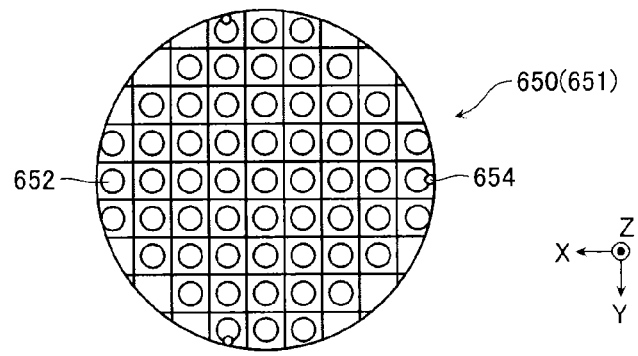
FIG. 95 is a schematic plan view showing the configuration of a portion of the substrate holder.
Figure 96:
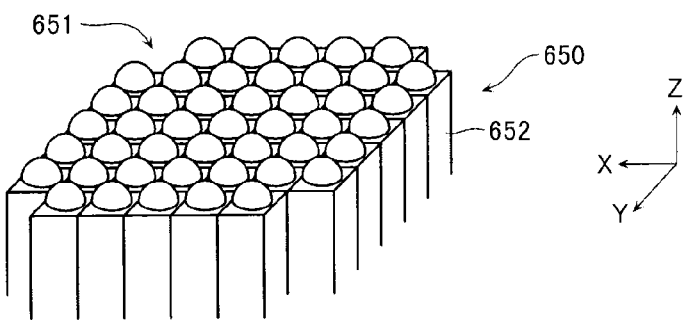
FIG. 96 is a schematic perspective view showing the configuration of a portion of the substrate holder.

FIG. 95 is a schematic plan view showing the configuration of the support mechanism 650. FIG. 96 is a schematic perspective view showing the configuration of a portion of the support mechanism 650. As shown in FIG. 95, the support surface 651 of the support mechanism 650 has the top surfaces of the movable support members 652 arranged in a diced pattern in the X and Y directions. In addition, as shown in FIG. 96, the top surfaces of the movable support members 652 are formed in a curved surface. Note, however, that the top surfaces of the movable support members 652 may be formed in an angular shape. Further, some of the movable support members 652 disposed at the edge of the support surface 651 have a support pin insertion through-hole 654.

Figure 97:
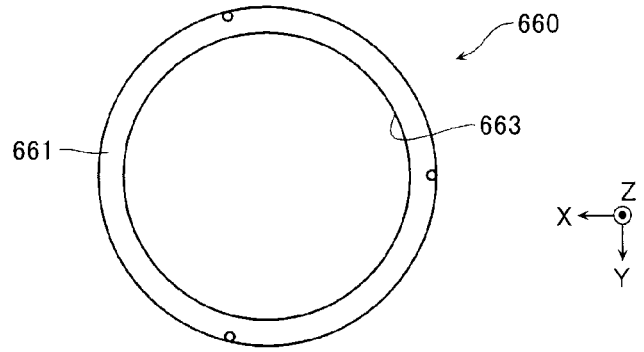
FIG. 97 is a schematic plan view showing the configuration of a portion of the substrate holder.

FIG. 97 is a schematic plan view showing the configuration of the holding mechanism 660. The holding mechanism 660 has an annularly-formed movable holding member

661. The movable holding member 661 is opposite to the support surface 651 of the support portion 650 via its bottom surface. The movable holding member 661 and the support surface 651 together sandwich the substrate 110. In addition, the movable holding member 661 has a central portion in which the deposition window 663 is formed. The substrate is exposed to the deposition portion 410 via the deposition window 663. Therefore, the deposition is performed on a portion of the top surface of the substrate 110 that is exposed from the deposition window 663. In addition, the deposition window 663 is formed such that the movable holding member 661 may cover at least a portion of the substrate 110 to sandwich the substrate 110.

Note that the number of movable support members 652 shown in FIG. 94 to FIG. 97 is for illustration purposes only, and it may be changed as appropriate.

Figure 98:
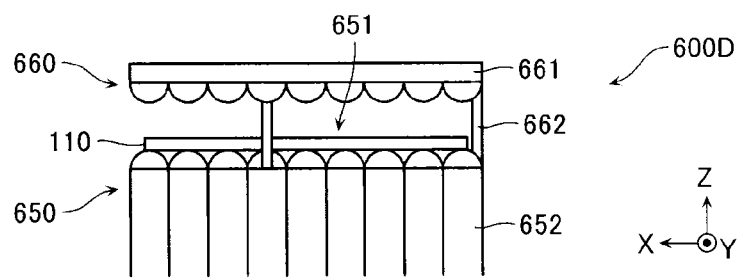
FIG. 98 is a schematic side view for illustrating the operation of the substrate holder.
Figure 99:
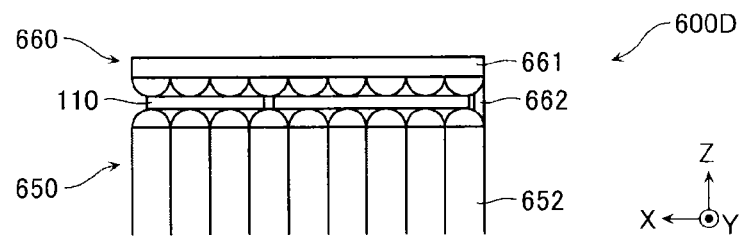
FIG. 99 is a schematic side view for illustrating the operation of the substrate holder.
Figure 100:
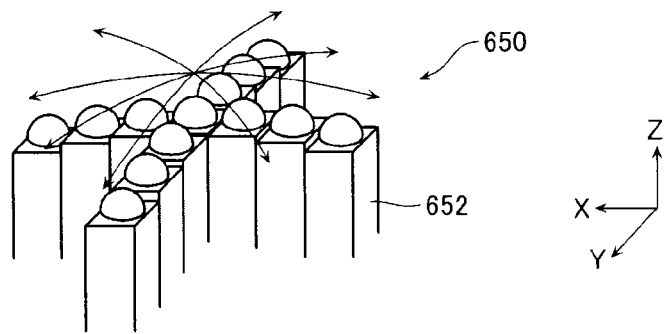
FIG. 100 is a schematic perspective view for illustrating the operation of the substrate holder.

Next, with reference to FIG. 98 to FIG. 100, usage modes of the substrate holder 600D will be described. FIG. 98 and FIG. 99 are schematic side views for illustrating the usage modes of the substrate holder 600D. FIG. 100 is a schematic perspective view for illustrating the usage modes of the substrate holder 600D.

First, as shown in FIG. 98, the substrate 110 is installed on the support surface 651 of the support mechanism 650. In so doing, all positions (the height positions) of the movable support members 652 in the Z direction are aligned, and in addition, the support mechanism 650 and the holding mechanism 660 are spaced apart to allow the substrate 110 and a not-shown robot arm to sufficiently pass therethrough.

Next, as shown in FIG. 99, a not-shown elevating mechanism moves down the support pins 662 and the movable holding member 661, and thus the support mechanism 650 and the holding mechanism 660 sandwich the substrate 110. Note, however, that the support mechanism 650 may be raised, for example, to sandwich the substrate 110. If the substrate 110 is subjected to the deposition process without it bended, the deposition process is performed in the state shown in FIG. 99.

If the substrate 110 is subjected to the deposition process with it convexly bended, the positions of the movable support members 652 are individually adjusted to a convexly curved surface, as shown in FIG. 100. Thus, the points near the central portion of the substrate 110 are pressed in the Z direction by the movable support members 652, and the points away from the central portion are pressed in the −Z direction by the movable holding members 661, thus bending the substrate 110 convexly. Note that the curvature radius at which the substrate 110 is bended or the like may be suitably adjusted by adjusting the positions of the movable support members 652.

Figure 101:
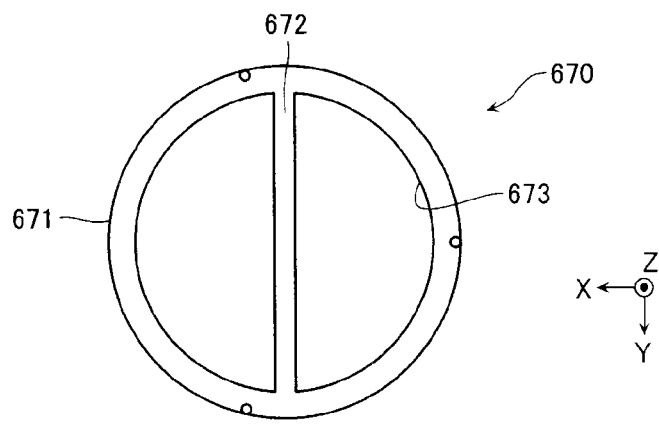
FIG. 101 is a schematic plan view showing a configuration of a portion of another substrate holder according to the embodiment.

Next, with reference to FIG. 101 and FIG. 102, another example configuration of the substrate holder 600 will be described. FIG. 101 is a schematic plan view showing the configuration of a holding mechanism 670 according to the present example. In addition, FIG. 102 is a schematic perspective view showing the configuration of a substrate holder according to the present example configuration.

Figure 102:
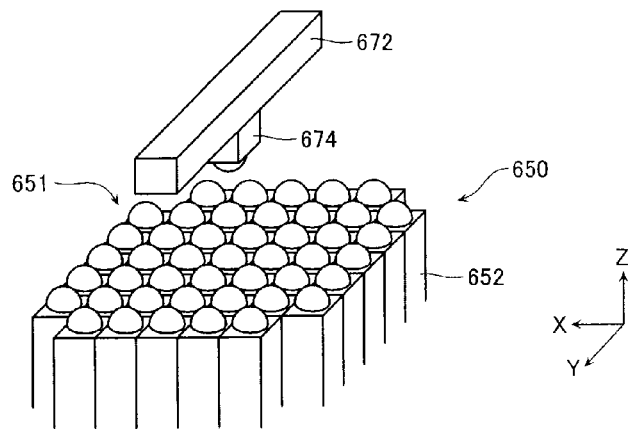
FIG. 102 is a schematic perspective view showing the configuration of a portion of the substrate holder.

As shown in FIG. 101 and FIG. 102, the holding mechanism 670 has a rod-shaped member 672 across the inside of the substrate and a substrate-pressing member 674 projecting in the −Z direction. The holding mechanism 670 is thus configured such that it may press a central portion of the substrate in the −Z direction. The holding mechanism 670 may replace, for example, the holding mechanism 660 in the substrate holder 600D described with reference to FIG. 94 to FIG. 97.

As shown in FIG. 101, the holding mechanism 670 has an annularly formed annular portion 671 and the rod-shaped member 672. The rod-shaped member 672 is integrally formed with the annular portion 671 and passes through the central portion of the annular portion 671. In addition, as shown in FIG. 102, the rod-shaped member 672 has the substrate-pressing member 674 projecting in the −Z direction. As shown in FIG. 102, the holding mechanism 670 is opposite to the support surface 651 of the support portion 650 via the substrate-pressing member 674. Therefore, the substrate 110 may be bended concavely by, for example, moving the positions of the movable support members 652 in the Z direction along a concave curved surface and pressing the central portion of the substrate 110 by the substrate-pressing member 674.

In addition, as shown in FIG. 101, the annular portion 671 has a central portion in which a deposition window 673 is formed, the deposition window 673 being divided by the rod-shaped member 672. The substrate is exposed to the deposition portion 410 via the deposition window 673. Therefore, the deposition is performed on a portion of the top surface of the substrate 110 that is exposed from the deposition window 673. In addition, the deposition window 673 may be formed such that the movable holding member 671 may cover at least a portion of the substrate 110 to sandwich the substrate 110.

Note that although in the example shown in FIG. 102, the holding mechanism 670 has only one rod-shaped member 672, it may have more than one rod-shaped members 672. In addition, the rod-shaped member 672 may have more than one substrate-pressing member 674. In addition, the substrate-pressing member 674 may be configured to be movable in the Z direction with respect to the rod-shaped member 672. Further, although FIG. 102 shows that the bottom surface of the substrate-pressing member 674 is formed in a curved surface, it may be formed in an angular shape.

Figure 103:
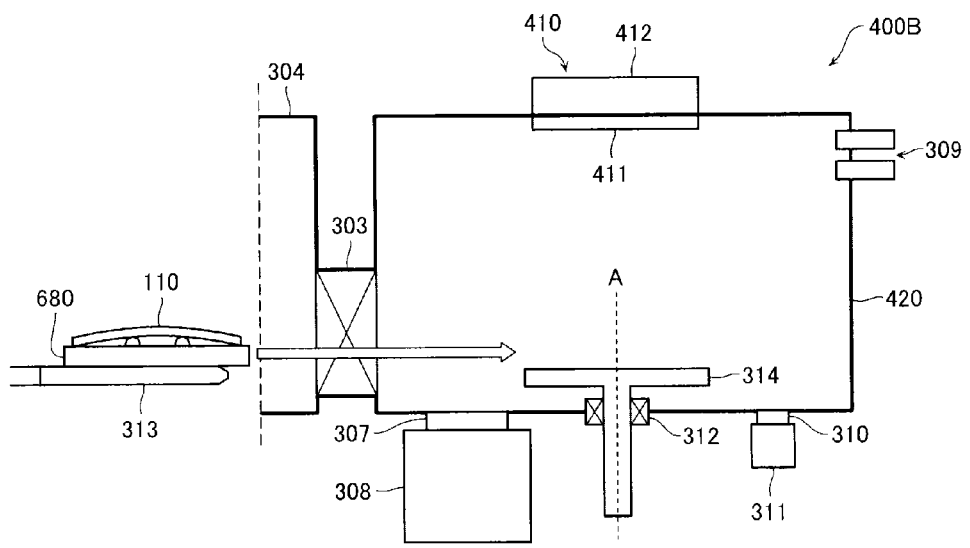
FIG. 103 is a schematic diagram showing a configuration of another deposition system according to the embodiment.
Figure 104:
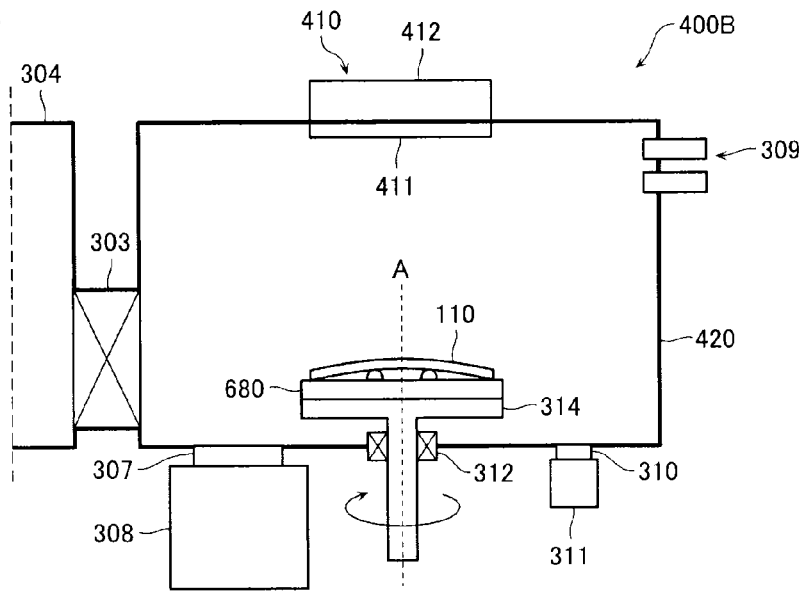
FIG. 104 is a schematic diagram showing the operation of the deposition system.

Next, with reference to FIG. 103 and FIG. 104, another example configuration 400B of the first deposition device 401, the second deposition device 402, or the third deposition device 403 will be described. FIG. 103 is a schematic cross-sectional view showing the deposition device 400B. FIG. 104 is a schematic cross-sectional view for illustrating the operation of the deposition device 400B.

As shown in FIG. 103, the deposition device 400B has a substrate stage 314 configured separately from the substrate holder 680. In performing the deposition, as shown in FIG. 103, the substrate 110 is previously set on the substrate holder 680, the substrate holder 680 is introduced into the deposition chamber 420 by the robot arm 313, and as shown in FIG. 104, the substrate holder 680 is set on the substrate stage 314. In addition, as shown in FIG. 103 and FIG. 104, the deposition device 400B is configured generally similarly, in other respects, to the deposition device 400A described with reference to FIG. 63 and FIG. 64.

Specifically, the substrate stage 680 may stably support the substrate holder 680. In addition, the substrate stage 680 is attached to the deposition chamber 420 rotatably around the rotating axis A in FIG. 103 by the rotational drive mechanism 312. Therefore, a thin film deposited on the substrate 110 may have a good distribution in the substrate plane.

Figure 105:
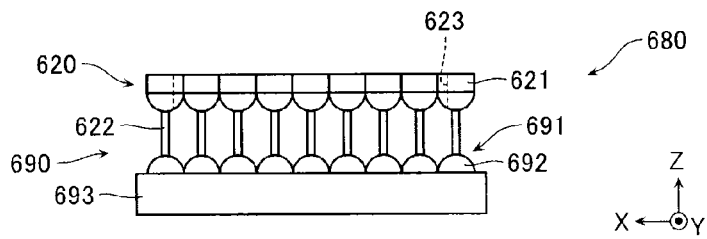
FIG. 105 is a schematic side view showing a configuration of a portion of another substrate holder according to the embodiment.

Next, with reference to FIG. 105 and FIG. 106, an example configuration of the substrate holder 680 will be described. FIG. 105 is a schematic side view showing the configuration of a portion of the substrate holder 680. The substrate holder 680 may be transferred by the robot arm 313. The substrate holder 680 may be attached to and detached from the substrate stage 314. In addition, the substrate holder 680 has a size that may be transferred by the robot arm 313.

As shown in FIG. 105, the substrate holder 680 has a support mechanism 690 that supports the substrate on a support surface 691 and a holding mechanism 620 that holds the substrate on the support surface 691, the support mechanism 690 and the holding mechanism 620 together sandwiching the substrate. In addition, the holding mechanism 620 has a deposition window 623 formed therein. Via the deposition window 623, the support surface 691 on which the substrate is disposed is exposed to the deposition portion 410.

The support mechanism 690 has a plurality of movable support members 692 arranged in the X direction. The movable support members 692 are independently operable in the direction generally perpendicular to the support surface 691 (Z direction). In addition, the movable support members 692 are contained in a housing 693. The holding mechanism 620 is configured generally similarly to the holding mechanism 620 of the substrate holder 600 described with reference to FIG. 65 to FIG. 69.

Figure 106:
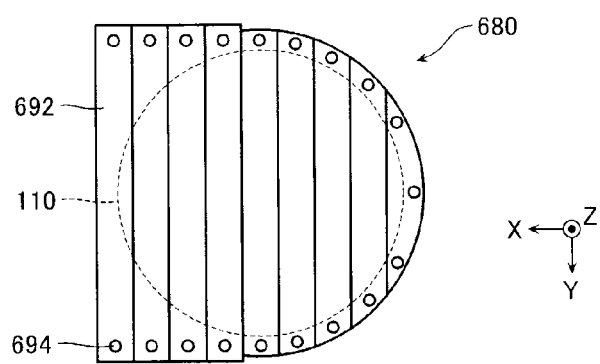
FIG. 106 is a schematic plan view showing the configuration of a portion of the substrate holder.

FIG. 106 is a schematic plan view showing the configuration of the support mechanism 690. The support surface 691 of the support mechanism 690 has the top surfaces of the movable support members 692. In addition, the substrate 110 is disposed in the dotted line portion in FIG. 106. The movable support members 692 extend in the Y direction. Each movable support member 692 has end portions in the Y direction that have respective support pin insertion through-holes 694 formed therein. The support pin insertion through-holes 694 are for inserting the respective support pins 622 therethrough. The support pin insertion through-holes 694 are formed avoiding the portion where the substrate 110 is disposed.

Note that although, in the example shown in FIG. 105 and FIG. 106, the substrate holder 680 has a similar configuration to the substrate holder 600A described with reference to FIG. 65 to FIG. 69, the substrate holder 680 may be configured similarly, for example, to the substrate holder 600B described with reference to FIG. 83 to FIG. 85, or the substrate holder 600C described with reference to FIG. 86 to FIG. 88, or the substrate holder 600D described with reference to FIG. 94 to FIG. 97 or FIG. 101 or FIG. 102.

The substrate holder 680 may bend the substrate in the atmosphere or perform the chucking or the like. In this case, a vacuum consistent process is performed with the substrate curvature and the substrate surface strain fixed. In addition, in a device different from the deposition device 400B, the substrate may be bended or the chucking or the like may be performed. In this case, even in the vacuum consistent process, the substrate curvature and the substrate surface strain may be freely adjusted for each process.

Next, with reference to FIG. 107 to FIG. 112, usage modes of the substrate holder 680 will be described. FIG. 107 to FIG. 112 are schematic side views for illustrating the usage modes of the substrate holder 680.

Figure 107:
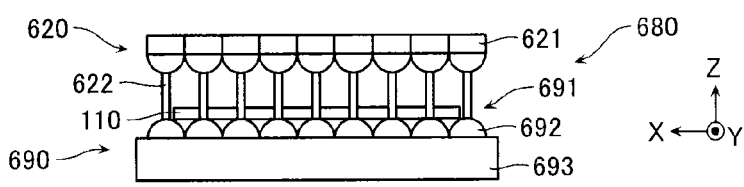
FIG. 107 is a schematic side view for illustrating the operation of the substrate holder.

First, as shown in FIG. 107, the substrate 110 is inserted into the substrate holder 680. In so doing, all positions (the height positions) of the movable support members 692 in the Z direction are aligned, and likewise all positions (the height positions) of the movable holding members 621 in the Z direction are aligned, and in addition, the support mechanism 690 and the holding mechanism 620 are spaced apart sufficiently.

Figure 108:
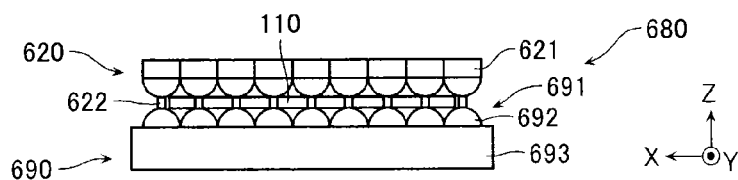
FIG. 108 is a schematic side view for illustrating the operation of the substrate holder.

Next, as shown in FIG. 108, the support pin 622 and the movable holding members 621 are moved down and thus the support mechanism 690 and the holding mechanism 620 sandwich the substrate 110. Specifically, the substrate 110 is sandwiched by the movable support members 692 and the movable holding members 621 at a plurality of points. Note, however, that the support mechanism 690 may be raised, for example, to sandwich the substrate 110. If the substrate 110 is subjected to the deposition process without it bended, the substrate holder 680 is introduced into the deposition device 400B in the state shown in FIG. 108.

Figure 109:
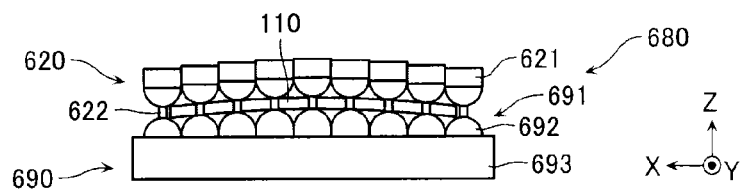
FIG. 109 is a schematic side view for illustrating the operation of the substrate holder.

If the substrate 110 is subjected to the deposition process with it convexly bended, the positions of the movable support members 692 and the movable holding members 621 are individually adjusted to a convexly curved surface, as shown in FIG. 109. Thus, among the points of the substrate 110 sandwiched by the movable support members 692 and the movable holding members 621, the points near the central portion of the substrate 110 are pressed in the Z direction by the movable support members 692 and the points away from the central portion are pressed in the −Z direction by the movable holding members 621, thus bending the substrate 110 convexly.

Figure 110:
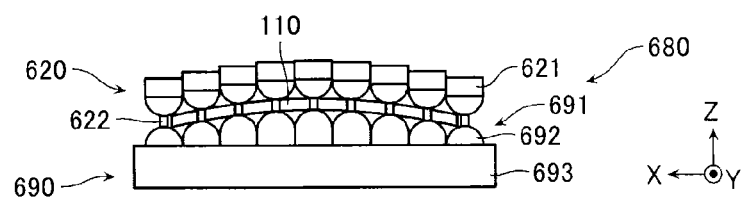
FIG. 110 is a schematic side view for illustrating the operation of the substrate holder.

Note that as shown in FIG. 109 and FIG. 110, the curvature radius at which the substrate 110 is bended or the like may be suitably adjusted by adjusting the positions of the movable support members 692 and the movable holding members 621.

Figure 111:
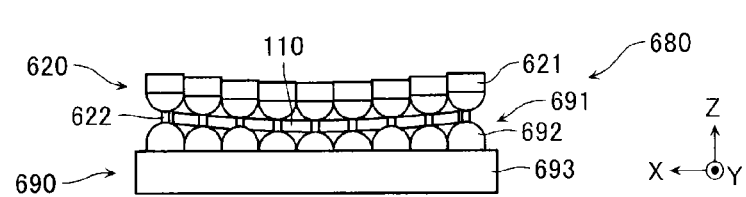
FIG. 111 is a schematic side view for illustrating the operation of the substrate holder.

If the substrate 110 is subjected to the deposition process with it concavely bended, the positions of the movable support members 692 and the movable holding members 621 are individually adjusted to a concave curved surface, as shown in FIG. 111. Thus, among the points of the substrate 110 sandwiched by the movable support members 692 and the movable holding members 621, the points near the central portion of the substrate 110 are pressed in the −Z direction by the movable holding members 621 and the points away from the central portion are pressed in the Z direction by the movable support members 692, thus bending the substrate 110 concavely.

Figure 112:
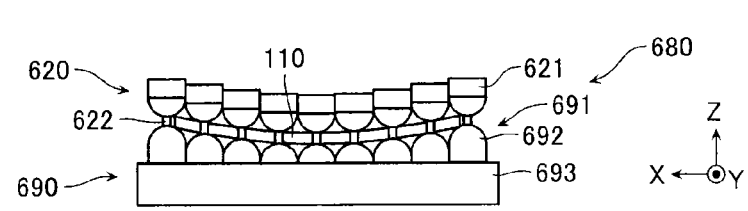
FIG. 112 is a schematic side view for illustrating the operation of the substrate holder.

Note that as shown in FIG. 111 and FIG. 112, the curvature radius at which the substrate 110 is bended or the like may be suitably adjusted by adjusting the positions of the movable support members 692 and the movable holding members 621.

Figure 113:
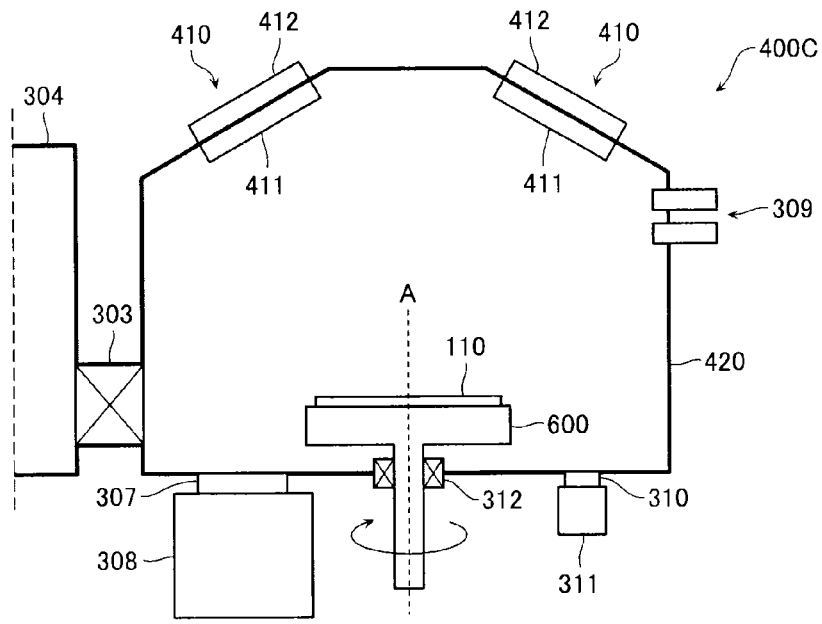
FIG. 113 is a schematic side view showing a configuration of another deposition system according to the embodiment.
Figure 114:
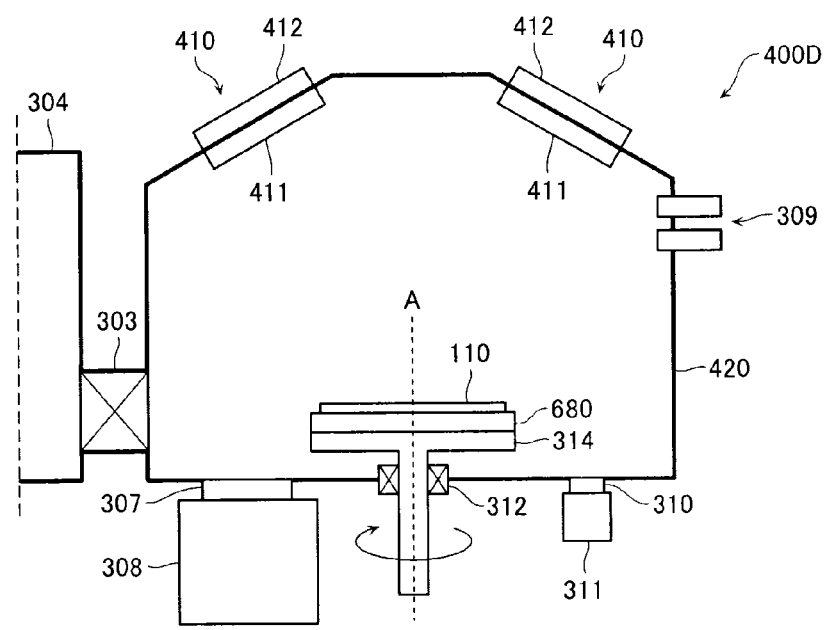
FIG. 114 is a schematic side view showing a configuration of another deposition system according to the embodiment.

Next, with reference to FIG. 113 and FIG. 114, other example configurations 400C and 400D of the first deposition device 401, the second deposition device 402, or the third deposition device 403 will be described. FIG. 113 is a schematic cross-sectional view showing the deposition device 400C. FIG. 114 is a schematic cross-sectional view showing the deposition device 400D.

As shown in FIG. 113, the deposition device 400C has a plurality of the deposition portion 410, and in other respects, is configured generally similarly to the deposition device 400A described with reference to FIG. 63. In addition, as shown in FIG. 114, the deposition device 400D has a plurality of the deposition portion 410, and in other respects, is configured generally similarly to the deposition device 400B described with reference to FIG. 103.

9. Ninth Embodiment

Figure 115:
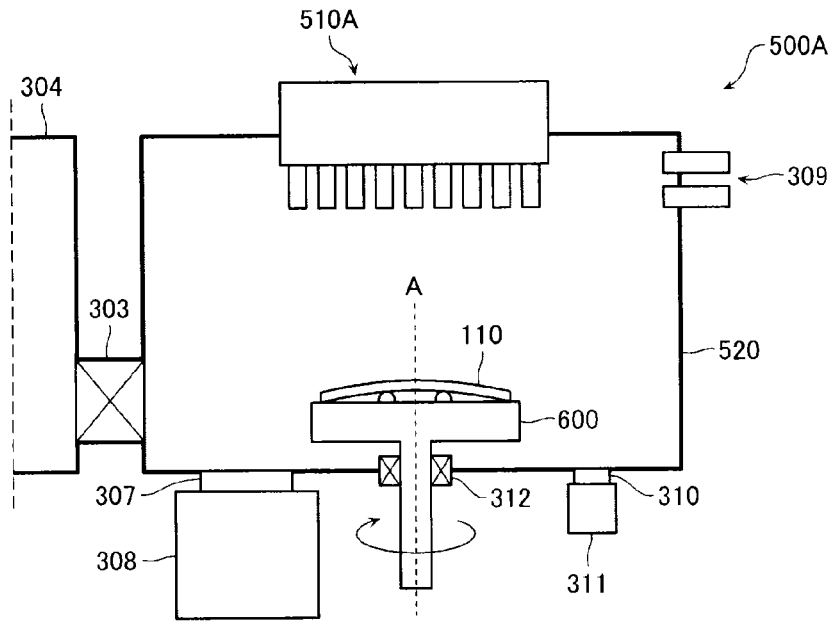
FIG. 115 is a schematic side view showing a configuration of an annealing system according to a ninth embodiment.

Next, with reference to FIG. 115 to FIG. 120, a ninth embodiment will be described. FIG. 115 is a schematic cross-sectional view showing an example configuration 500A of an annealing device according to this embodiment.

A pressure sensor manufacturing system according to this embodiment is configured such that it may anneal the substrate with it bended. Note that the pressure sensor manufacturing system according to this embodiment may have the deposition device illustrated in the eighth embodiment or may have a different annealing device. The pressure sensor manufacturing system according to this embodiment is configured generally similarly, in other respects, to the pressure sensor manufacturing system 300 shown in FIG. 62.

As shown in FIG. 115, the annealing device 500A has the substrate holder 600 described with reference to FIG. 63 or the like, an annealing portion 510A annealing the substrate 110 supported on the substrate holder 600, and an annealing chamber 520 containing the substrate holder 600 and the annealing portion 510A.

The annealing device 500A may anneal the substrate 110 with it bended as shown in FIG. 115, or anneal the substrate 110 without it bended. In addition, although in the example shown in FIG. 115, the substrate 110 is bended convexly, it may also be bended concavely.

As shown in FIG. 115, the annealing portion 510A is provided at a predetermined position opposite to the substrate holder 600, and provides heat to the surface of the substrate 110. The annealing portion 510A has, for example, a lamp heater or the like. In order to uniformly provide heat to the substrate 110, it is preferable to provide a sufficient number of lamp heaters. Note that the annealing may be performed under vacuum exhaust or the like or under gas atmosphere into which a gas is supplied or the like.

The annealing chamber 520 is a vacuum chamber and is connected to the transfer device 304 via the gate valve 303. In addition, the deposition chamber 520 has the vacuum pump 308 attached thereto via the valve 307, the gas supply opening 309, and the vacuum gauge 311 attached thereto via the valve 310.

Note that the annealing device 500A is configured generally similarly, in other configurations, to the deposition device 400A.

Figure 116:
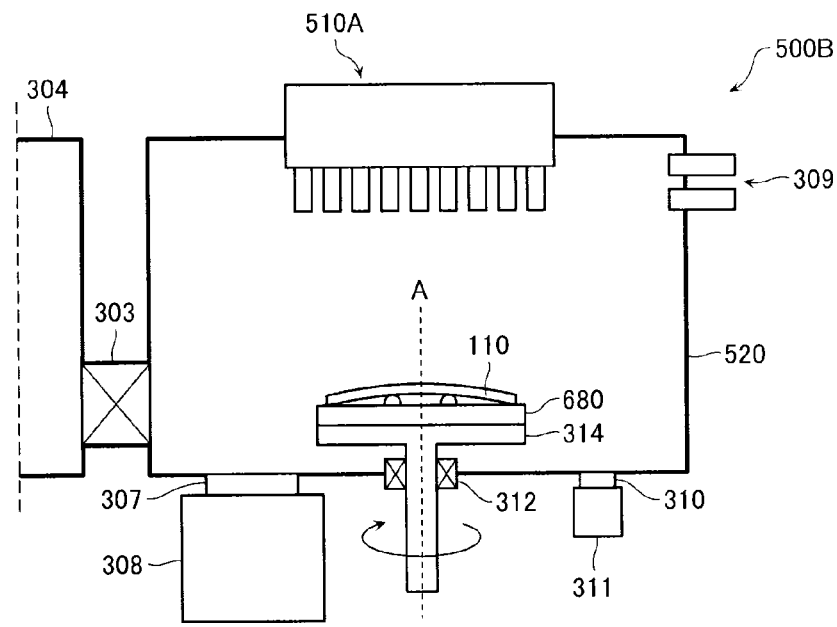
FIG. 116 is a schematic side view showing a configuration of another annealing system according to the embodiment.

Next, with reference to FIG. 116, another example configuration 500B of the annealing device will be described. FIG. 116 is a schematic cross-sectional view showing the configuration of the annealing device 500B. The annealing device 500B is configured generally similarly to the annealing device 500A described with reference to FIG. 115. The annealing device 500B has, instead of the substrate holder 600, the substrate holder 680 and the substrate stage 314 that are described with reference to FIG. 103 to FIG. 106.

Figure 117:
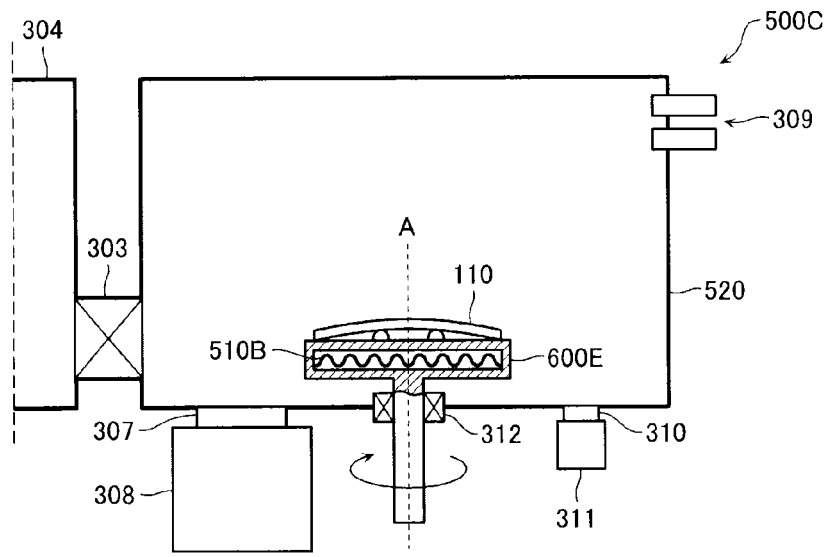
FIG. 117 is a schematic side view showing a configuration of another annealing system according to the embodiment.

Next, with reference to FIG. 117, another example configuration 500C of the annealing device will be described. FIG. 117 is a schematic cross-sectional view showing the configuration of the annealing device 500C. The annealing device 500C has a substrate holder 600E. The substrate holder 600E has an annealing portion 510B built in. In the annealing device 500C, the annealing portion 510B is built in the substrate holder 600E, and thus the annealing portion 510B may be disposed near the substrate 110 to efficiently provide heat to the substrate 110. The annealing portion 510B has, for example, a heater using resistance heating or the like. Note that the annealing device 500C is configured generally similarly, in other respects, to the annealing device 500A described with reference to FIG. 115. In addition, the substrate holder 600E is configured generally similarly, in other respects, to the substrate holder 600 described with reference to FIG. 63.

Next, with reference to FIG. 118, another example configuration 500D of the annealing device will be described.

Figure 118:
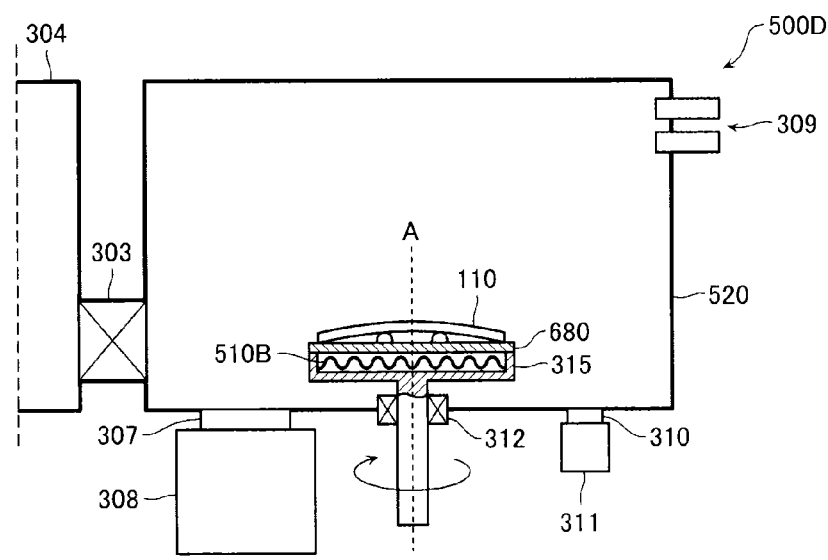
FIG. 118 is a schematic side view showing a configuration of another annealing system according to the embodiment.

FIG. 118 is a schematic cross-sectional view showing the configuration of the annealing device 500D. The annealing device 500D has the substrate holder 680 described with reference to FIG. 103 to FIG. 106 and a substrate stage 315 having the above annealing portion 510B built in. In the annealing device 500D, the annealing portion 510B is built in the substrate stage 315, and thus the annealing portion 510B may be disposed near the substrate 110 to efficiently provide heat to the substrate 110. Note that the annealing device 500D is configured generally similarly, in other respects, to the annealing device 500C described with reference to FIG. 117. In addition, the substrate stage 315 is configured generally similarly, in other respects, to the substrate stage 314 described with reference to FIG. 103 to FIG. 106.

10. Tenth Embodiment

Figure 119:
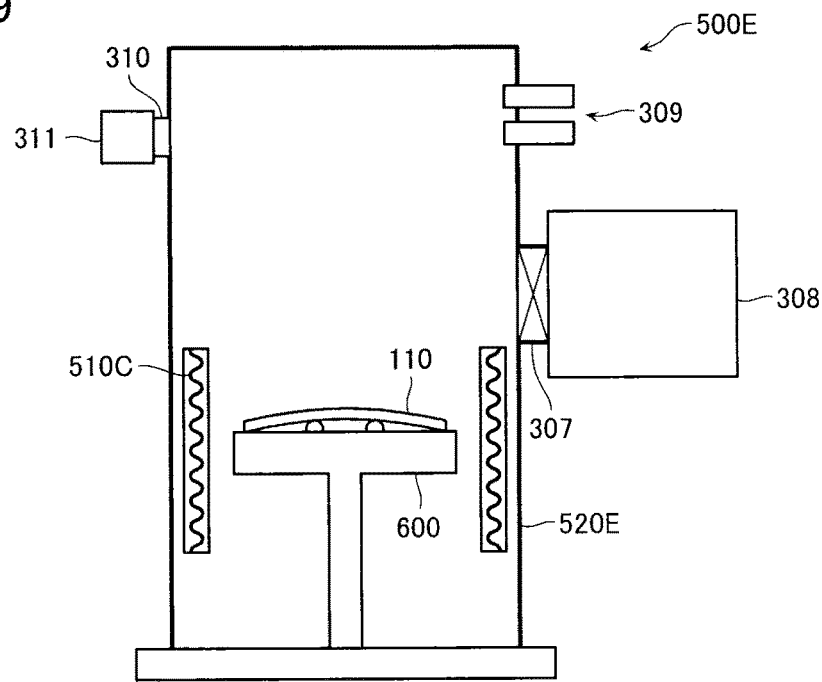
FIG. 119 is a schematic side view showing a configuration of an annealing system according to a tenth embodiment.
Figure 120:
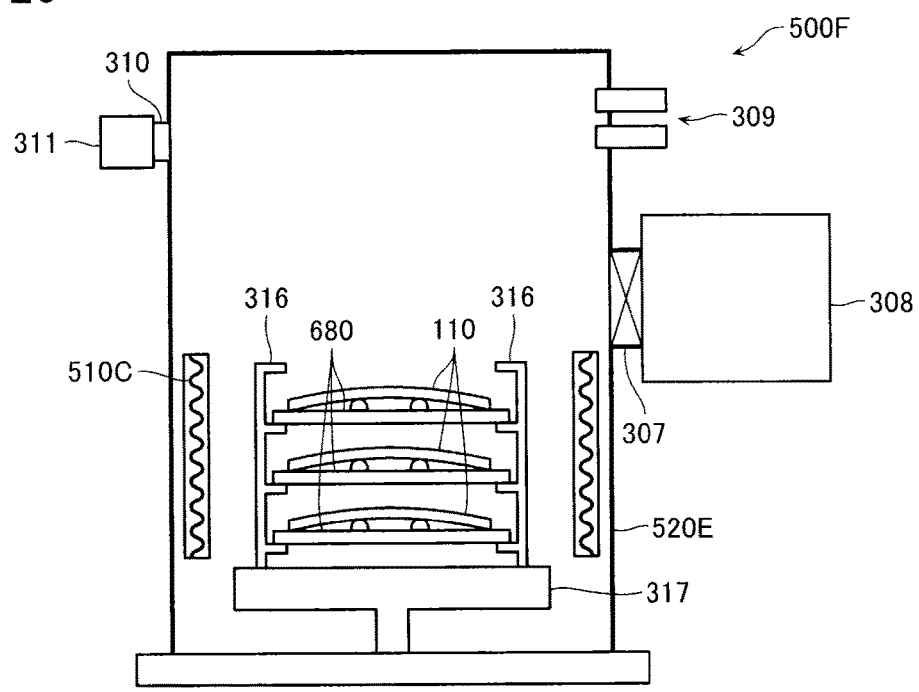

Next, with reference to FIG. 119 and FIG. 120, a tenth embodiment will be described. FIG. 119 is a side view showing a schematic configuration of an annealing device 500E according to this embodiment. The annealing devices 500A, 500B, 500C, and 500D described with reference to FIG. 115 to FIG. 118 are connected, via the gate valve 303 and the transfer device 304, to other devices. Meanwhile, as shown in FIG. 119, the annealing device 500E according to this embodiment is not connected to those devices or the like, but is independently provided.

The annealing device 500E has the substrate holder 600 described with reference to FIG. 63 or the like, an annealing portion 510C annealing the substrate 110 supported on the substrate holder 600 and an annealing chamber 520E containing the substrate holder 600 and the annealing portion 510A.

The annealing device 500E may anneal the substrate 110 with it bended, or anneal the substrate 110 without it bended, as shown in FIG. 119. In addition, although in the example shown in FIG. 119, the substrate 110 is bended convexly, it may also be bended concavely.

As shown in FIG. 119, the annealing portion 510C is provided at a predetermined position near the substrate holder 600 and provides heat to the substrate 110. The annealing portion 510C may have, for example, a heater using resistance heating or the like or a lamp heater or the like. Note that if the lamp heater is used, in order to uniformly provide heat to the substrate 110, it is preferable to provide a sufficient number of lamp heaters. Note that the annealing may be performed under vacuum exhaust or the like or under a gas atmosphere into which a gas is supplied or the like.

The deposition chamber 520E is a vacuum chamber and has the vacuum pump 308 attached thereto via the valve 307, the gas supply opening 309, and the vacuum gauge 311 attached thereto via the valve 310.

The gas supply opening 309 is connected to a gas supply system (cylinder) for supplying gas such as $N_2$ and to a stop valve for shutting off/starting the gas supply. The gas supply opening 309 supplies gas into the deposition chamber 520E. The gas is used, for example, for cooling after the annealing or for annealing in a gas atmosphere or the like.

Note that the annealing device 500E is configured generally similarly, in other configurations, to the annealing device 500A described with reference to FIG. 115.

Next, with reference to FIG. 120, another example configuration 500F of the annealing device according to this embodiment will be described. FIG. 120 is a side view showing a schematic configuration of the annealing device 500F. As shown in FIG. 120, the annealing device 500F may bend a plurality of substrate 110 and anneal them at the same time.

Specifically, the annealing device 500F has a rack 316 supporting the plurality of substrate holders 680 described with reference to FIG. 103 to FIG. 106 and a substrate stage 317 supporting the rack. Note that the annealing device 500F is configured generally similarly, in other respects, to the annealing device 500E described with reference to FIG. 119.

11. Eleventh Embodiment

Figure 121:
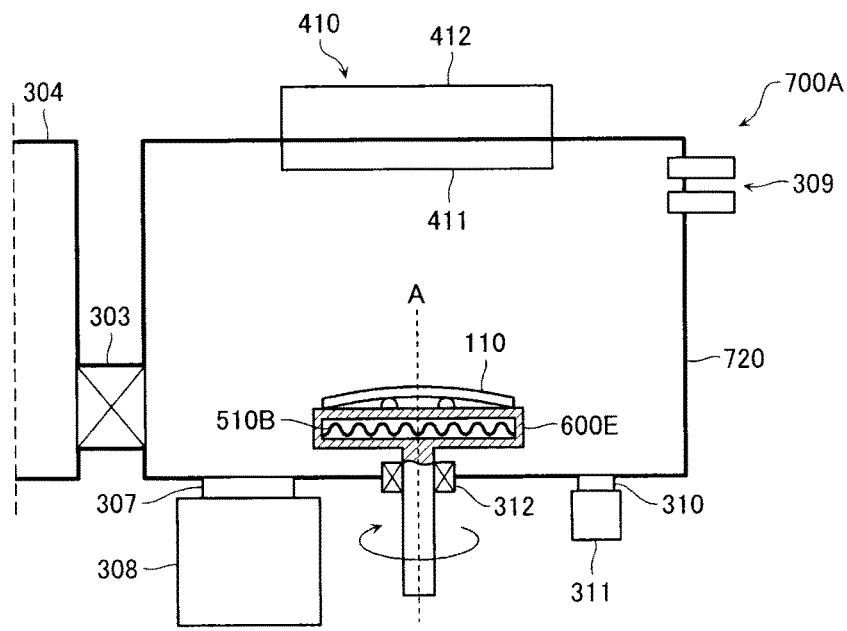

Next, with reference to FIG. 121 and FIG. 122, an eleventh embodiment will be described. FIG. 121 is a side view showing a schematic configuration of an annealing deposition device 700A according to this embodiment.

The annealing deposition device 700A may perform the deposition and annealing with the substrate 110 bended. The annealing deposition device 700A may be used, for example, in the manufacture system 300 of the pressure sensor as shown in FIG. 62, instead of the deposition device (for example, the first deposition device 401) and the annealing device 500, or be used in combination therewith.

Specifically, as shown in FIG. 121, the annealing deposition device 700A has the substrate holder 600E that has the annealing portion 510B built in and is configured to be able to support and bend the substrate 110, the deposition portion 410 that performs deposition to the substrate 110 supported on the substrate holder 600E, and a deposition chamber 720 that contains the substrate holder 600 and the deposition portion 410. Note that the deposition portion 410 has already been described with reference to FIG. 63. The annealing portion 510B and the substrate holder 600E have already been described with reference to FIG. 117.

Next, with reference to FIG. 122, another example configuration 700B of the annealing deposition device will be described. FIG. 122 is a side view showing a schematic configuration of the annealing deposition device 700B according to this embodiment.

The annealing deposition device 700B may perform the deposition and annealing with the substrate 110 bended. In addition, the annealing deposition device 700B has the detachable substrate stage 680.

Figure 122:
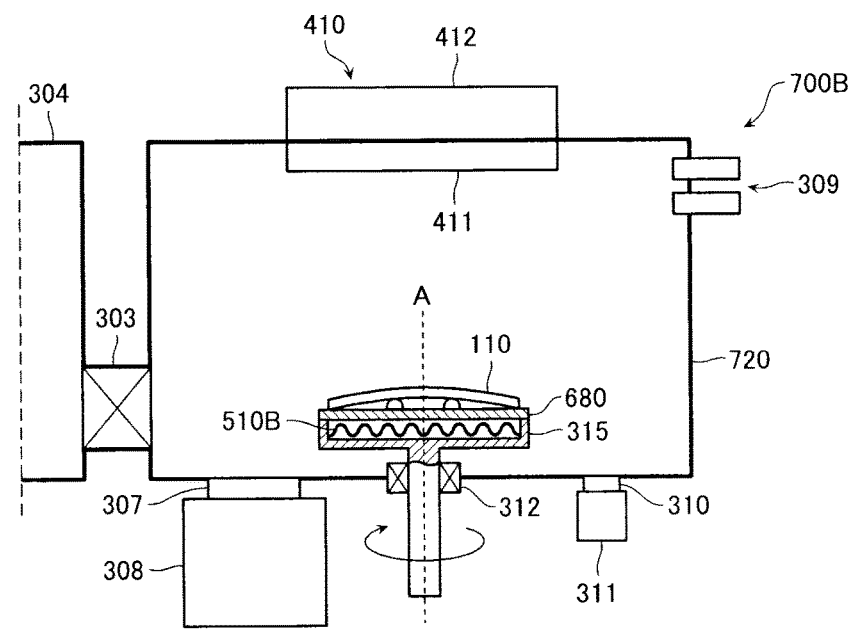

Specifically, as shown in FIG. 122, the annealing deposition device 700B has the substrate holder 680 configured to be able to support and bend the substrate 110, the substrate stage 315 that has the annealing portion 510B built in and supports the substrate holder 680, the deposition portion 410 that performs deposition to the substrate 110 supported on the substrate holder 680, and the deposition chamber 720 that contains the substrate holder 680 and the deposition portion 410. Note that the substrate holder 680 has already been described with reference to FIG. 103 to FIG. 106. The substrate stage 315 has already been described with reference to FIG. 118. In other respects, the annealing deposition device 700B is configured generally similarly to the annealing deposition device 700A.

Note that although in the examples shown in FIG. 122 and FIG. 121, the annealing portion 510B has a heater such as resistance heating, the annealing portion 510B may also have, for example, a lamp heater. In this case, it is preferable to provide the lamp heater at a position that does not inhibit the flight of the sputtered particles from the sputtering target 411 to the substrate 110.

12. Other Embodiments

While the invention has been described with reference to particular embodiments thereof, the following modes are also applicable.

[Mode 1]

A method of manufacturing a pressure sensor comprising:

on a film portion formed on one surface of a substrate, depositing a first magnetic layer, a second magnetic layer, and an intermediate layer between the first and second magnetic layers;

removing the first magnetic layer, the second magnetic layer, and the intermediate layer leaving a part thereof; and removing a part of the substrate from another surface of the substrate, the deposition of the first magnetic layer being performed with the substrate bended.

[Mode 2]

A method of manufacturing a pressure sensor comprising:

on a film portion formed on one surface of a substrate, depositing a first magnetic layer, a second magnetic layer, and an intermediate layer between the first and second magnetic layers;

annealing the first magnetic layer;

removing the first magnetic layer, the second magnetic layer, and the intermediate layer leaving a part thereof; and removing a part of the substrate from another surface of the substrate, the annealing the first magnetic layer being performed with the substrate bended.

[Mode 3]

The method of manufacturing a pressure sensor according to the mode 1 or 2, wherein by removing the first magnetic layer, the second magnetic layer, and the intermediate layer leaving a part thereof, a strain detecting element is formed in a first region, the strain detecting element comprising the first magnetic layer, the second magnetic layer, and the intermediate layer, by removing a part of the substrate from another surface of the substrate, a part of the first region of the substrate is removed from the another surface, and the substrate is bended so that a relative angle of a straight line joining the centroid of the strain detecting element and the outer edge of the first region by the shortest path and the magnetization direction of the first magnetic layer becomes larger than 0° and smaller than 90°.

[About a Method of Manufacturing a Pressure Sensor According to the Modes 1 to 3]

The substrate may be bended to have, in a steady state in which the film portion is applied with no external pressure, a relative angle larger than 0° and smaller than 180° between the magnetization direction of the first magnetic layer and the magnetization direction of the second magnetic layer.

In addition, the substrate may be bended around a predetermined line.

Further, the manufacturing method may comprise:

bending the substrate;

depositing the first magnetic layer on one surface of the substrate on which the film portion is provided or annealing the first magnetic layer; and releasing the bend of the substrate.

[About a Method of Manufacturing a Pressure Sensor According to the Mode 1]

The deposition of the second magnetic layer may be performed with the substrate bended.

[About a Method of Manufacturing a Pressure Sensor According to the Mode 3]

The deposition of the first magnetic layer may be performed with the substrate bended around a predetermined line, and the deposition of the second magnetic layer may be performed with the substrate bended around a line extending in a direction different from the predetermined line.

[Mode 4]

A method of manufacturing a pressure sensor comprising:
forming a film portion on one surface of a substrate;
manufacturing a strain detecting element above the film portion; and
removing a part of the substrate from another surface of the substrate,
the forming the film portion being performed with the substrate bended.

[Mode 5]

A method of manufacturing a pressure sensor comprising:
annealing a film portion formed on a substrate;
manufacturing a strain detecting element above the film portion; and
removing apart of the substrate from another surface of the substrate,
the annealing the film portion being performed with the substrate bended.

[Mode 6]

A method of manufacturing a pressure sensor according to the mode 4 or 5, wherein
the substrate is bended around a predetermined point.

[About the Method of Manufacturing a Pressure Sensor According to the Modes 4 to 6]

The manufacturing method may comprise:
bending the substrate;
depositing the film portion on one surface of the substrate, or annealing the film portion; and
releasing the bend of the substrate.

[Mode 7]

A deposition system comprising:
a substrate holder holding a substrate; and
a deposition portion performing deposition on a substrate held by the substrate holder,
the substrate holder comprising a mechanism to bend the substrate.

[Mode 8]

The deposition system according to mode 7, wherein
the substrate holder comprises:
a support mechanism supporting the substrate on a support surface; and
a holding mechanism holding the substrate on the support surface,
the support mechanism comprises a plurality of movable support members independently operatable in a direction crossing (generally perpendicular to) the support surface,
the movable support members form unevenness on the support surface, and
the holding mechanism bends the substrate according to the unevenness of the support surface.

[Mode 9]

An annealing system comprising:
a substrate holder holding a substrate; and
an annealing portion annealing the substrate supported on the substrate holder,
the substrate holder comprising a mechanism to bend the substrate.

[Mode 10]

The annealing system according to mode 9, wherein
the substrate holder comprises:
a support mechanism supporting the substrate on a support surface; and
a holding mechanism holding the substrate on the support surface,
the support mechanism comprises a plurality of movable support members independently operatable in a direction crossing (generally perpendicular to) the support surface,
the movable support members form unevenness on the support surface, and
the holding mechanism bends the substrate according to the unevenness of the support surface.

[About the Substrate Holder According to the Mode 8 or 10]

The movable support members may be arranged in a predetermined direction parallel to the support surface,
extend in a direction parallel to the support surface and perpendicular to the predetermined direction, and
the support surface may be curved around a predetermined line.

In addition, the movable support members may be arranged in a matrix in a plane parallel to the support surface, and
the support surface may be curved around a predetermined point.

13. Others

In addition, it is apparent that those skilled in the art will readily envision various changes or modifications without departing from the spirit of the invention, and all such changes or modifications are intended to be included within the scope of the present invention.

In addition, some embodiments of the present invention have been described, but these embodiments are shown by way of example and are not intended to limit the scope of the invention. These new embodiments may be implemented in various other forms, and be subjected to various omissions, replacements, and modifications without departing from the spirit of the present invention. These embodiments and variants thereof are within the scope and sprit of the invention, and are also within the scope of the invention as defined in the appended claims and the equivalents thereof.

What is claimed is:

1. A deposition system comprising:
a substrate holder holding a substrate; and
a deposition portion performing deposition on the substrate held by the substrate holder,
the substrate holder comprising a support mechanism and a holding mechanism, the substrate holder holding the substrate between the support mechanism and the holding mechanism,
the support mechanism comprising a first movable support member and a second movable support member which are arranged in a first direction, the first movable support member and the second movable support member extending in a second direction crossing the first direction,
the holding mechanism comprising a first movable holding member and a second movable holding member arranged in the first direction, and
the first movable support member, the second movable support member, the first movable holding member and the second movable holding member being movable in a third direction crossing the first and the second directions.

2. The deposition system according to claim 1, wherein
the first movable support member and the second movable support member have first surfaces facing the substrate, the first surface has a curved surface or a knife edge structure formed in an angular shape.

3. A deposition system comprising:
a substrate holder holding a substrate; and
a deposition portion performing deposition on the substrate held by the substrate holder,
the substrate holder comprising,
a support mechanism supporting the substrate, and
a holding mechanism holding the substrate,
the support mechanism comprising a first movable support member and a second movable support member which are arranged in a first direction, the first movable support member and the second movable support member extending in a second direction crossing the first direction,
the first movable support member and the second movable support member being movable in a third direction crossing the first and the second directions,
the first movable support member and the second movable support member having first surfaces facing the substrate, and
the first surface having a curved surface or a knife edge structure formed in an angular shape.

4. The deposition system according to claim 3, wherein
the substrate holder holding the substrate between the support mechanism and the holding mechanism,
the holding mechanism comprises a first movable holding member and a second movable holding member arranged in the first direction, and
the first movable holding member and the second movable holding member are movable in the third direction.

5. The deposition system according to claim 4, wherein
the first movable holding member and the second movable holding member have second surfaces facing the substrate, the second surface has a curved surface or a knife edge structure formed in an angular shape.

6. The deposition system according to claim 3, wherein
the holding mechanism comprises a first electrostatic chuck plate disposed on the first surface of the first movable support member and a second electrostatic chuck plate disposed on the first surface of the second movable support member.

7. The deposition system according to claim 6, wherein
the first electrostatic chuck plate and the second electrostatic chuck plate have third surfaces facing the substrate, the third surface has a curved surface or a knife edge structure formed in an angular shape.

8. A deposition system comprising:
a substrate holder holding a substrate; and
a deposition portion performing deposition on the substrate held by the substrate holder,
the substrate holder comprising,
a support mechanism supporting the substrate, and
a holding mechanism holding the substrate,
the support mechanism comprising a first movable support member and a second movable support member which are arranged in a first direction,
widths of the first movable support member and the second movable support member in a second direction crossing the first direction being larger than widths of the first movable support member and the second movable support member in the first direction, and
the first movable support member and the second movable support member being movable in a third direction crossing the first and the second directions.

9. The deposition system according to claim 8, wherein
the widths of the first movable support member and the second movable support member in the second direction are larger than a width of the substrate in the second direction, and
the widths of the first movable support member and the second movable support member in the first direction are smaller than a width of the substrate in the first direction.

10. The deposition system according to claim 8, wherein
the substrate holder holding the substrate between the support mechanism and the holding mechanism,
the holding mechanism comprises a first movable holding member and a second movable holding member arranged in the first direction, and
the first movable holding member and the second movable holding member are movable in the third direction.

11. The deposition system according to claim 8, wherein
the first movable support member and the second movable support member have first surfaces facing the substrate, and
the holding mechanism comprises a first electrostatic chuck plate disposed on the first surface of the first movable support member and a second electrostatic chuck plate disposed on the first surface of the second movable support member.

12. The deposition system according to claim 11, wherein
the first electrostatic chuck plate is movable together with the first movable support member, and
the second electrostatic chuck plate is movable together with the second movable support member.

13. The deposition system according to claim 12, wherein
positions of the first surfaces of the first movable support member and the second movable support member in the third direction can be different from each other.

14. The deposition system according to claim 12, wherein
the first movable support member and the second movable support member are moveable independently from each other.

* * * * *